US008373160B2

(12) United States Patent
Yamada et al.

(10) Patent No.: US 8,373,160 B2
(45) Date of Patent: Feb. 12, 2013

(54) ELECTROPHOTOGRAPHIC PHOTORECEPTOR, PROCESS CARTRIDGE IMAGE FORMING APPARATUS, AND CURED FILM

(75) Inventors: Wataru Yamada, Kanagawa (JP); Katsumi Nukada, Kanagawa (JP); Tsuyoshi Miyamoto, Kanagawa (JP); Kenya Sonobe, Kanagawa (JP); Takatsugu Doi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 94 days.

(21) Appl. No.: 12/861,280

(22) Filed: Aug. 23, 2010

(65) Prior Publication Data

US 2011/0215303 A1 Sep. 8, 2011

(30) Foreign Application Priority Data

Mar. 5, 2010 (JP) ................................ 2010-049417

(51) Int. Cl.
*H01L 51/54* (2006.01)

(52) U.S. Cl. ................................ 257/40; 257/E51.027

(58) Field of Classification Search .................... 257/40, 257/E51.027

See application file for complete search history.

(56) References Cited

U.S. PATENT DOCUMENTS

| | | | | |
|---|---|---|---|---|
| 4,599,286 | A * | 7/1986 | Limburg et al. | 430/58.65 |
| 5,695,898 | A | 12/1997 | Go et al. | |
| 6,180,303 | B1 | 1/2001 | Uematsu et al. | |
| 6,262,206 | B1 * | 7/2001 | Nesvadba et al. | 526/220 |
| 2008/0102391 | A1 * | 5/2008 | Yanagawa et al. | 430/69 |
| 2008/0199217 | A1 | 8/2008 | Iwamoto et al. | |

FOREIGN PATENT DOCUMENTS

| | | |
|---|---|---|
| JP | A-2000-019749 | 1/2000 |
| JP | A-2000-066424 | 1/2001 |
| JP | A-2002-040686 | 2/2002 |
| JP | B2-3287678 | 6/2002 |
| JP | A-2004-240079 | 8/2004 |
| JP | A-2005-234546 | 9/2005 |
| JP | A-2005-345782 | 12/2005 |
| JP | A-2006-234943 | 9/2006 |
| JP | A-2008-058779 | 3/2008 |
| JP | A-2008-233893 | 10/2008 |

* cited by examiner

*Primary Examiner* — Marc Armand
(74) *Attorney, Agent, or Firm* — Oliff & Berridge, PLC

(57) ABSTRACT

An electrophotographic photoreceptor includes a conductive substrate and a photosensitive layer provided on the conductive substrate, and an outermost surface layer of the electrophotographic photoreceptor includes a cured film of a composition containing a charge transporting material having a chain polymerizable functional group and at least one selected from a nitroso compound, a nitrone compound or a nitro compound.

15 Claims, 6 Drawing Sheets

(A)

(B)

(C)

ELECTROPHOTOGRAPHIC PHOTORECEPTOR, PROCESS CARTRIDGE IMAGE FORMING APPARATUS, AND CURED FILM

CROSS-REFERENCE TO RELATED APPLICATION

This application is based on and claims priority under 35 USC 119 from Japanese Patent Application No. 2010-049417 filed on Mar. 5, 2010.

BACKGROUND

1. Technical Field

The present invention relates to an electrophotographic photoreceptor, a process cartridge, an image forming apparatus and a cured film.

2. Related Art

In general, an electrophotographic image forming apparatus has the following structure and an image is formed by the following processes. Specifically, a material on which image is formed is obtained by charging the surface of an electrophotographic photoreceptor by a charging unit; selectively discharging the charged surface of the electrophotographic photoreceptor by exposing to light in an image-wise manner to form an electrostatic latent image thereon; developing the latent image by attaching a toner thereto using a developing unit to form a toner image; and transferring the toner image onto an image-receiving medium using a transfer unit.

In recent years, an electrophotographic photoreceptor (organic photoreceptor) using an organic photoconductive material has been prevailed.

SUMMARY

According to an exemplary embodiment of the invention, there is provided an electrophotographic photoreceptor including a conductive substrate and a photosensitive layer provided on the conductive substrate, an outermost surface layer of the electrophotographic photoreceptor including a cured film of a composition containing a charge transporting material having a chain polymerizable functional group and at least one selected from a nitroso compound, a nitrone compound or a nitro compound.

BRIEF DESCRIPTION OF THE DRAWINGS

Exemplary embodiments of the present invention will be described in detail based on the following figures, wherein.

DETAILED DESCRIPTION

Electrophotographic Photoreceptor

Figure 1:
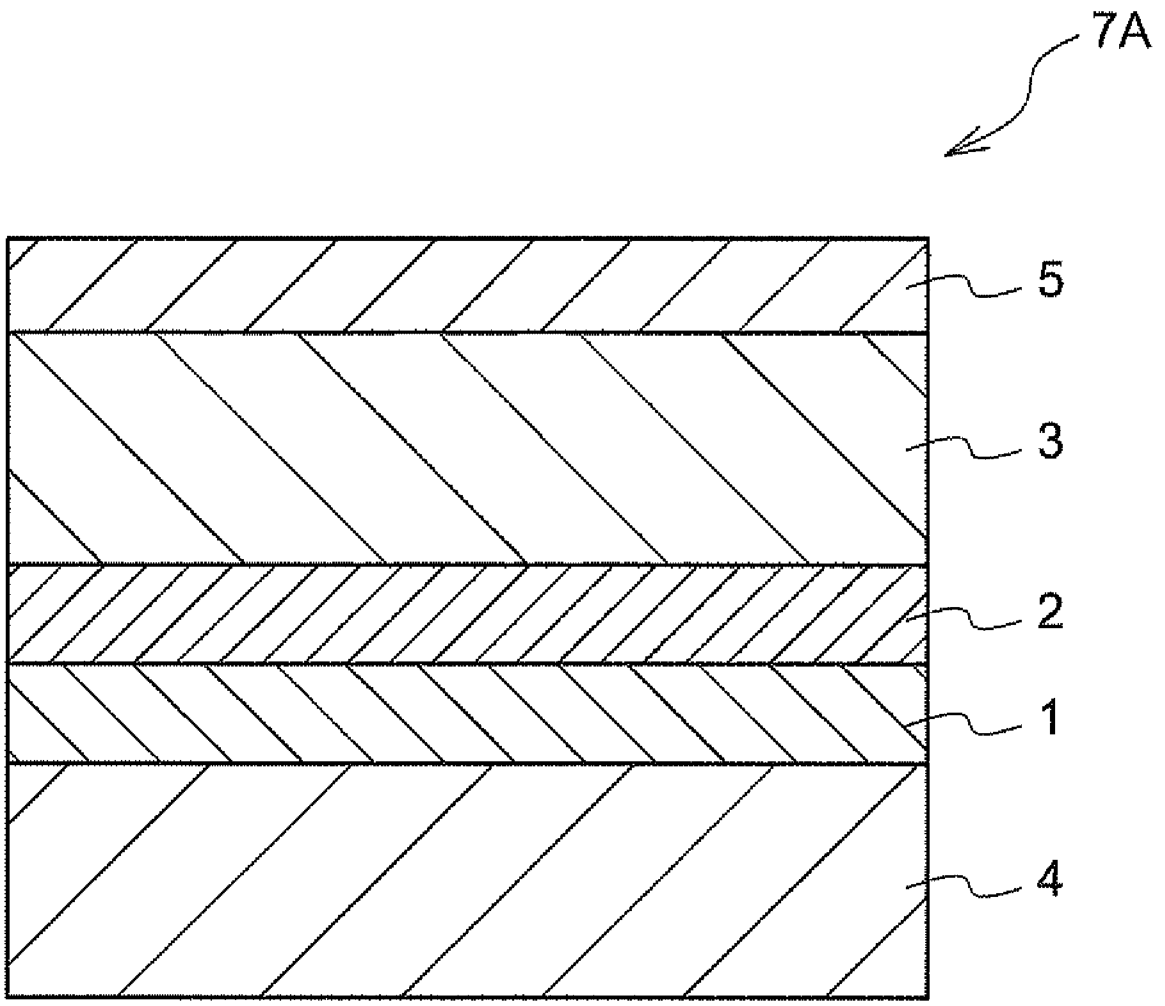
FIG. 1 is a schematic partial cross sectional view showing an electrophotographic photoreceptor according to an exemplary embodiment of the invention.

The electrophotographic photoreceptor according to the exemplary embodiment of the invention includes at least a conductive substrate and a photosensitive layer provided on the conductive substrate. In the electrophotographic photoreceptor according to the exemplary embodiment of the invention, an outermost surface layer includes a cured film of a composition containing a charge transporting material having a chain polymerizable functional group and at least one selected from a nitroso compound, a nitrone compound or a nitro compound.

Although the electrophotographic photoreceptor that has an outermost surface layer including a cured film of a composition containing a charge transporting material having a chain polymerizable functional group has a high mechanical strength, deterioration in electrical characteristics, specifically, the residual image phenomenon (ghosting) caused by residual traces a previous image, may sometimes be caused.

In the electrophotographic photoreceptor according to the exemplary embodiment of the invention, the residual image phenomenon (ghosting) caused by residual traces of a previous image may be suppressed by using a cured film of a composition containing a charge transporting material having a chain polymerizable functional group and at least one selected from a nitroso compound, a nitrone compound or a nitro as the outermost surface layer. Although the reason for this is not clear, it is assumed to be as follows.

In the process of curing the charge transporting material having a chain polymerizable functional group in a film state, it is known that the chain polymerizable functional group is attacked by cations, anions or radicals generated from an initiator, or stimulated (such as by heat, electron rays or light), whereby the chain polymerization is initiated. It is thought that, at the same time, a charge transporting site (charge transporting skeleton) of the charge transporting material is attacked by cations, anions or radicals generated from an initiator or stimulated (such as by heat, electron rays or light) to a not insignificant degree, which results in deterioration of electrical characteristics. The attack may be suppressed if the initial stimulation is applied under mild conditions. However, when mild conditions are employed, the crosslinking density is not increased and sufficient film strength may not be achieved.

On the other hand, when at least one selected from a nitroso compound, a nitrone compound or a nitro compound is included, the chain polymerizable functional group may be selectively attacked by cations, anions or radicals generated from an initiator or stimulated (such as by heat, electron rays or light) during the chain polymerization to initiate chain polymerization. As a result, the attack on the charge transporting site (charge transporting skeleton) of the charge transporting material may be suppressed, whereby a cured film having excellent strength may be formed without impairing charge transportability. In particular, when a radical polymerization initiator is used, more selective chain polymerization may occur due to the living polymerization-like reaction, and the chain polymerizable functional group may be selectively attacked to initiate chain polymerization. As a result, the attack on the charge transporting site (charge transporting skeleton) of the charge transporting material may be suppressed.

For the above reason, the residual image phenomenon (ghosting) caused by residual traces of a previous image may be suppressed in the electrophotographic photoreceptor according to the exemplary embodiment of the invention. As a consequence, the outermost surface layer including a cured film of these compositions has high mechanical strength, and deterioration in electrical characteristics and image characteristics due to repeated use over a long period of time may be suppressed in the electrophotographic photoreceptor according to the exemplary embodiment of the invention.

Furthermore, in the process cartridge and the image forming apparatus including an electrophotographic photoreceptor according to the exemplary embodiment of the invention, an image, in which the residual image phenomenon (ghosting) caused by residual traces of a previous image is suppressed, may be obtained, whereby a stable image may be produced.

The electrophotographic photoreceptor according to the exemplary embodiment of the invention has the outermost surface layer that includes the cured film of the above-described specific compositions. The outermost surface layer is preferably a layer that forms the uppermost surface of the electrophotographic photoreceptor itself. Specifically, it is preferable that the outermost surface layer is provided as a layer that functions as a protective layer or a layer that functions as a charge transporting layer.

When the outermost surface layer is the layer that functions as a protective layer, examples of an embodiment of the electrophotographic photoreceptor include an electrophotographic photoreceptor having a photosensitive layer and a protective layer as an outermost surface layer on a conductive substrate, in which the protective layer includes a cured film of the above-described specific compositions.

When the outermost surface layer is the layer that functions as a charge transporting layer, examples of an embodiment of the electrophotographic photoreceptor include an electrophotographic photoreceptor having a charge generating layer and a charge transporting layer as an outermost surface layer on a conductive substrate, in which the charge transporting layer includes a cured film of the above-described specific compositions.

Hereinbelow, an electrophotographic photoreceptor according to the exemplary embodiment of the invention when an outermost surface layer is a layer that functions as a protective layer is described in detailed with reference to the drawings. In the drawings, same or corresponding portions are provided with same reference marks and duplicating descriptions are omitted.

FIG. 1 is a schematic sectional view showing a preferable exemplary embodiment of an electrophotographic photoreceptor according to an exemplary embodiment of the invention. Each of FIG. 2 and FIG. 3 is a schematic sectional view showing an electrophotographic photoreceptor according to another exemplary embodiment of the invention.

An electrophotographic photoreceptor 7A shown in FIG. 1 is a so-called function separation type photoreceptor (or a layered type photoreceptor) and has a structure in which an undercoat layer 1, a charge generating layer 2, a charge transport layer 3 and a protective layer 5 are sequentially formed on a conductive substrate 4. In the electrophotographic photoreceptor 7A, a photosensitive layer is constituted of the charge generating layer 2 and the charge transport layer 3.

Figure 2:
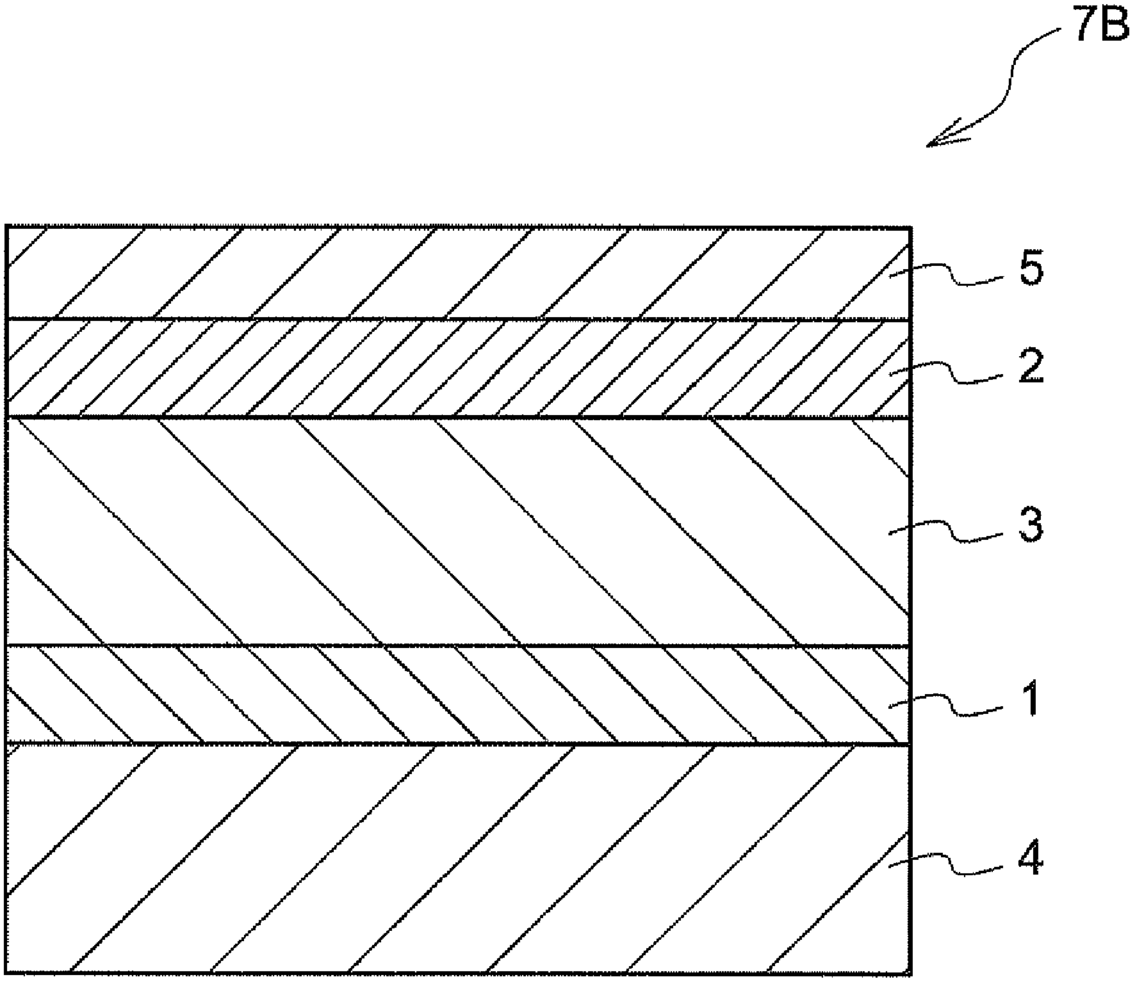
FIG. 2 is a schematic partial cross sectional view showing an electrophotographic photoreceptor according to another exemplary embodiment of the invention.
Figure 3:
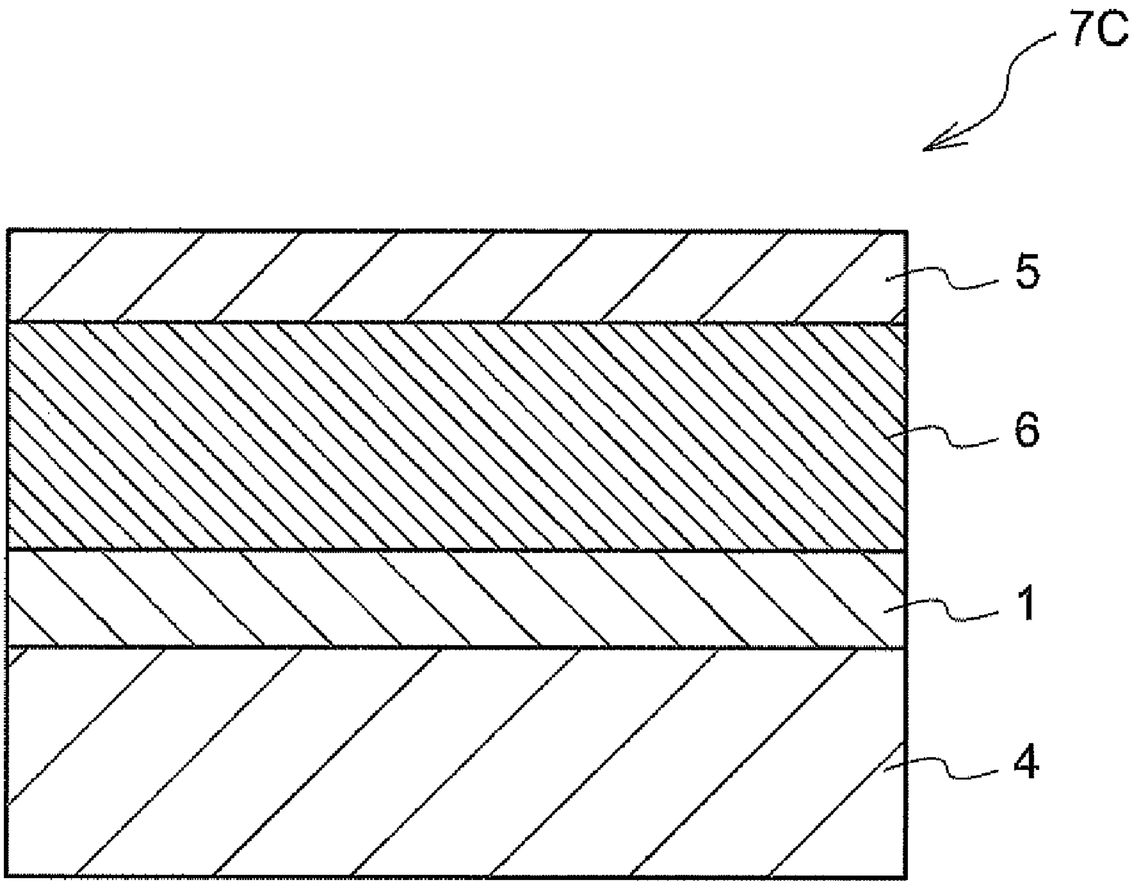
FIG. 3 is a schematic partial cross sectional view showing an electrophotographic photoreceptor according to another exemplary embodiment of the invention.

An electrophotographic photoreceptor 7B shown in FIG. 2 is a function separation type photoreceptor in which, similar to the electrophotographic photoreceptor 7A shown in FIG. 1, a function of a photosensitive layer is divided into a charge generating layer 2 and a charge transport layer 3. An electrophotographic photoreceptor 7C shown in FIG. 3 contains a charge generating material and a charge transporting material in the same layer (monolayer type photosensitive layer 6; charge generating/charge transport layer).

The electrophotographic photoreceptor 7B shown in FIG. 2 has a structure in which an undercoat layer 1, a charge transport layer 3, a charge generating layer 2 and a protective layer 5 are sequentially formed on a conductive substrate 4. In the electrophotographic photoreceptor 7B, a photosensitive layer is constituted of the charge generating layer 2 and the charge transport layer 3.

An electrophotographic photoreceptor 7C shown in FIG. 3 has a structure in which an undercoat layer 1, a monolayer type photosensitive layer 6 and a protective layer 5 are sequentially formed on a conductive substrate 4.

In the electrophotographic photoreceptors 7A to 7C shown in FIGS. 1 to 3, the protective layer 5 is an outermost surface layer formed on a side farthest from the conductive substrate 4, and the outermost surface layer includes the cured film of the above-described specific compositions.

In the electrophotographic photoreceptors shown in FIGS. 1 to 3, an undercoat layer 1 may or may not be formed.

Hereinafter, based on the electrophotographic photoreceptor 7A shown in FIG. 1 as a representative example, the respective constituents is described.

Conductive Substrate

Any conventionally used conductive substrate may be used as the conductive substrate according to the invention. Examples thereof include a plastic film on which a thin film (for example, metal such as aluminium, nickel, chromium or stainless steel, or a film of aluminium, titanium, nickel, chromium, stainless steel, gold, vanadium, tin oxide, indium oxide or indium tin oxide (ITO)) is formed; paper coated or impregnated with a conductivity-imparting agent; and a plastic film coated or impregnated with a conductivity-imparting agent. The shape of the substrate is not limited to a cylindrical shape and it may be a sheet shape or a plate shape.

It is preferable to use a conductive substrate, for example, having an electrical conductivity of less than $10^7$ Ω·cm.

When a metal pipe is used as a conductive substrate, the surface may be untreated, or treatment such as mirror cutting, etching, anodic oxidation, rough cutting, centerless grinding, sandblasting or wet honing may be performed in advance.

Undercoating Layer

If necessary, the undercoating layer is provided for the purpose of preventing the light reflection on the surface of the conductive substrate and the inflow of an unnecessary carrier from the conductive substrate to the photosensitive layer.

The undercoating layer contains, for example, a binder resin and optionally contains other additive.

Examples of the binder resin contained in the undercoating layer include acetal resins such as polyvinyl butyral; known polymer resin compounds such as a polyvinyl alcohol resin, casein, a polyamide resin, a cellulosic resin, gelatin, a polyurethane resin, a polyester resin, a methacrylic resin, an acrylic resin, a polyvinyl chloride resin, a polyvinyl acetate resin, a vinyl chloride-vinyl acetate-maleic anhydride resin, a silicone resin, a silicone-alkyd resin, a phenol resin, a phenol-formaldehyde resin, a melamine resin, or a urethane resin; a charge transporting resin having a charge transporting group; and a conductive resin such as poly aniline. Among them, a resin insoluble in a coating solvent for an upper layer is preferably used. Specifically, a phenol resin, a phenol-formaldehyde resin, a melamine resin, a urethane resin, and an epoxy resin are preferably used.

The undercoating layer may contain metallic compounds, such as a silicon compound, an organic zirconium compound, an organic titanium compound, or an organic aluminium compound.

The ratio of the metallic compounds and the binder resin is not particularly limited, and it can be set within the range that can achieve the intended electrophotographic photoreceptor characteristics.

In order to adjust the surface roughness, resin particles may be added to the undercoating layer. Examples of the resin particles include silicone resin particles and cross-linked polymethylmethacrylate (PMMA) particles. The surface of the formed undercoating layer may be polished to adjust the surface roughness. Examples of the polishing method include buffing, sandblasting, wet honing, and grinding treatment.

The undercoating layer may have a structure which contains at least a binding resin and conductive particles. It is preferable to use conductive particles, for example, having an electrical conductivity of less than $10^7$ Ω·cm.

Examples of the conductive particles include metal particles (for example, particles of aluminium, copper, nickel, or silver), particles of a conductive metal oxide (for example, particles of antimony oxide, indium oxide, tin oxide, or zinc oxide), and particles of a conductive material (for example, particles of carbon fiber, carbon black or graphite powder). Among them, particles of a conductive metal oxide are preferable. Two or more kinds of the conductive particles may used in combination.

The conductive particles may be subjected to surface treatment with a hydrophobizing agent (such as a coupling agent) or the like to adjust the resistance.

The content of the conductive particles is preferably from 10% by weight to 80% by weight, more preferably from 40% by weight to 80% by weight, with respect to the mass of the binder resin.

When the undercoating layer is formed, a coating liquid for forming an undercoating layer prepared by adding the above-described components to a solvent is used.

Examples of the method of dispersing particles into the coating liquid for forming an undercoating layer include a method in which a media dispersers such as a ball mill, a vibration ball mill, Attritor, a sand mill or a horizontal sand mill is used, and a method in which a media-less dispersers such as a stirrer, an ultrasonic disperser, a roll mill or a high-pressure homogenizer is used. Here, examples of high-pressure homogenizers include a collision-type homogenizer in which a liquid is dispersed by liquid-liquid collision or liquid-wall collision under high pressure, and a penetration-type homogenizer in which a liquid is dispersed by allowing it to penetrate through minute channels under high pressure.

Examples of methods of applying the coating liquid for forming an undercoating layer to a conductive substrate include dip coating, push-up coating, wire bar coating, spray coating, blade coating, knife coating and curtain coating.

The thickness of the undercoating layer is preferably 15 μm or more, more preferably from 20 μm to 50 μm.

Although the illustration is omitted here, an intermediate layer may be further provided between the undercoating layer and the photosensitive layer. Examples of the binder resin that can be used in the intermediate layer include an acetal resin such as polyvinyl butyral; polymer resin compounds such as a polyvinyl alcohol resin, casein, a polyamide resin, a cellulosic resin, gelatin, a polyurethane resin, a polyester resin, a methacrylic resin, an acrylic resin, a polyvinyl chloride resin, a polyvinyl acetate resin, a vinyl chloride-vinyl acetate-maleic anhydride resin, a silicone resin, a silicone-alkyd resin, a phenol-formaldehyde resin or a melamine resin; and organometallic compounds containing zirconium, titanium, aluminium, manganese or a silicon atom. These compounds may be used singly, or as a mixture or a polycondensate of two or more kinds thereof. Among them, the organometallic compounds containing zirconium or silicon are preferable, since the compounds have a low residual potential, the change in electric potential of the compounds depending on the environment is small, and the change in electric potential due to repeated use is small.

When the intermediate layer is formed, a coating liquid for forming an intermediate layer prepared by adding the above-described components to a solvent is used.

Examples of applying methods for forming an intermediate layer include general methods such as dip coating, push-up coating, wire bar coating, spray coating, blade coating, knife coating or curtain coating.

The intermediate layer serves as an electrical blocking layer, as well as improving the coating properties of the upper layer. However, when the film thickness is too thick, the electrical barrier may become too strong, thereby causing desensitization or an increase in potential during repeated use. Accordingly, when the intermediate layer is formed, the film thickness thereof is preferably adjusted to a range of from 0.1 μm to 3 μm. In this case, the intermediate layer may be used as an undercoating layer.

Charge Generating Layer

The charge generating layer includes, for example, a charge generating material and a binder resin. Examples of charge generating materials include phthalocyanine pigments such as non-metal phthalocyanine, chlorogallium phthalocyanine, hydroxygallium phthalocyanine, dichloro tin phthalocyanine, or titanyl phthalocyanine. Specific examples thereof include chlorogallium phthalocyanine crystals having distinct diffraction peaks at Bragg angle (2θ±0.2°) in CuKα characteristic X-ray diffraction of at least at 7.4°, 16.6°, 25.5° and 28.3°; non-metal phthalocyanine crystals having distinct diffraction peaks at Bragg angle (2θ±0.2°) in CuKα characteristic X-ray diffraction of at least at 7.7°, 9.3°, 16.9°, 17.5°, 22.4°, and 28.8°; hydroxygallium phthalocyanine crystals having distinct diffraction peaks at Bragg angle (2θ±0.2°) in CuKα characteristic X-ray diffraction of at least at 7.5°, 9.9°, 12.5°, 16.3°, 18.6°, 25.1° and 28.3°; and titanyl phthalocyanine crystals having distinct diffraction peaks at Bragg angle (2θ±0.2°) in CuKα characteristic X-ray diffraction of at least at 9.6°, 24.1°, and 27.2°. Examples of charge generating materials further include a quinone pigment, a perylene pigment, an indigo pigment, a bis-benzimidazole pigment, an anthrone pigment, and a quinacridone pigment. These charge generating materials may be used singly or in combination of two or more kinds thereof.

Examples of the binder resin that can be used in the charge generating layer include polycarbonate resins such as bisphenol A resin or bisphenol Z resin; an acrylic resin, a methacrylic resin, a polyarylate resin, a polyester resin, a polyvinyl chloride resin, a polystyrene resin, an acrylonitrile-styrene copolymer resin, an acrylonitrile-butadiene copolymer, a polyvinyl acetate resin, a polyvinyl formal resin, a polysulfone resin, a styrene-butadiene copolymer resin, a vinylidene chloride-acrylonitrile copolymer resin, a vinyl chloride-vinyl acetate-maleic anhydride resin, a silicone resin, a phenol-formaldehyde resin, a polyacrylamide resin, a polyamide resin, and a poly-N-vinylcarbazole resin. These binder resins may be used singly, or in combination of two or more kinds thereof.

The compounding ratio of the charge generating material and binder resin (charge generating material:binder resin) is preferably in the range of from 10:1 to 1:10.

When the charge generating layer is formed, a coating liquid for forming a charge generating layer prepared by adding the above-described components to a solvent is used.

Examples of the method of dispersing particles (such as charge generating materials) into the coating liquid for forming a charge generating layer include a method in which a media dispersers such as a ball mill, a vibration ball mill, Attritor, a sand mill or a horizontal sand mill is used; and a method in which a media-less dispersers such as a stirrer, an ultrasonic disperser, a roll mill or a high-pressure homogenizer is used. Here, examples of high-pressure homogenizers include a collision-type homogenizer in which a liquid is dispersed by liquid-liquid collision or liquid-wall collision under high pressure, and a penetration-type homogenizer in which a liquid is dispersed by allowing it to penetrate through minute channels under high pressure.

Examples of methods of applying the coating liquid for forming a charge generating layer to the undercoating layer include dip coating, push-up coating, wire bar coating, spray coating, blade coating, knife coating, and curtain coating.

The thickness of the charge generating layer is preferably adjusted to from 0.01 μm to 5 μm, more preferably from 0.05 μm to 2.0 μm.

Charge Transporting Layer

The charge transporting layer contains a charge transporting material and optionally contains a binder resin.

Examples of charge transporting materials include oxadiazole compounds such as 2,5-bis(p-diethylaminophenyl)-1,3,4-oxadiazole; pyrazoline compounds such as 1,3,5-triphenylpyrazoline and 1-[pyridyl-(2)]-3-(p-diethylaminostyryl)-5-(p-diethylaminostyryl)pyrazoline; aromatic tertiary amino compounds such as triphenylamine, N,N'-bis(3,4-dimethylphenyl)biphenyl-4-amine, tri(p-methylphenyl)aminyl-4-amine, and dibenzylaniline; aromatic tertiary diamino compounds such as N,N'-bis(3-methylphenyl)-N,N'-diphenylbenzidine; 1,2,4-triazine compounds such as 3-(4'-dimethylaminophenyl)-5,6-di-(4'-methoxyphenyl)-1,2,4-triazine; hydrazone compounds such as 4-diethylaminobenzaldehyde-1,1-diphenylhydrazone; quinazoline compounds such as 2-phenyl-4-styryl-quinazoline; benzofuran compounds such as 6-hydroxy-2,3-di(p-methoxyphenyl)benzofuran; α-stilbene compounds such as p-(2,2-diphenylvinyl)-N,N-diphenylaniline; enamine compounds; carbazole compounds such as N-ethylcarbazole; hole transporting materials such as poly-N-vinylcarbazole and the compounds thereof; quinone compounds such as chloranil and broanthraquinone; tetracyanoquinodimethane compounds; fluorenone compounds such as 2,4,7-trinitrofluorenone and 2,4,5,7-tetranitro-9-fluorenone; electron transporting materials such as xanthone compounds and thiophene compounds; and polymers having a group derived from the compounds above in the main chain or a side chain thereof. These charge transporting materials may be used singly or in combination of two or more kinds thereof.

Examples of binder resins that can be used in the charge transporting layer include insulating resins such as polycarbonate resins including bisphenol A resin and bisphenol Z resin, an acrylic resin, a methacrylic resin, a polyarylate resin, a polyester resin, a polyvinyl chloride resin, a polystyrene resin, an acrylonitrile-styrene copolymer resin, an acrylonitrile-butadiene copolymer resin, a polyvinyl acetate resin, a polyvinyl formal resin, a polysulfone resin, a styrene-butadiene copolymer resin, a vinylidene chloride-acrylonitrile copolymer resin, a vinyl chloride-vinyl acetate-maleic anhydride resin, a silicone resin, a phenol-formaldehyde resin, a polyacrylamide resin, a polyamide resin and a chlorine rubber; and organic photoconductive polymers such as polyvinyl carbazole, polyvinyl anthracene and polyvinylpyrene. These binder resins may be used singly or in combination of two or more kinds thereof.

Here, the compounding ratio of the charge transporting material and the binder resin (charge transporting material: binder resin) is preferably from 10:1 to 1:5.

The charge transporting layer is formed using a coating liquid for forming a charge transporting layer that is prepared by adding the components to a solvent.

Examples of the method of dispersing particles (such as fluororesin particles) into the coating liquid for forming a charge transporting layer include a method in which a media dispersers such as a ball mill, a vibration ball mill, Attritor, a sand mill or a horizontal sand mill is used; and a method in which a media-less dispersers such as a stirrer, an ultrasonic disperser, a roll mill or a high-pressure homogenizer is used. Here, examples of high-pressure homogenizers include a collision-type homogenizer in which a liquid is dispersed by liquid-liquid collision or liquid-wall collision under high pressure, and a penetration-type homogenizer in which a liquid is dispersed by allowing it to penetrate through minute channels under high pressure.

Examples of methods of applying g the coating liquid for forming a charge transporting layer to the charge generating layer include dip coating, push-up coating, wire bar coating, spray coating, blade coating, knife coating, and curtain coating.

The thickness of the charge transporting layer is preferably adjusted to from 5 μm to 50 μm, more preferably from 10 μm to 40 μm.

Protective Layer

The protective layer is a layer that includes a cured film of a composition containing a charge transporting material having a chain polymerizable functional group and at least one selected from a nitroso compound, a nitrone compound or a nitro compound.

First, the nitroso compound, the nitrone compound, and the nitro compound are described.

Examples of the nitroso compound include a compound having a nitroso structure represented by the following Formula (M1). The nitroso compound may be a compound having at least one of a nitrone structure or a nitro structure, in addition to the nitroso structure.

Examples of the nitrone compound include a compound having a nitrone structure represented by the following Formula (M2A) and a compound having a nitrone structure represented by the following Formula (M2B). The nitrone compound may be a compound having at least one of a nitroso structure or a nitro structure, in addition to the nitrone structure.

Examples of the nitro compound include a compound having a nitro structure represented by the following Formula (M3). The nitro compound may be a compound having at least one of a nitroso structure or a nitrone structure, in addition to the nitro structure.

(M1)

$R^{201}-N=O$ (M2A)

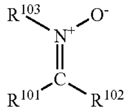

-continued (M2B)

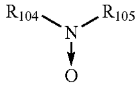

(M3)

$R^{301}-NO_2$

In Formulae (M1), (M2A), (M2B), and (M3), $R^{101}$, $R^{102}$ and $R^{103}$ each independently represent a monovalent substituent group; $R^{104}$ and $R^{105}$ each independently represent a monovalent substituent group; $R^{201}$ each independently represents a monovalent substituent group; and $R^{301}$ represents a substituted or unsubstituted alkyl group having 1 to 20 carbon atoms, or a substituted or unsubstituted aryl group having 3 to 30 carbon atoms.

Preferable examples of the compound having a nitroso structure represented by Formula (M1) include compounds in which $R^{201}$ represents a substituted or unsubstituted alkyl group having 1 to 20 carbon atoms, an alkoxy group having 1 to 20 carbon atoms, a substituted or unsubstituted aryl group having 3 to 30 carbon atoms, a hydroxyl group, an ester group, an amino group, an alkylamino group, an amido group, a cyano group, an ether group, a halogen atom, or a carboxyl group.

More preferable examples of the compound having a nitroso structure represented by Formula (M1) include compounds in which $R^{201}$ represents a substituted or unsubstituted alkyl group having 1 to 20 carbon atoms, or a substituted or unsubstituted aryl group having 3 to 30 carbon atoms.

Preferable examples of the compound having a nitrone structure represented by Formula (M2A) include compounds in which $R^{101}$, $R^{102}$ and $R^{103}$ each independently represent a hydrogen atom, a substituted or unsubstituted alkyl group having 1 to 20 carbon atoms, an alkoxy group having 1 to 20 carbon atoms, a substituted or unsubstituted aryl group having 3 to 30 carbon atoms, a hydroxyl group, an ester group, an amino group, an alkylamino group, an amido group, a cyano group, an ether group, a halogen atom, or a carboxyl group; compounds in which at least one of $R^{101}$, $R^{102}$ or $R^{10}$ represents a substituted or unsubstituted cyclic structure having 1 to 20 carbon atoms; compounds in which $R^{101}$ and $R^{103}$ each independently represent a substituted or unsubstituted cyclic structure having 1 to 20 carbon atoms; and compounds in which $R^{101}$ and $R^{102}$ each independently represent a substituted or unsubstituted cyclic structure having 1 to 20 carbon atoms.

Preferable examples of the compound having a nitrone structure represented by Formula (M2A) include compounds in which $R^{101}$ and $R^{103}$ each independently represent a substituted or unsubstituted cyclic structure having 1 to 20 carbon atoms; and compounds in which $R^{101}$ and $R^{102}$ each independently represent a substituted or unsubstituted cyclic structure having 1 to 20 carbon atoms.

Preferable examples of the compound having a nitrone structure represented by Formula (M2B) include compounds in which $R^{104}$ and $R^{105}$ each independently represent a hydrogen atom, a substituted or unsubstituted alkyl group having 1 to 20 carbon atoms, an alkoxy group having 1 to 20 carbon atoms, a substituted or unsubstituted aryl group having 3 to 30 carbon atoms, a hydroxyl group, an ester group, an amino group, an alkylamino group, an amido group, a cyano group, an ether group, a halogen atom or a carboxyl group; and compounds in which $R^{104}$ and $R^{105}$ each independently represent a substituted or unsubstituted cyclic structure having 1 to 20 carbon atoms.

More preferable examples of the compound having a nitrone structure represented by Formula (M2B) include compounds in which $R^{104}$ and $R^{105}$ each independently represent a substituted or unsubstituted cyclic structure having 1 to 20 carbon atoms.

Preferable examples of the compound having a nitro structure represented by Formula (M3) include compounds in which $R^{301}$ represents a substituted or unsubstituted alkyl group having 1 to 20 carbon atoms, a substituted or unsubstituted aryl group having 3 to 30 carbon atoms, an ester group, an amino group, an alkylamino group, an amido group, a cyano group, an ether group, a halogen atom or a carboxyl group.

More preferable examples of the compound having a nitro structure represented by Formula (M3) include compounds in which $R^{301}$ represents a substituted or unsubstituted alkyl group having 1 to 20 carbon atoms, a substituted or unsubstituted aryl group having 3 to 30 carbon atoms, an ester group, an amino group, an alkylamino group, an amido group, a cyano group, an ether group, a halogen atom or a carboxyl group.

Among these nitroso, nitrone and nitro compounds, the nitro compounds are preferable in order to further suppress the residual image phenomenon (ghosting) caused by residual traces of a previous image.

Specific examples of nitroso, nitrone and nitro compounds include the following compounds, but the invention is not limited to these examples.

Examples of nitroso compounds include nitrosobenzene, 2-methyl-2-nitrosopropane dimer, and 2,4,6-tributylnitrosobenzene.

Examples of nitrone compounds include N-t-butyl-α-phenylnitrone, N-t-butyl-α-(4-pyridyl-1-oxide)nitrone, 5-(diethylphosphono)-5-methyl-1-pyrroline-N-oxide, 5,5-dimethyl-1-pyrroline-N-oxide, 3,3,5,5-tetramethyl-1-pyrroline-N-oxide, 16-DOXYL-stearic acid free radical, 2,2,6,6-tetramethylpiperidine-1-oxyl free radical, 3-carboxy-2,2,5,5-tetramethyl pyrrolidine-1-oxyl free radical, 4-(2-chloroacetamide)-2,2,6,6-tetramethylpiperidine-1-oxyl free radical, 4-(2-iodoacetamide)-2,2,6,6-tetramethylpiperidine-1-oxyl free radical, 4-acetamido-2,2,6,6-tetramethylpiperidine-1-oxyl free radical, 4-amino-2,2,6,6-tetramethylpiperidine-1-oxyl free radical, 4-carboxy-2,2,6,6-tetramethylpiperidine-1-oxyl free radical, 4-cyano-2,2,6,6-tetramethylpiperidine-1-oxyl free radical, 4-hydroxy-2,2,6,6-tetramethylpiperidine-1-oxyl free radical, 4-hydroxy-2,2,6,6-tetramethylpiperidine-1-oxylbenzoate free radical, 4-isothiocyanato-2,2,6,6-tetramethylpiperidine-1-oxyl free radical, 4-methoxy-2,2,6,6-tetramethylpiperidine-1-oxyl free radical, and 4-oxo-2,2,6,6-tetramethylpiperidine-1-oxyl free radical.

Examples of nitro compounds include aromatic nitro compounds such as 5-nitroacenaphthene, 2'-nitroacetophenone, 3'-nitroacetophenone, 4'-nitroacetophenone, 2-nitroanisole, 3-nitroanisole, 4-nitroanisole, 1-nitroanthraquinone, 5-nitrobenzimidazole, nitrobenzene, 4'-nitrobenzo-15-crown-5-ether, 4'-nitrobenzo-18-crown-6-ether, ethyl 4-nitrobenzoate, 2-nitrobenzonitrile, 3-nitrobenzonitrile, 4-nitrobenzonitrile, 4-nitrobenzophenon, 4-nitro-2,1,3-benzothiadiazole, 3-nitrobenzotrifluoride, 2-nitrobenzyl cyanide, 4-nitrobenzyl cyanide, 4-(4-nitrobenzyl)pyridine, 2-nitrobiphenyl, 1-nitro-3,5-bis(trifluoromethyl)benzene, 4-nitrocatechol, 2-nitro-m-cresol, 2-nitro-p-cresol, 3-nitro-o-cresol, 3-nitro-p-cresol, 4-nitro-m-cresol, 5-nitro-o-cresol, 6-nitro-m-cresol, 2-nitrocumene, 4-nitrocumene, 2-nitro-p-cymene, 3-nitrodiphenyl, 4-nitrodiphenylmethane, 4-nitro-2,6-diphenylphenol, 3-(2-nitroethenyl)pyridine, 2-(2-nitroethoxy)tetrahydropyran, 2-nitrofluorene, 2-nitrofluorenone, 5-nitro-2-furaldehyde diacetate, 5-nitroguaiacol, 4-nitroimidazole, 5-nitroindazole, 6-nitroindazole, 7-nitroindazole, 4-nitroindole, 5-nitroindole, 6-nitroindole, 7-nitroindole, 6-nitroindoline, dimethyl 5-nitroisophthalate, 5-nitroisoquinoline, 1-nitronaphthalene, 1-nitro-2-naphthol, 4-nitro-1-naphthol, 5-nitro-1,10-phenanthroline, 2-nitrophenetole, 3-nitrophenetole, 4-nitrophenetole, 2-(4-nitrophenoxy)naphthalene, 4-nitrophenyl acetate, ethyl 4-nitrophenylacetate, 4-nitrophenyl hexanoate, 4-nitrophenyl laurate, 1-(4-nitrophenyl)-3-methyl-5-pyrazolone, 2-nitrophenyl octyl ether, 1-(4-nitrophenyl)pyrrole, 4-nitrophenyl trifluoroacetate, 3-nitrophthalonitrile, 4-nitrophthalonitrile, 1-nitropyrene, 3-nitropyridine, 5-nitroquinoline, 6-nitroquinoline, 8-nitroquinoline; and aliphatic nitroso compounds such as nitromethane, nitroethane, 1-nitropropane, 2-nitropropane, and nitrocyclohexane.

The total content of the nitroso compound, nitrone compound and nitro compound is preferably from 0.01% by weight to 5% by weight, more preferably from 0.05% by weight to 3% by weight, still more preferably from 0.1% by weight to 2% by weight, with respect to a composition used for forming the protective layer.

Hereinbelow, the charge transporting material having a chain polymerizable functional group is described.

The charge transporting material having a chain polymerizable functional group is a compound having a charge transporting skeleton and a chain polymerizable functional group in the same molecule.

Here, examples of the charge transporting skeleton include a skeleton that has a structure derived from nitrogen-containing hole transporting compounds such as triarylamine compounds, benzidine compounds and hydrazone compounds and is coupled with a nitrogen atom.

Examples of the chain polymerizable functional group include an acryloyl group, a methacryloyl group and a styrene group. Among them, a methacryloyl group is preferable.

More specifically, the charge transporting material having a chain polymerizable functional group is preferably a compound represented by the following Formula (I).

(I)

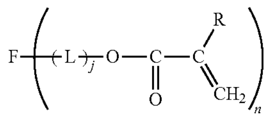

In Formula (I), F represents an n-valent organic group having hole transportability; R represents a hydrogen atom or an alkyl group; L represents a divalent organic group, n represents an integer of 1 or more; and j represents 0 or 1.

In Formula (I), F represents an n-valent organic group having hole transportability, and examples of the organic group include an organic group derived from an arylamine compound, that is, an organic group obtained by removing n hydrogen atom(s) from an arylamine compound. Among arylamine compounds, an n-valent organic group derived from an arylamine compound such as a triphenylamine compound or a tetraphenylbenzidine compound is preferable.

In Formula (I), n represents an integer of 1 or more, and, in order to increase crosslinking density and obtain a hard crosslinked film (cured film), n preferably represents 2 or more, and more preferably 4 or more. The upper limit value of n is preferably 20, and more preferably 10, in consideration of the stability and electrical characteristics of the coating liquid.

When n is within the above preferable range, the rotating torque of an electrophotographic photoreceptor is reduced, particularly when a blade cleaner is used, and damage to a blade and abrasion of the electrophotographic photoreceptor may be reduced. Although the reason for this is not clear, it is assumed that when the number of reactive functional groups increases, a cured film with high crosslinking density is obtained and molecular motion at outermost surface of the electrophotographic photoreceptor is suppressed, whereby interaction with molecules on a surface of a blade member may be reduced.

In Formula (I), R represents a hydrogen atom or an alkyl group, and preferable examples of the alkyl group include straight-chain or branched-chain alkyl groups having 1 to 5 carbon atoms.

Among these, it is preferable that R represents a methyl group. That is, in a compound represented by Formula (I), it is preferable that a terminal of a substituent in parentheses represents a methacryloyl group. Although the reason for this is not clear, it is assumed to be as follows.

In general, an acryl group having high reactivity is used for a curing reaction. However, it is thought that when an acryl group having high reactivity is used as a substituent of a bulky charge transporting material such as the compound represented by Formula (I), an inhomogeneous curing reaction is easily generated, which results in generation of a micro (or macro) sea-island structure. This sea-island structure is not particularly problematic in fields other than electronics. However, when an electrophotographic photoreceptor having a sea-island structure is used, problems such as unevenness or crimping in the outermost surface layer or unevenness in image density may be caused. For these reasons, it is preferable that R represents a methyl group.

It is thought that formation of such a sea-island structure is particularly noticeable when plural functional groups are linked to one charge transporting skeleton (F in Formula (I)).

In Formula (I), L represents a divalent organic group, and preferable examples of the divalent organic group include an organic group containing an alkylene group having 2 or more carbon atoms. It is preferable that j represents 1 in consideration of electrical characteristics and mechanical strength. Although the reason for this is not clear, it is assumed to be as follows.

That is, it is thought that, during polymerization of a radically polymerizable substituent such as the compound represented by Formula (I), if a radical generated during polymerization has a structure that readily moves to a charge transporting skeleton (F in Formula (I)), the charge transporting function of the compound may be deteriorated by the generated radical and electrical characteristics may be impaired. Furthermore, it is thought that when a bulky charge transporting skeleton and a polymerizable moiety are positioned near to each other and form a rigid structure, motion of the respective polymerizable moieties may be suppressed and reactivity may be remarkably reduced, thereby reducing the mechanical strength. From these reasons, it is preferable that L represents an organic group containing an alkylene group having two or more carbon atoms and j represents 1.

When L represents an organic group containing an alkylene group having two or more carbon atoms, the organic group may be a group containing only an alkylene group having two or more carbon atoms, or may be a group containing a combination of an alkylene group having two or more carbon atoms and a divalent group such as an alkenylene group, an alkynylene group, an ether group, a thioether group, an ester group or an arylene group (for example, a phenylene group). An upper limit value of a number of carbon atoms of an alkylene group is preferably 20, and more preferably 10, in consideration of mechanical strength.

The compound represented by Formula (I) is preferably a compound represented by the following Formula (II).

It is thought that the compound represented by Formula (II) exhibits excellent charge mobility and stability to oxidation.

(II)

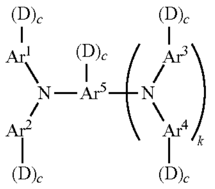

In Formula (II), $Ar^1$ to $Ar^4$ each independently represent a substituted or unsubstituted aryl group; $Ar^5$ represents a substituted or unsubstituted aryl group, or a substituted or unsubstituted arylene group; D represents $-(L)_j-O-CO-C(R)=CH_2$; each c independently represent 0 or 1; k represents 0 or 1; and the total number of Ds is 1 or more. L, R and j have the same definitions as those of L, R and j in Formula (I), respectively. Here, R preferably represents a hydrogen atom, or a straight-chain or branched-chain alkyl group having from 1 to 5 carbon atoms.

The total number of Ds in formula (II) corresponds to n in Formula (I), and preferably the total number of Ds is 2 or more, and more preferably 4 or more, in order to increase the crosslinking density and to obtain a hard crosslinked film (cured film), for the same reason as above.

R preferably represents a methyl group, for the same reason as above.

In Formula (II), $Ar^1$ to $Ar^4$ each independently represent a substituted or unsubstituted aryl group. $Ar^1$ to $Ar^4$ may be the same as or may be different from one another.

Here, examples of a substituent for the substituted aryl group other than D ($-(L)_j-O-CO-C(R)=CH_2$) include an alkyl group having 1 to 4 carbon atoms, an alkoxy group having 1 to 4 carbon atoms, a phenyl group substituted by an alkoxy group having 1 to 4 carbon atoms, an unsubstituted phenyl group, an aralkyl group having 7 to 10 carbon atoms, and a halogen atom.

It is preferable that $Ar^1$ to $Ar^4$ each independently represent a structure selected from the following Structural Formulae (1) to (7). Here, "-(D)c" in Structural Formulae (1) to (7) represents a moiety that can be linked with any of $Ar^1$ to $Ar^4$. "-(D)c" has the same definition as "-(D)c" in Formula (II), and has the same preferable examples as those in Formula (II).

(1)

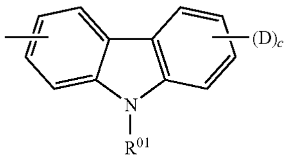

-continued (2)

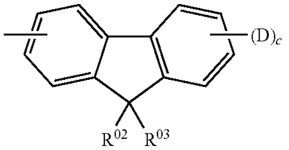

(3)

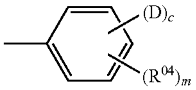

(4)

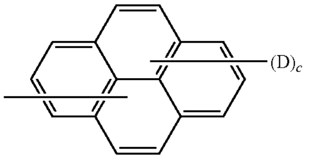

(5)

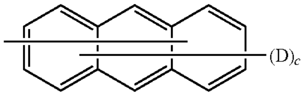

(6)

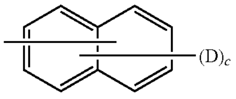

(7)

$$-Ar-(Z')_p-Ar-(D)_c$$

In Structural Formula (1), $R^{01}$ represents a hydrogen atom, an alkyl group having 1 to 4 carbon atoms, a phenyl group substituted by an alkyl group having 1 to 4 carbon atoms, a phenyl group substituted by an alkoxy group having 1 to 4 carbon atoms, an unsubstituted phenyl group, or an aralkyl group having 7 to 10 carbon atoms.

In Structural Formulae (2) and (3), $R^{02}$ to $R^{04}$ each independently represent a hydrogen atom, an alkyl group having 1 to 4 carbon atoms, an alkoxy group having 1 to 4 carbon atoms, a phenyl group substituted by an alkoxy group having 1 to 4 carbon atoms, an unsubstituted phenyl group, an aralkyl group having 7 to 10 carbon atoms, or a halogen atom; and m represents an integer of from 1 to 3.

In Structural Formula (7), Ar represents a substituted or unsubstituted arylene group.

Herein, Ar in Structural Formula (7) preferably has a structure represented by the following Structural Formula (8) or (9).

(8)

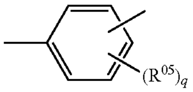

(9)

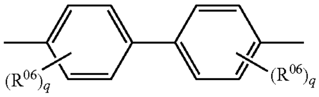

In Structural Formulae (8) and (9), $R^{05}$ and $R^{06}$ each independently represent a hydrogen atom, an alkyl group having 1 to 4 carbon atoms, an alkoxy group having 1 to 4 carbon atoms, a phenyl group substituted by an alkoxy group having 1 to 4 carbon atoms, an unsubstituted phenyl group, an aralkyl group having 7 to 10 carbon atoms, or a halogen atom; and each q independently represent an integer of from 1 to 3.

In Structural Formula (7), Z' represents a divalent organic linking group; and p represents 0 or 1. It is preferable that Z' has a structure represented by any of the following Structural Formulae (10) to (17).

$-(CH_2)_r-$ (10)

$-(CH_2CH_2O)_s-$ (11)

(12)

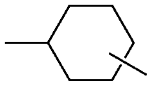

(13)

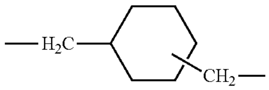

(14)

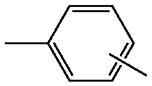

(15)

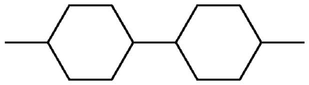

(16)

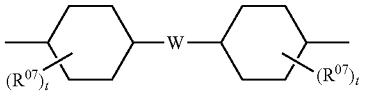

(17)

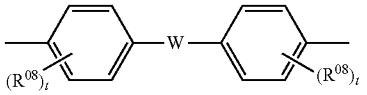

In Structural Formulae (10) to (17), $R^{07}$ and $R^{08}$ each independently represent a hydrogen atom, an alkyl group having 1 to 4 carbon atoms, an alkoxy group having 1 to 4 carbon atoms, a phenyl group substituted by an alkoxy group having 1 to 4 carbon atoms, an unsubstituted phenyl group, an aralkyl group having 7 to 10 carbon atoms, or a halogen atom; W represents a divalent group; r and s each independently represent an integer of from 1 to 10; and each t independently represent an integer of from 1 to 3.

It is preferable that W in Structural Formulae (16) and (17) each independently represent a divalent group represented by any of the following Structural Formulae (18) to (26). Here, in Structural Formula (25), u represents an integer of from 0 to 3.

$-CH_2-$ (18)

$-C(CH_3)_2-$ (19)

$-O-$ (20)

$-S-$ (21)

$-C(CF_3)_2-$ (22)

$-Si(CH_3)_2-$ (23)

(24)

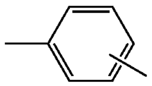

-continued (25)

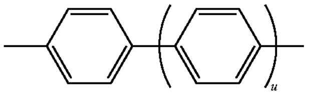

(26)

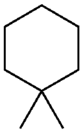

In Formula (II), $Ar^5$ represents a substituted or unsubstituted aryl group when k represents 0. Examples of the aryl group include the aryl groups explained as the aryl groups for $Ar^1$ to $Ar^4$ above. $Ar^5$ represents a substituted or unsubstituted arylene group when k represents 1. Examples of the arylene group include an arylene group obtained by removing one hydrogen atom at a desired site from an aryl group. Here, examples of the aryl group include the aryl groups explained as the aryl groups for $Ar^1$ to $Ar^4$ above.

Specific examples of the compound represented by Formula (I), but not limited to these examples, include the followings.

Hereinbelow, specific examples (compounds i-1 to i-14) of the compound represented by Formula (I) in which n represents 1 are shown, but the invention is not limited to these examples.

| No. | |
| --- | --- |
| i-1 | 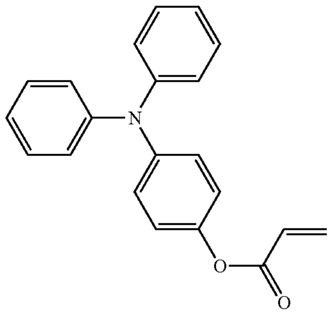 [SMILES: C=CC(=O)Oc1ccc(N(c2ccccc2)c2ccccc2)cc1] |
| i-2 | 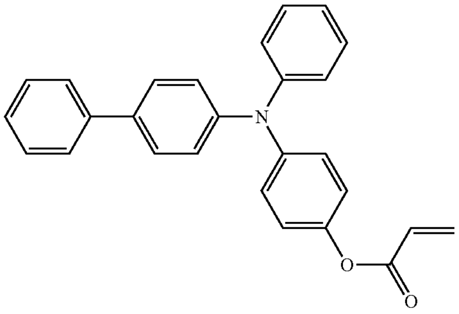 [SMILES: C=CC(=O)Oc1ccc(N(c2ccccc2)c2ccc(-c3ccccc3)cc2)cc1] |

-continued
| No. | |
|---|---|
| i-3 | 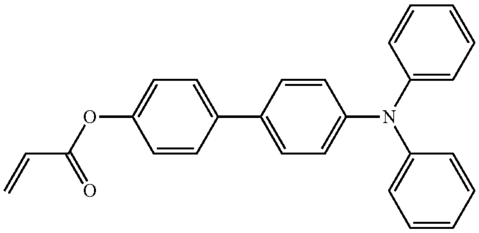 [SMILES: C=CC(=O)Oc1ccc(-c2ccc(N(c3ccccc3)c3ccccc3)cc2)cc1] |
| i-4 | 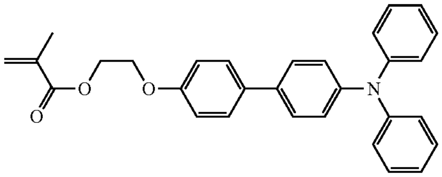 [SMILES: C=C(C)C(=O)OCCOc1ccc(-c2ccc(N(c3ccccc3)c3ccccc3)cc2)cc1] |
| i-5 | 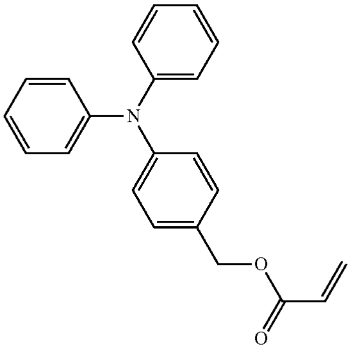 [SMILES: C=CC(=O)OCc1ccc(N(c2ccccc2)c2ccccc2)cc1] |
| i-6 | 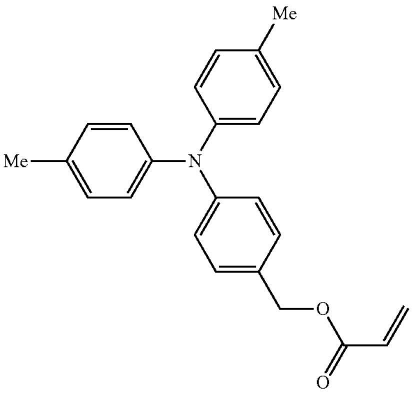 [SMILES: C=CC(=O)OCc1ccc(N(c2ccc(C)cc2)c2ccc(C)cc2)cc1] |
| i-7 | 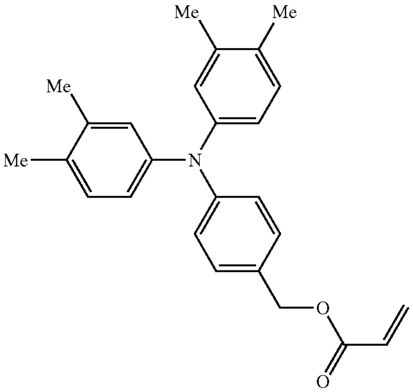 [SMILES: C=CC(=O)OCc1ccc(N(c2ccc(C)c(C)c2)c2ccc(C)c(C)c2)cc1] |
-continued
| No. | |
|---|---|
| i-8 | 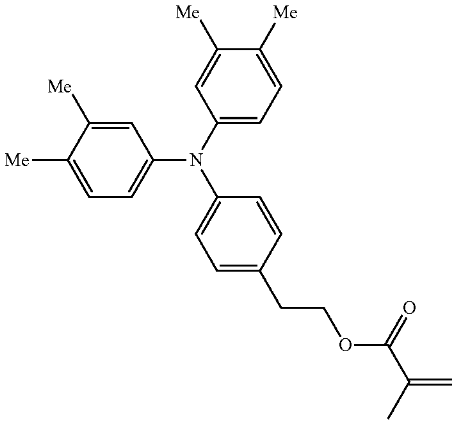 [SMILES: C=C(C)C(=O)OCCc1ccc(N(c2ccc(C)c(C)c2)c2ccc(C)c(C)c2)cc1] |
| i-9 | 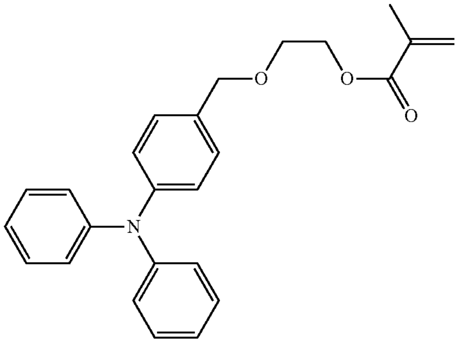 [SMILES: C=C(C)C(=O)OCCOCc1ccc(N(c2ccccc2)c2ccccc2)cc1] |
| i-10 | 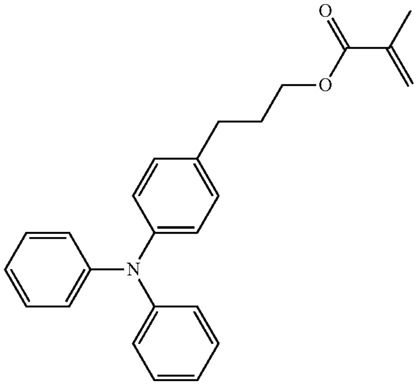 [SMILES: C=C(C)C(=O)OCCCc1ccc(N(c2ccccc2)c2ccccc2)cc1] |

-continued
| No. | |
|---|---|
| i-11 | 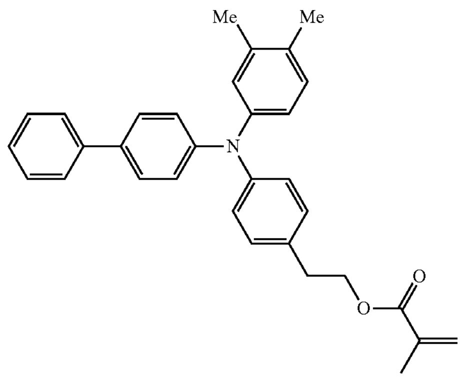 [SMILES: C=C(C)C(=O)OCCc1ccc(N(c2ccc(-c3ccccc3)cc2)c2ccc(C)c(C)c2)cc1] |
| i-12 | 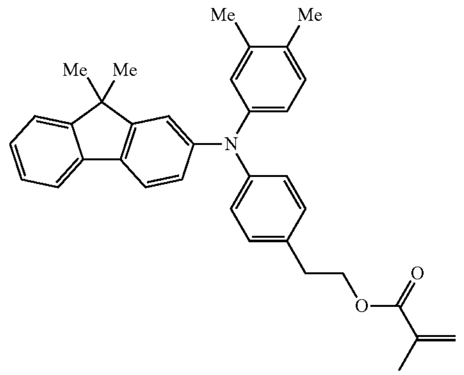 [SMILES: C=C(C)C(=O)OCCc1ccc(N(c2ccc(C)c(C)c2)c2ccc3c(c2)C(C)(C)c2ccccc2-3)cc1] |
-continued
| No. | |
|---|---|
| i-13 | 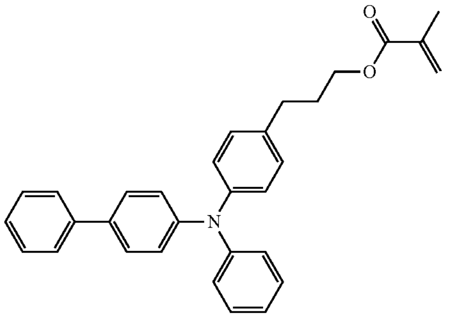 [SMILES: C=C(C)C(=O)OCCCc1ccc(N(c2ccccc2)c2ccc(-c3ccccc3)cc2)cc1] |
| i-14 | 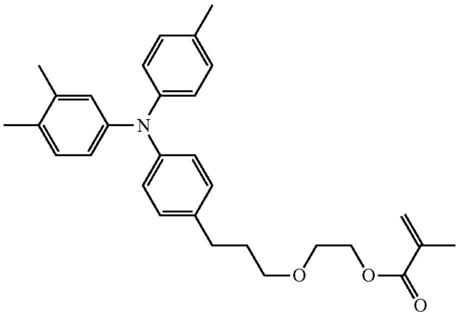 [SMILES: C=C(C)C(=O)OCCOCCCc1ccc(N(c2ccc(C)cc2)c2ccc(C)c(C)c2)cc1] |
Hereinbelow, specific examples (compounds ii-1 to ii-26) of the compound represented by Formula (I) in which n represents 2 are shown, but the invention is not limited to these examples.
| No. | |
|---|---|
| ii-1 | 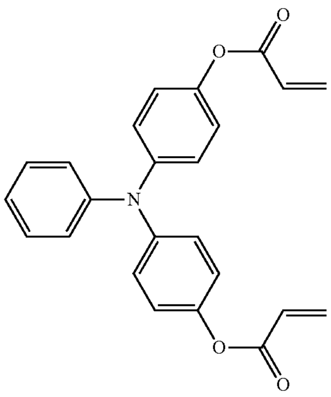 [SMILES: C=CC(=O)Oc1ccc(N(c2ccccc2)c2ccc(OC(=O)C=C)cc2)cc1] |

-continued
| No. | |
|---|---|
| ii-2 | 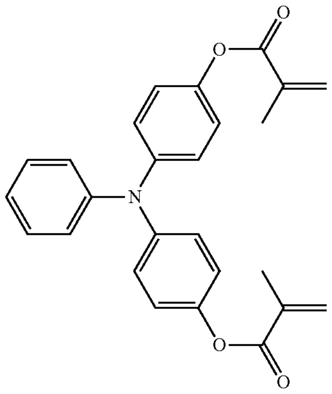 [SMILES: C=C(C)C(=O)Oc1ccc(N(c2ccccc2)c2ccc(OC(=O)C(=C)C)cc2)cc1] |
| ii-3 | 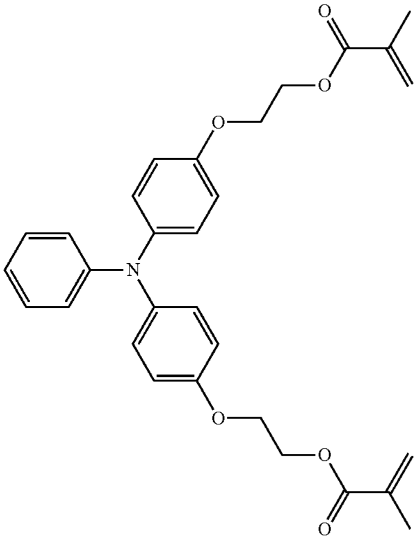 [SMILES: C=C(C)C(=O)OCCOc1ccc(N(c2ccccc2)c2ccc(OCCOC(=O)C(=C)C)cc2)cc1] |
| ii-4 | 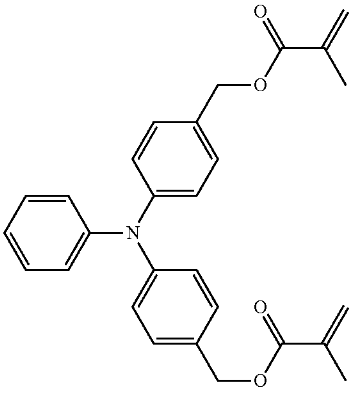 [SMILES: C=C(C)C(=O)OCc1ccc(N(c2ccccc2)c2ccc(COC(=O)C(=C)C)cc2)cc1] |

-continued
| No. | |
|---|---|
| ii-5 | 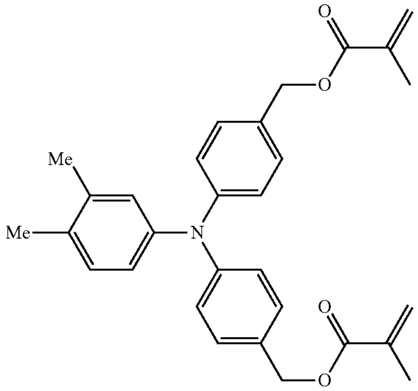 [SMILES: C=C(C)C(=O)OCc1ccc(N(c2ccc(COC(=O)C(=C)C)cc2)c2ccc(C)c(C)c2)cc1] |
| ii-6 | 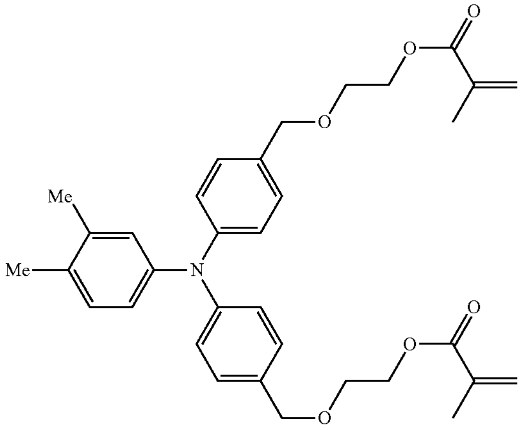 [SMILES: C=C(C)C(=O)OCCOCc1ccc(N(c2ccc(COCCOC(=O)C(=C)C)cc2)c2ccc(C)c(C)c2)cc1] |
| ii-7 | 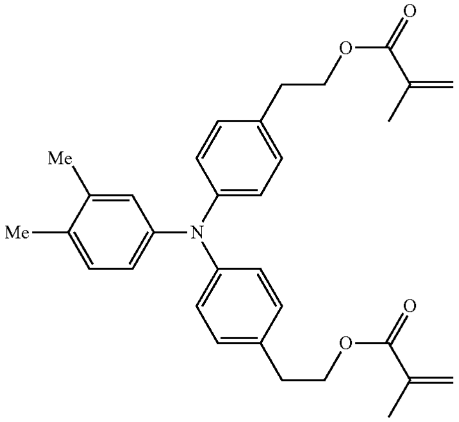 [SMILES: C=C(C)C(=O)OCCc1ccc(N(c2ccc(CCOC(=O)C(=C)C)cc2)c2ccc(C)c(C)c2)cc1] |

-continued
| No. | |
|---|---|
| ii-8 | 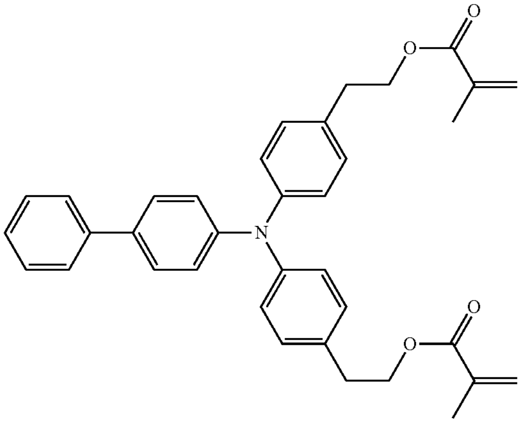 [SMILES: C=C(C)C(=O)OCCc1ccc(N(c2ccc(CCOC(=O)C(=C)C)cc2)c2ccc(-c3ccccc3)cc2)cc1] |
| ii-9 | 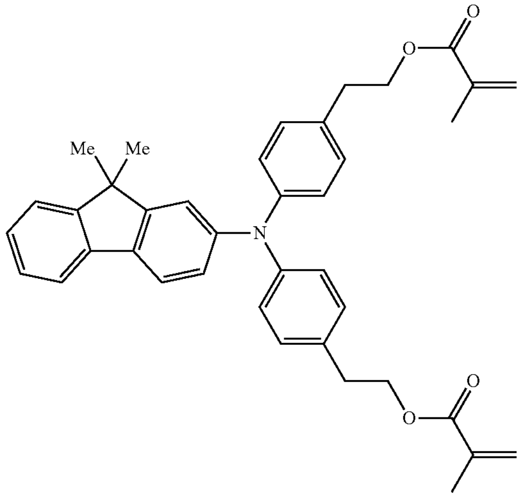 [SMILES: C=C(C)C(=O)OCCc1ccc(N(c2ccc(CCOC(=O)C(=C)C)cc2)c2ccc3c(c2)C(C)(C)c2ccccc2-3)cc1] |
| ii-10 | 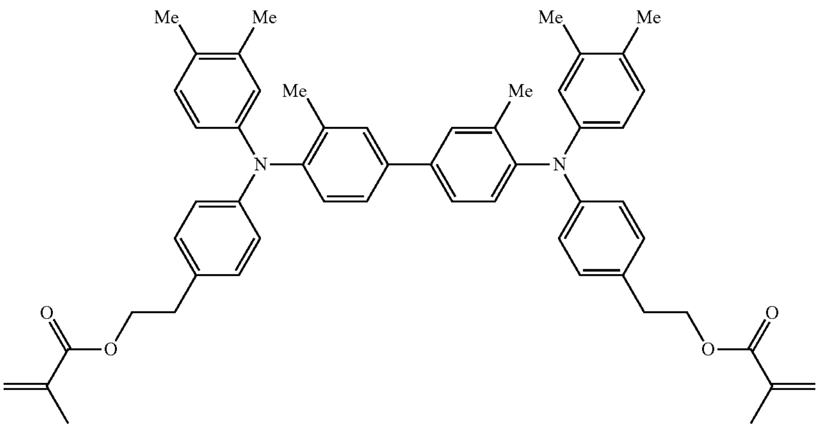 [SMILES: C=C(C)C(=O)OCCc1ccc(N(c2ccc(C)c(C)c2)c2ccc(-c3ccc(N(c4ccc(CCOC(=O)C(=C)C)cc4)c4ccc(C)c(C)c4)c(C)c3)cc2C)cc1] |

-continued
| No. | |
|---|---|
| ii-11 | 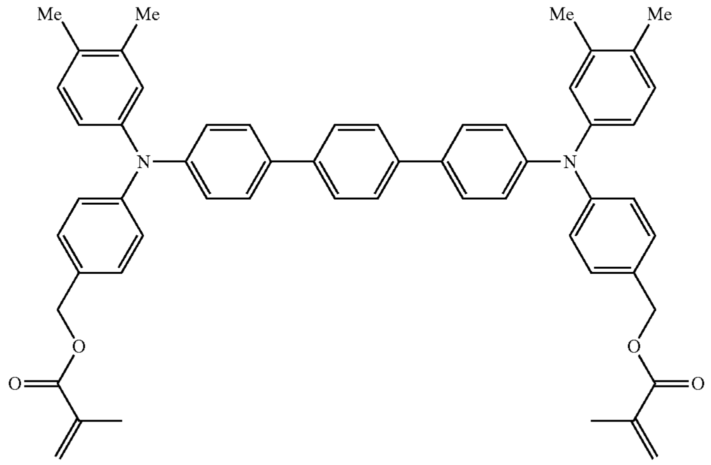 [SMILES: C=C(C)C(=O)OCc1ccc(N(c2ccc(-c3ccc(-c4ccc(N(c5ccc(COC(=O)C(=C)C)cc5)c5ccc(C)c(C)c5)cc4)cc3)cc2)c2ccc(C)c(C)c2)cc1] |
| ii-12 | 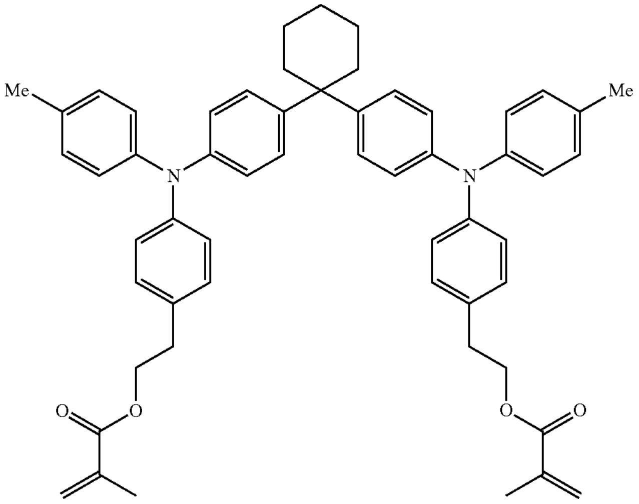 [SMILES: C=C(C)C(=O)OCCc1ccc(N(c2ccc(C)cc2)c2ccc(C3(c4ccc(N(c5ccc(C)cc5)c5ccc(CCOC(=O)C(=C)C)cc5)cc4)CCCCC3)cc2)cc1] |
| ii-13 | 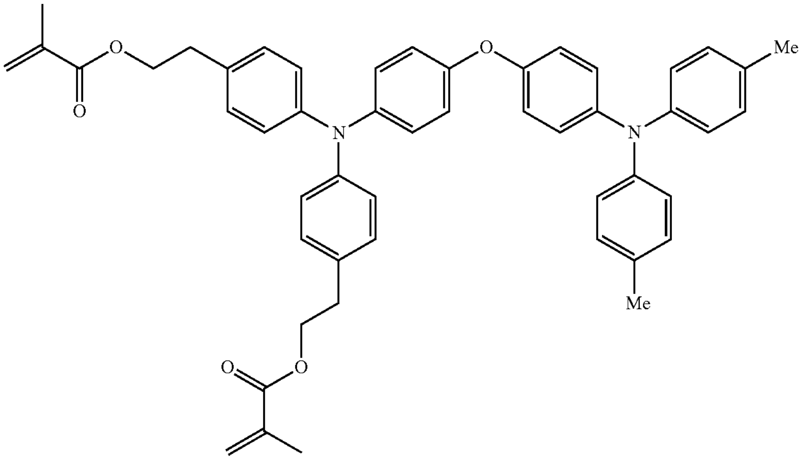 [SMILES: C=C(C)C(=O)OCCc1ccc(N(c2ccc(CCOC(=O)C(=C)C)cc2)c2ccc(Oc3ccc(N(c4ccc(C)cc4)c4ccc(C)cc4)cc3)cc2)cc1] |

-continued
| No. | |
|---|---|
| ii-14 | 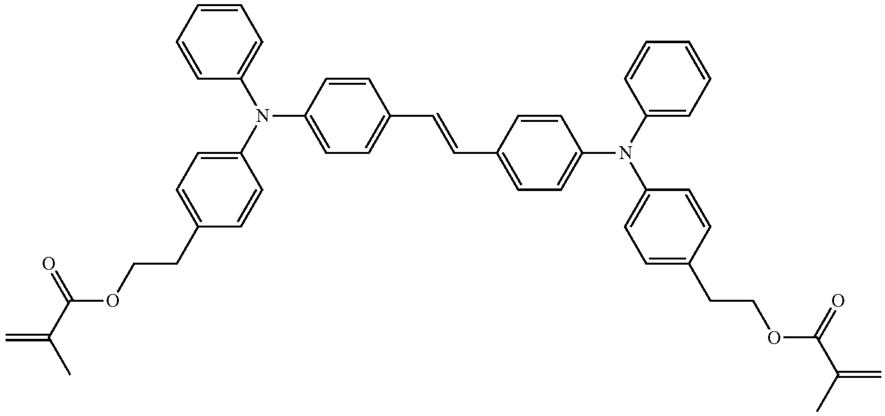 [SMILES: C=C(C)C(=O)OCCc1ccc(N(c2ccccc2)c2ccc(/C=C/c3ccc(N(c4ccccc4)c4ccc(CCOC(=O)C(=C)C)cc4)cc3)cc2)cc1] |
| ii-15 | 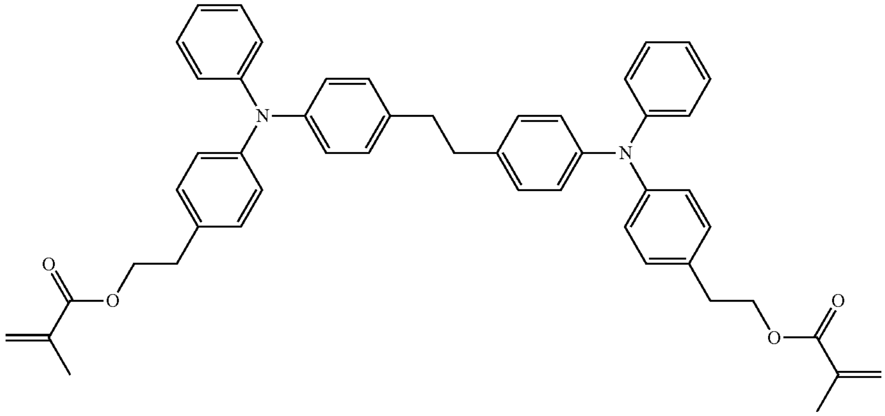 [SMILES: C=C(C)C(=O)OCCc1ccc(N(c2ccccc2)c2ccc(CCc3ccc(N(c4ccccc4)c4ccc(CCOC(=O)C(=C)C)cc4)cc3)cc2)cc1] |
| ii-16 | 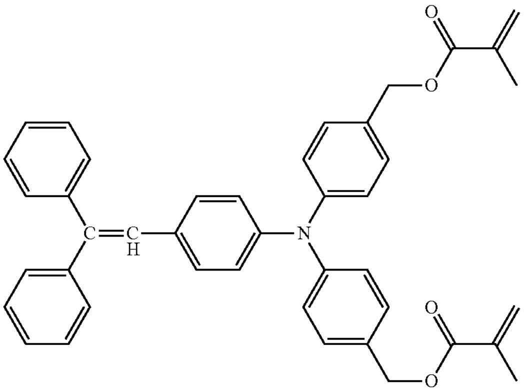 [SMILES: C=C(C)C(=O)OCc1ccc(N(c2ccc(C=C(c3ccccc3)c3ccccc3)cc2)c2ccc(COC(=O)C(=C)C)cc2)cc1] |

-continued
| No. | |
|---|---|
| ii-17 | 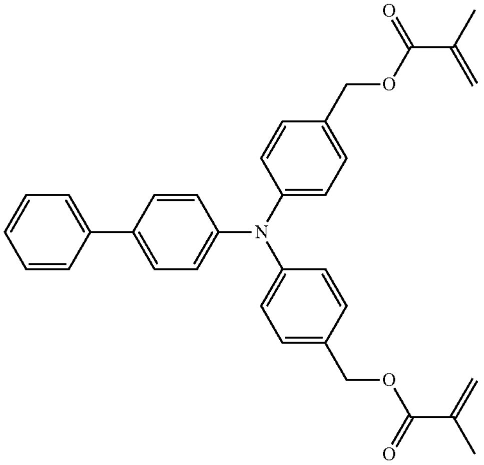 [SMILES: C=C(C)C(=O)OCc1ccc(N(c2ccc(COC(=O)C(=C)C)cc2)c2ccc(-c3ccccc3)cc2)cc1] |
| ii-18 | 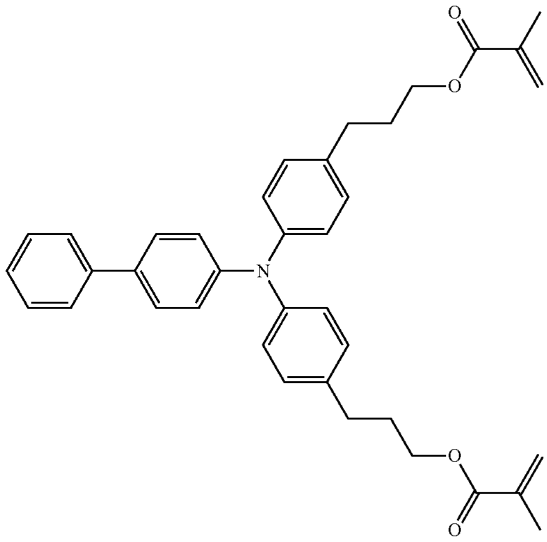 [SMILES: C=C(C)C(=O)OCCCc1ccc(N(c2ccc(CCCOC(=O)C(=C)C)cc2)c2ccc(-c3ccccc3)cc2)cc1] |
| ii-19 | 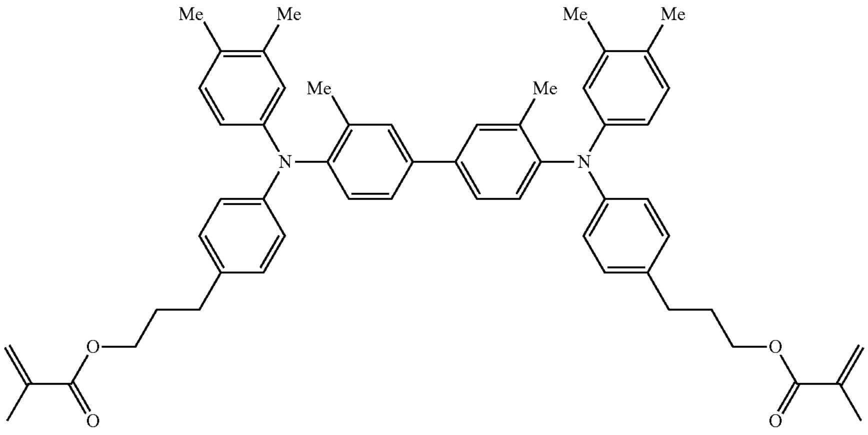 [SMILES: C=C(C)C(=O)OCCCc1ccc(N(c2ccc(C)c(C)c2)c2ccc(-c3ccc(N(c4ccc(CCCOC(=O)C(=C)C)cc4)c4ccc(C)c(C)c4)c(C)c3)cc2C)cc1] |

-continued
| No. | |
|---|---|
| ii-20 | 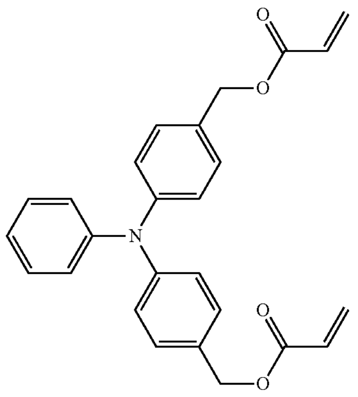 [SMILES: C=CC(=O)OCc1ccc(N(c2ccccc2)c2ccc(COC(=O)C=C)cc2)cc1] |
| ii-21 | 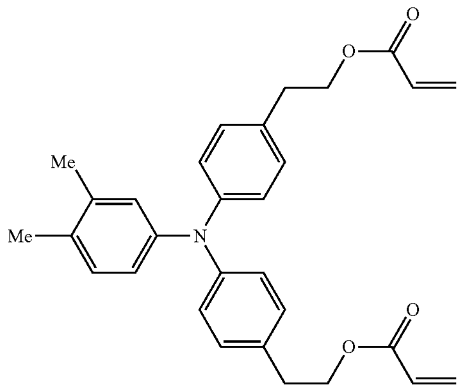 [SMILES: C=CC(=O)OCCc1ccc(N(c2ccc(CCOC(=O)C=C)cc2)c2ccc(C)c(C)c2)cc1] |
| ii-22 | 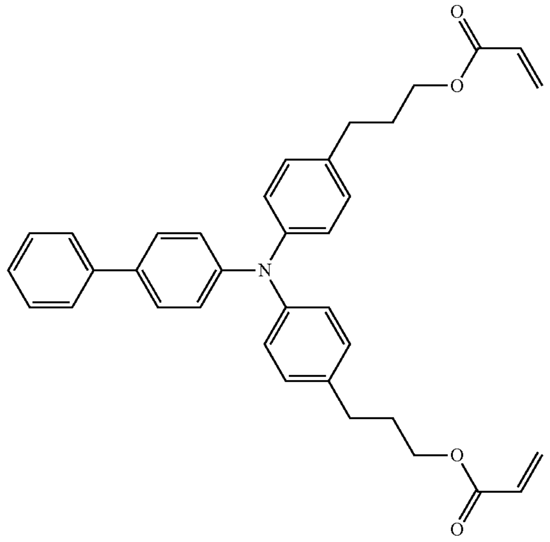 [SMILES: C=CC(=O)OCCCc1ccc(N(c2ccc(CCCOC(=O)C=C)cc2)c2ccc(-c3ccccc3)cc2)cc1] |

-continued
| No. | |
|---|---|
| ii-23 | 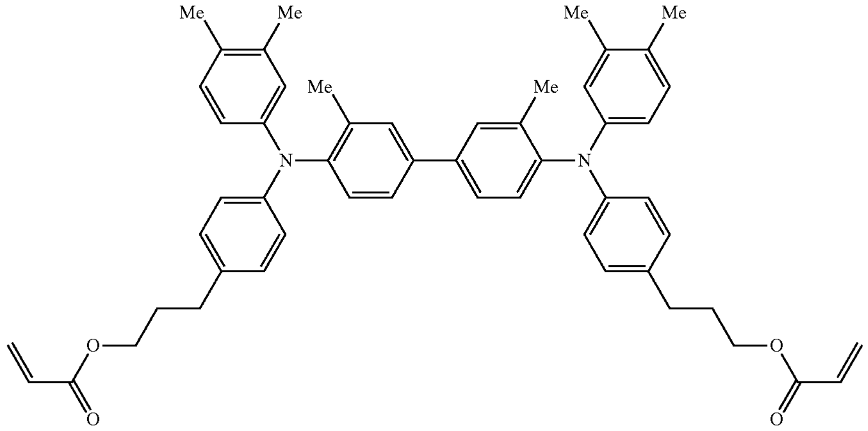 [SMILES: C=CC(=O)OCCCc1ccc(N(c2ccc(C)c(C)c2)c2ccc(-c3ccc(N(c4ccc(CCCOC(=O)C=C)cc4)c4ccc(C)c(C)c4)c(C)c3)cc2C)cc1] |
| ii-24 | 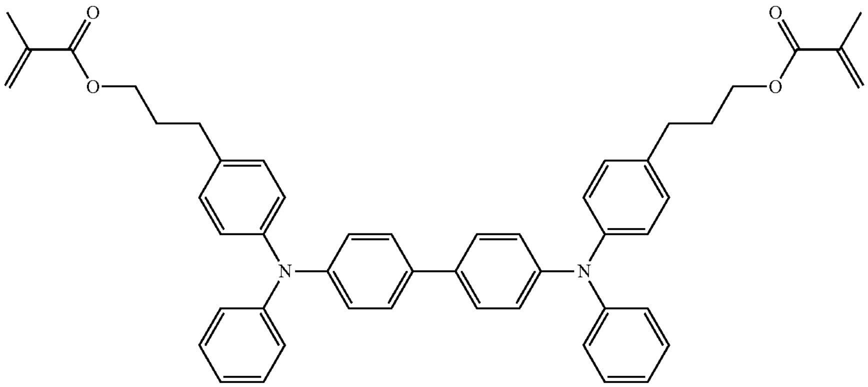 [SMILES: C=C(C)C(=O)OCCCc1ccc(N(c2ccccc2)c2ccc(-c3ccc(N(c4ccccc4)c4ccc(CCCOC(=O)C(=C)C)cc4)cc3)cc2)cc1] |
| ii-25 | 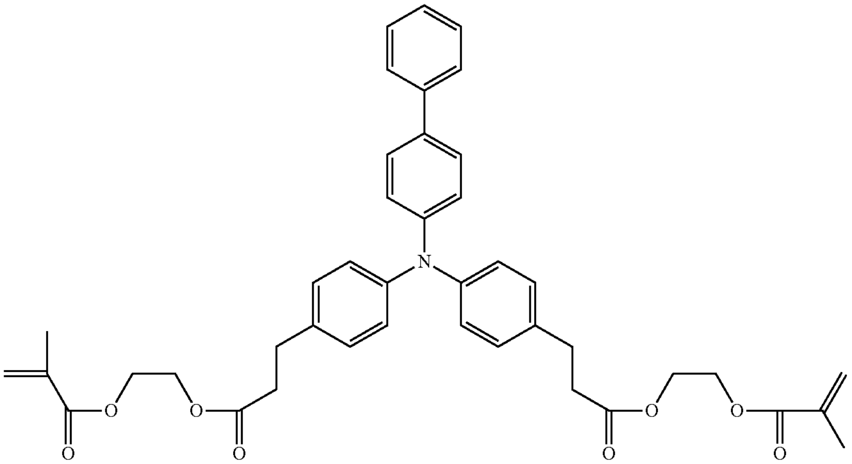 [SMILES: C=C(C)C(=O)OCCOC(=O)CCc1ccc(N(c2ccc(CCC(=O)OCCOC(=O)C(=C)C)cc2)c2ccc(-c3ccccc3)cc2)cc1] |
| ii-26 | 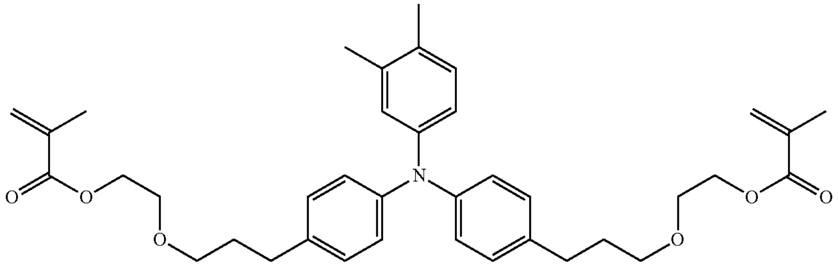 [SMILES: C=C(C)C(=O)OCCOCCCc1ccc(N(c2ccc(CCCOCCOC(=O)C(=C)C)cc2)c2ccc(C)c(C)c2)cc1] |

Hereinbelow, specific examples (compounds iii-1 to iii-11) of the compound represented by Formula (I) in which n represents 3 are shown, but the invention is not limited to these examples.
| No. | |
|---|---|
| iii-1 | 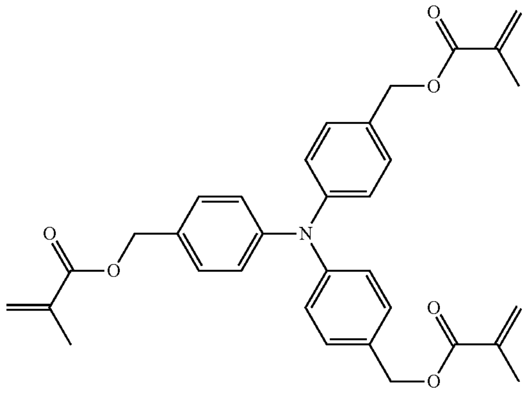 [SMILES: C=C(C)C(=O)OCc1ccc(N(c2ccc(COC(=O)C(=C)C)cc2)c2ccc(COC(=O)C(=C)C)cc2)cc1] |
| iii-2 | 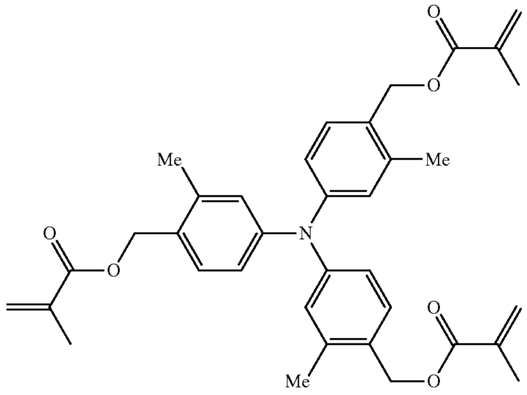 [SMILES: C=C(C)C(=O)OCc1ccc(N(c2ccc(COC(=O)C(=C)C)c(C)c2)c2ccc(COC(=O)C(=C)C)c(C)c2)cc1C] |
| iii-3 | 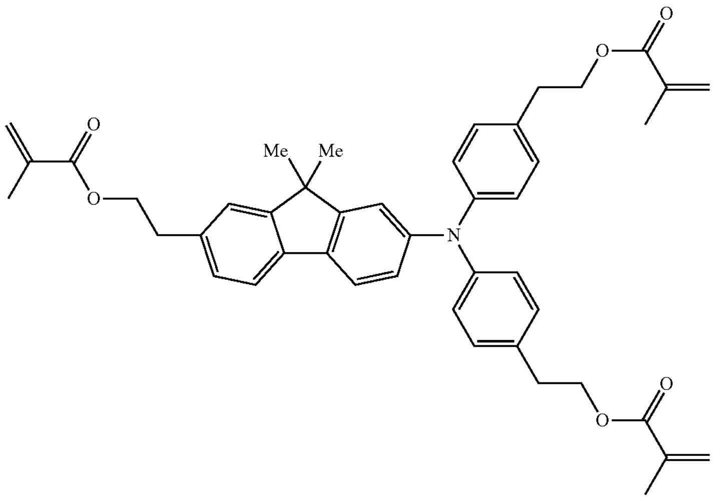 [SMILES: C=C(C)C(=O)OCCc1ccc(N(c2ccc(CCOC(=O)C(=C)C)cc2)c2ccc3c(c2)C(C)(C)c2cc(CCOC(=O)C(=C)C)ccc2-3)cc1] |

-continued
| No. | |
|---|---|
| iii-4 | 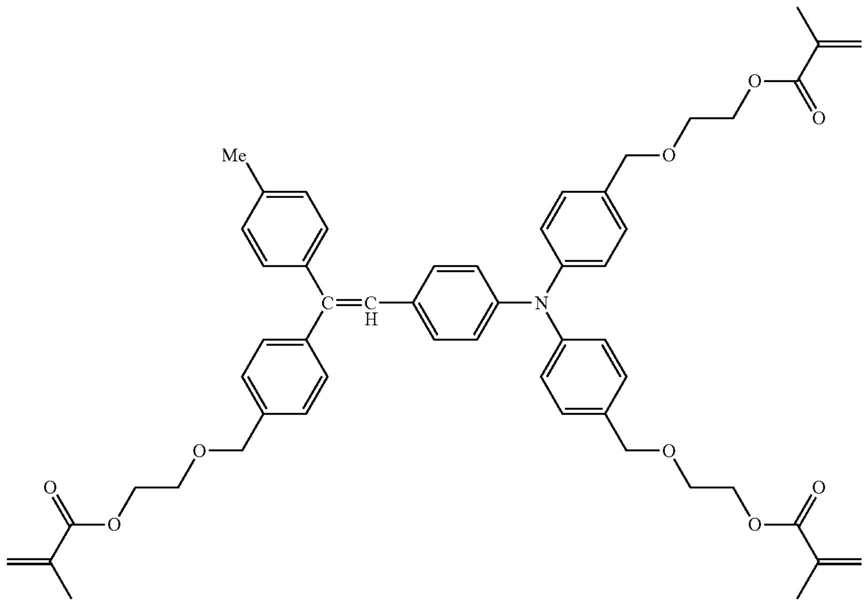 [SMILES: C=C(C)C(=O)OCCOCc1ccc(C(=Cc2ccc(N(c3ccc(COCCOC(=O)C(=C)C)cc3)c3ccc(COCCOC(=O)C(=C)C)cc3)cc2)c2ccc(C)cc2)cc1] |
| iii-5 | 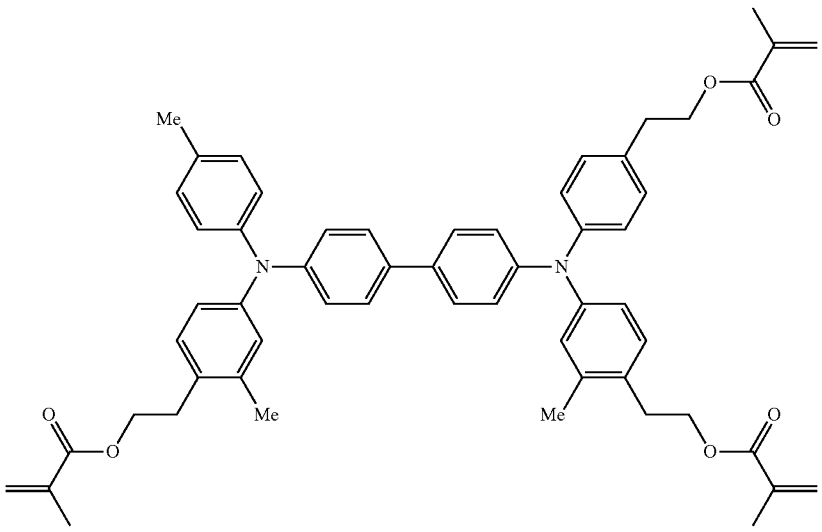 [SMILES: C=C(C)C(=O)OCCc1ccc(N(c2ccc(-c3ccc(N(c4ccc(C)cc4)c4ccc(CCOC(=O)C(=C)C)c(C)c4)cc3)cc2)c2ccc(CCOC(=O)C(=C)C)c(C)c2)cc1] |

-continued
| No. | |
|---|---|
| iii-6 | 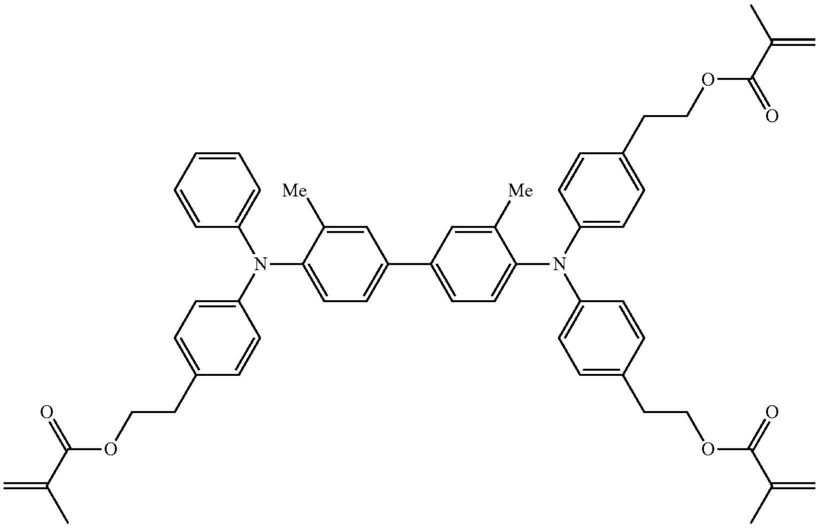 [SMILES: C=C(C)C(=O)OCCc1ccc(N(c2ccccc2)c2ccc(-c3ccc(N(c4ccc(CCOC(=O)C(=C)C)cc4)c4ccc(CCOC(=O)C(=C)C)cc4)c(C)c3)cc2C)cc1] |
| iii-7 | 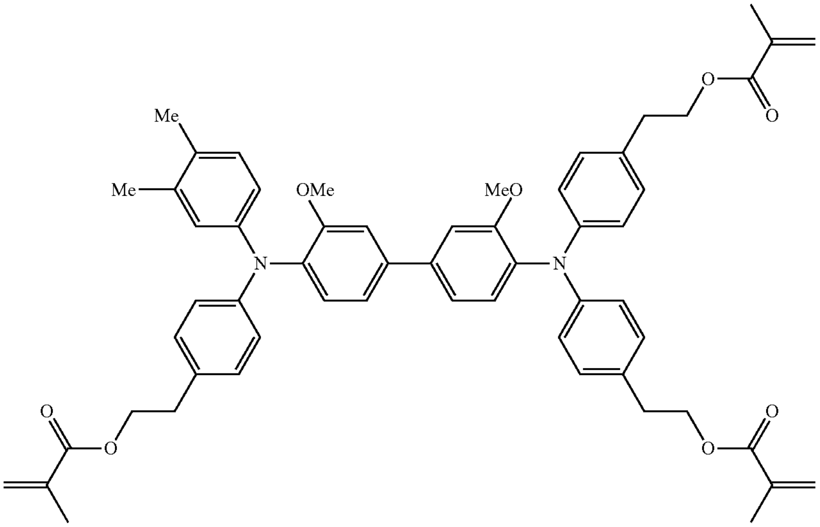 [SMILES: C=C(C)C(=O)OCCc1ccc(N(c2ccc(CCOC(=O)C(=C)C)cc2)c2ccc(-c3ccc(N(c4ccc(CCOC(=O)C(=C)C)cc4)c4ccc(C)c(C)c4)c(OC)c3)cc2OC)cc1] |
| iii-8 | 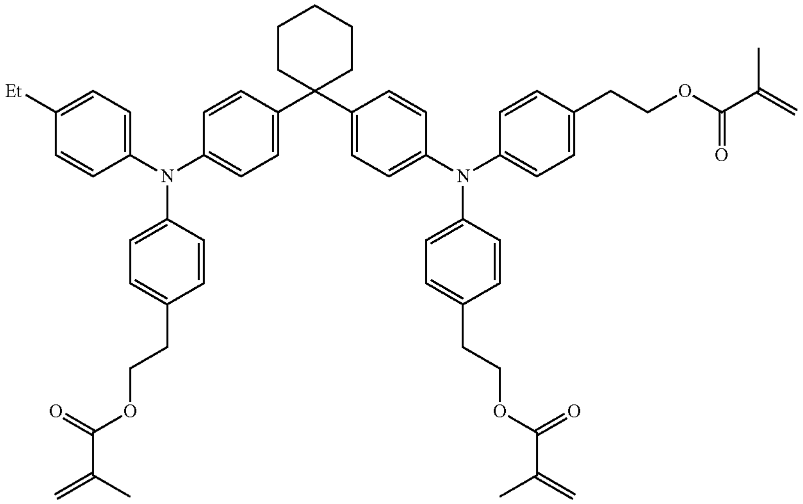 [SMILES: C=C(C)C(=O)OCCc1ccc(N(c2ccc(CC)cc2)c2ccc(C3(c4ccc(N(c5ccc(CCOC(=O)C(=C)C)cc5)c5ccc(CCOC(=O)C(=C)C)cc5)cc4)CCCCC3)cc2)cc1] |

-continued
No.
iii-9
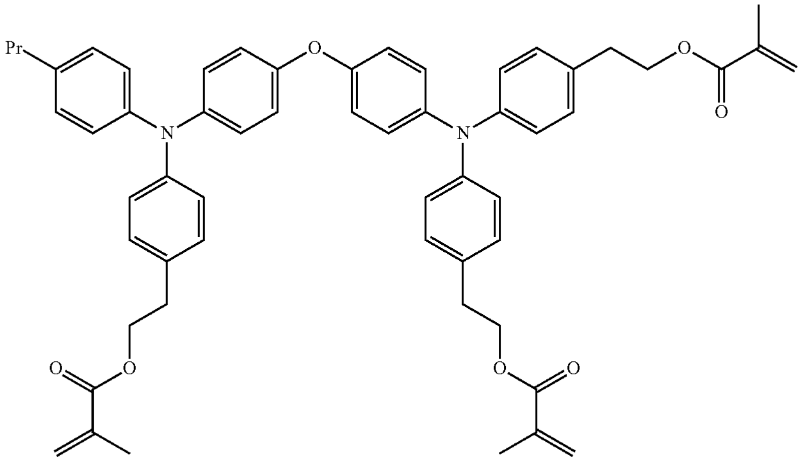
iii-10
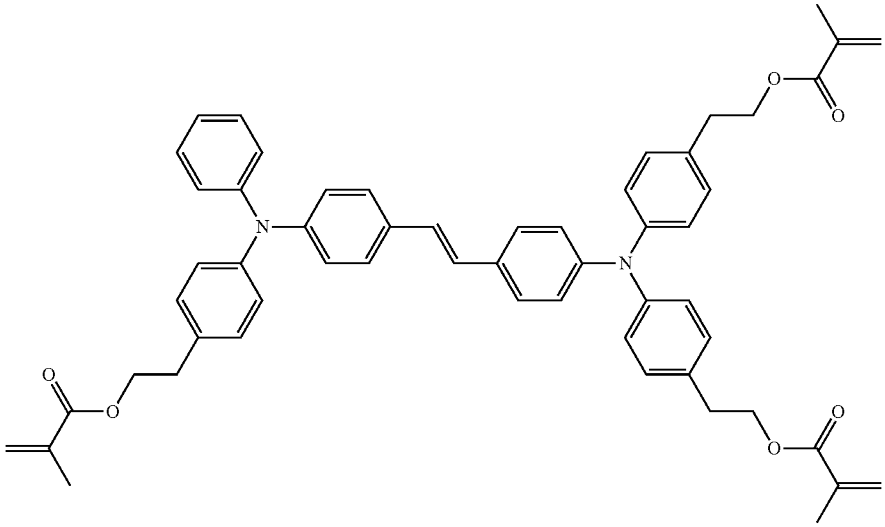 [SMILES: C=C(C)C(=O)OCCc1ccc(N(c2ccccc2)c2ccc(/C=C/c3ccc(N(c4ccc(CCOC(=O)C(=C)C)cc4)c4ccc(CCOC(=O)C(=C)C)cc4)cc3)cc2)cc1]
iii-11
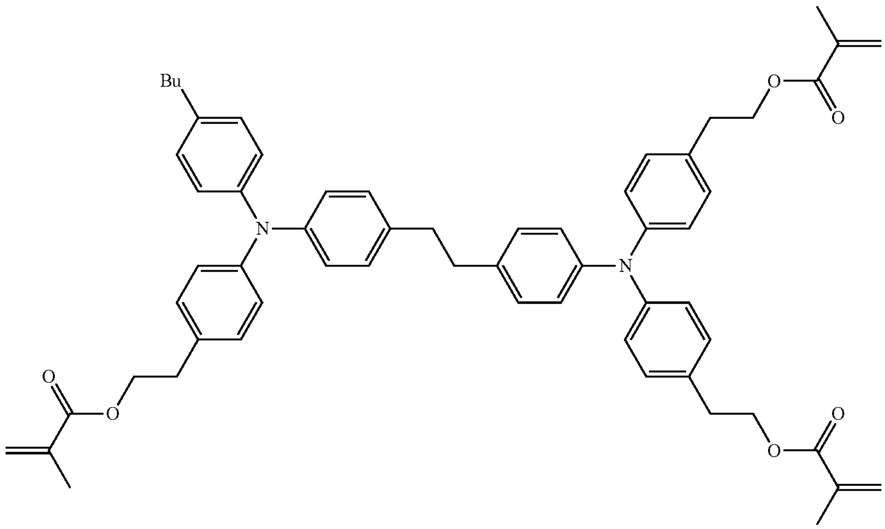

Hereinbelow, specific examples (compounds iv-1 to iv-18) of the compound represented by Formula (I) in which n represents 4, a specific example (compound v-1) of the compound represented by Formula (I) in which n represents 5 is shown, and specific examples (compounds vi-1 and vi-2) of the compound represented by Formula (I) in which n represents 6, but the invention is not limited to these examples.

| No. | |
|---|---|
| iv-1 | 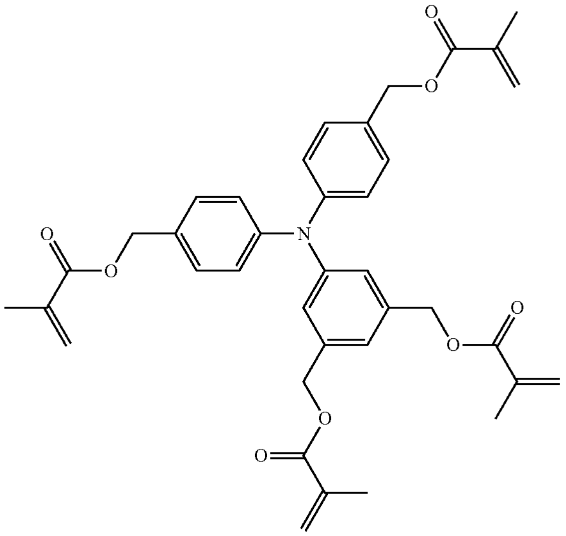 [SMILES: C=C(C)C(=O)OCc1ccc(N(c2ccc(COC(=O)C(=C)C)cc2)c2cc(COC(=O)C(=C)C)cc(COC(=O)C(=C)C)c2)cc1] |
| iv-2 | 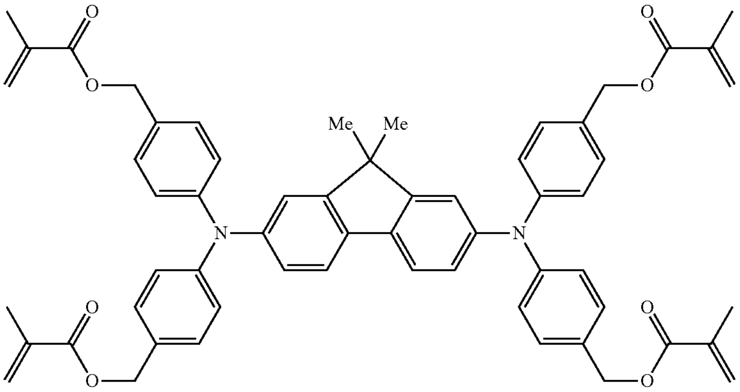 [SMILES: C=C(C)C(=O)OCc1ccc(N(c2ccc(COC(=O)C(=C)C)cc2)c2ccc3c(c2)C(C)(C)c2cc(N(c4ccc(COC(=O)C(=C)C)cc4)c4ccc(COC(=O)C(=C)C)cc4)ccc2-3)cc1] |
| iv-3 | 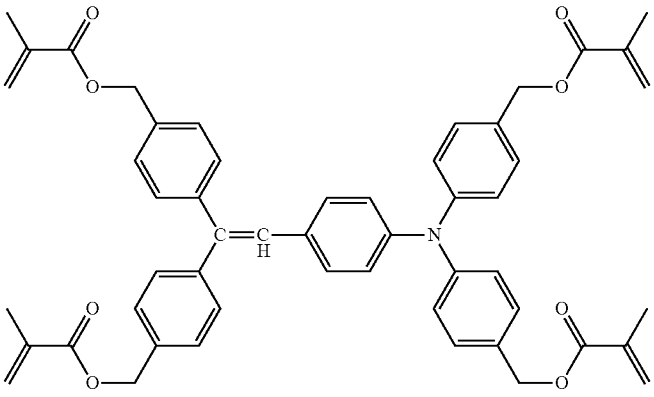 [SMILES: C=C(C)C(=O)OCc1ccc(C(=Cc2ccc(N(c3ccc(COC(=O)C(=C)C)cc3)c3ccc(COC(=O)C(=C)C)cc3)cc2)c2ccc(COC(=O)C(=C)C)cc2)cc1] |

-continued
| No. | |
|---|---|
| iv-4 | 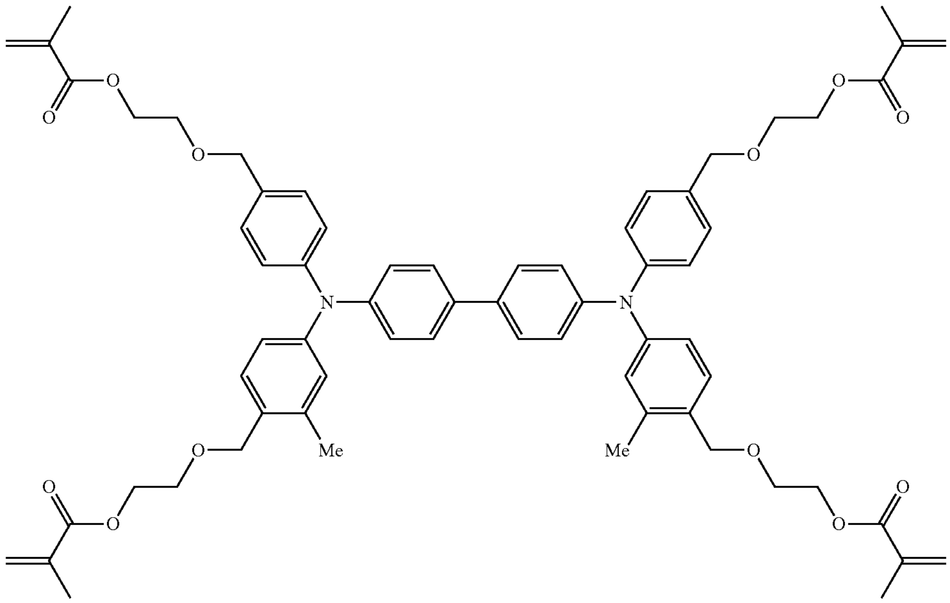 [SMILES: C=C(C)C(=O)OCCOCc1ccc(N(c2ccc(-c3ccc(N(c4ccc(COCCOC(=O)C(=C)C)cc4)c4ccc(COCCOC(=O)C(=C)C)c(C)c4)cc3)cc2)c2ccc(COCCOC(=O)C(=C)C)c(C)c2)cc1] |
| iv-5 | 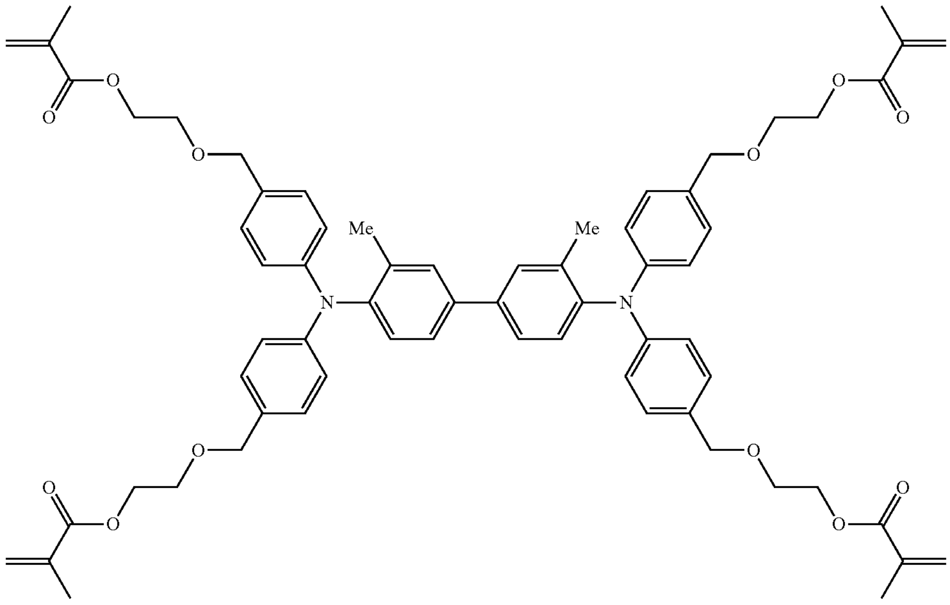 [SMILES: C=C(C)C(=O)OCCOCc1ccc(N(c2ccc(COCCOC(=O)C(=C)C)cc2)c2ccc(-c3ccc(N(c4ccc(COCCOC(=O)C(=C)C)cc4)c4ccc(COCCOC(=O)C(=C)C)cc4)c(C)c3)cc2C)cc1] |

-continued
| No. | |
|---|---|
| iv-6 | 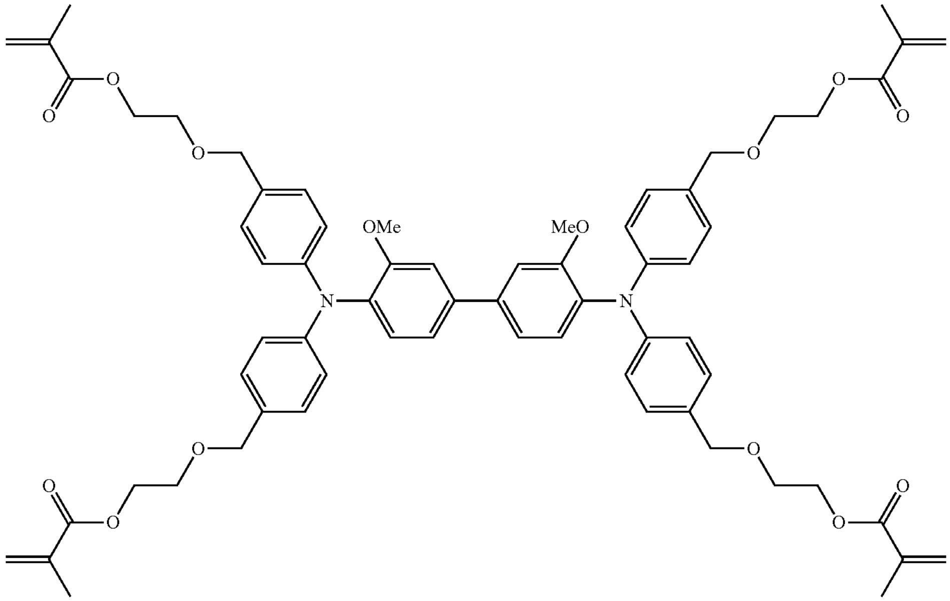 [SMILES: C=C(C)C(=O)OCCOCc1ccc(N(c2ccc(COCCOC(=O)C(=C)C)cc2)c2ccc(-c3ccc(N(c4ccc(COCCOC(=O)C(=C)C)cc4)c4ccc(COCCOC(=O)C(=C)C)cc4)c(OC)c3)cc2OC)cc1] |
| iv-7 | 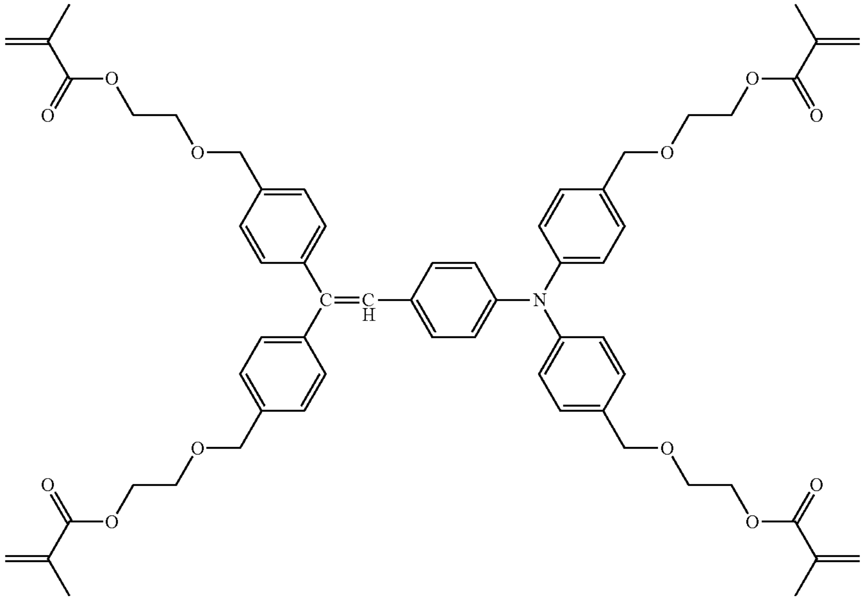 [SMILES: C=C(C)C(=O)OCCOCc1ccc(C(=Cc2ccc(N(c3ccc(COCCOC(=O)C(=C)C)cc3)c3ccc(COCCOC(=O)C(=C)C)cc3)cc2)c2ccc(COCCOC(=O)C(=C)C)cc2)cc1] |

-continued
| No. | |
|---|---|
| iv-8 | 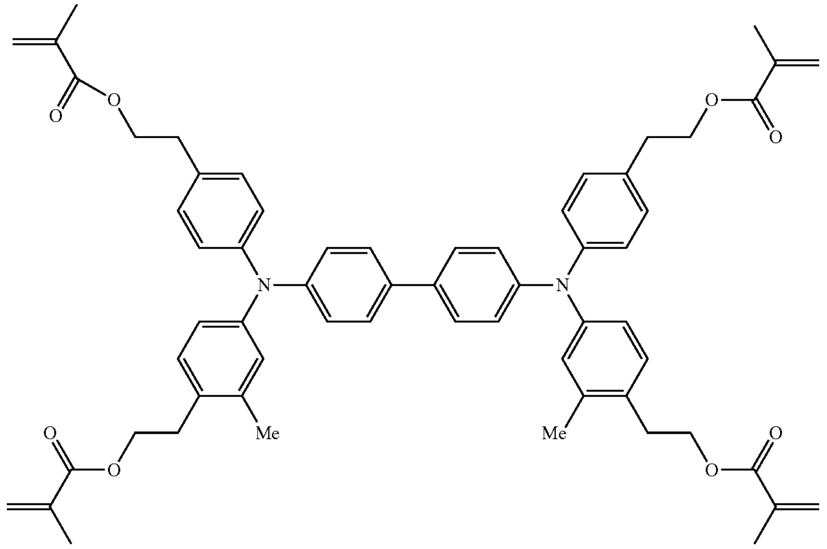 [SMILES: C=C(C)C(=O)OCCc1ccc(N(c2ccc(-c3ccc(N(c4ccc(CCOC(=O)C(=C)C)cc4)c4ccc(CCOC(=O)C(=C)C)c(C)c4)cc3)cc2)c2ccc(CCOC(=O)C(=C)C)c(C)c2)cc1] |
| iv-9 | 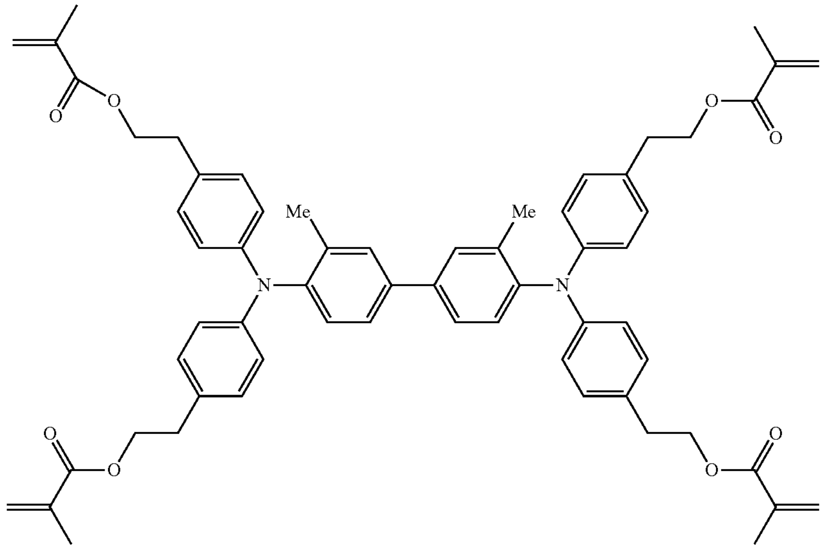 [SMILES: C=C(C)C(=O)OCCc1ccc(N(c2ccc(CCOC(=O)C(=C)C)cc2)c2ccc(-c3ccc(N(c4ccc(CCOC(=O)C(=C)C)cc4)c4ccc(CCOC(=O)C(=C)C)cc4)c(C)c3)cc2C)cc1] |

-continued
| No. |
| --- |
| iv-10 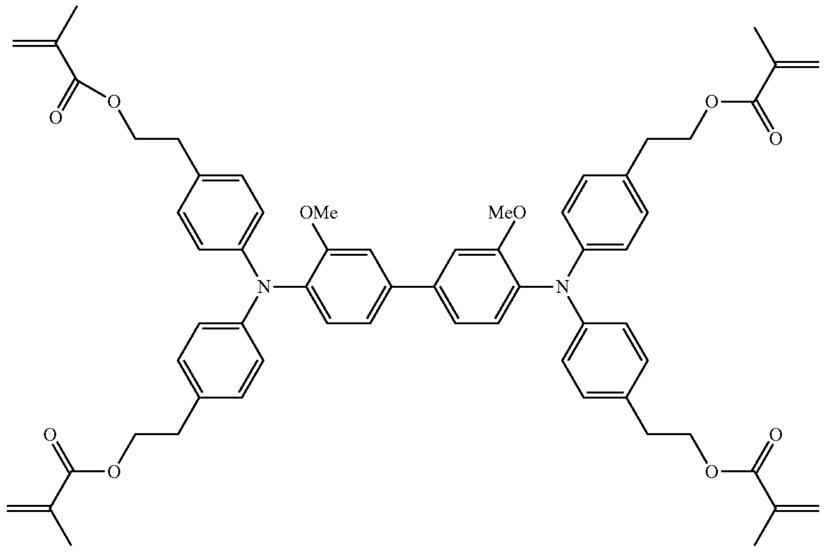 [SMILES: C=C(C)C(=O)OCCc1ccc(N(c2ccc(CCOC(=O)C(=C)C)cc2)c2ccc(-c3ccc(N(c4ccc(CCOC(=O)C(=C)C)cc4)c4ccc(CCOC(=O)C(=C)C)cc4)c(OC)c3)cc2OC)cc1] |
| iv-11 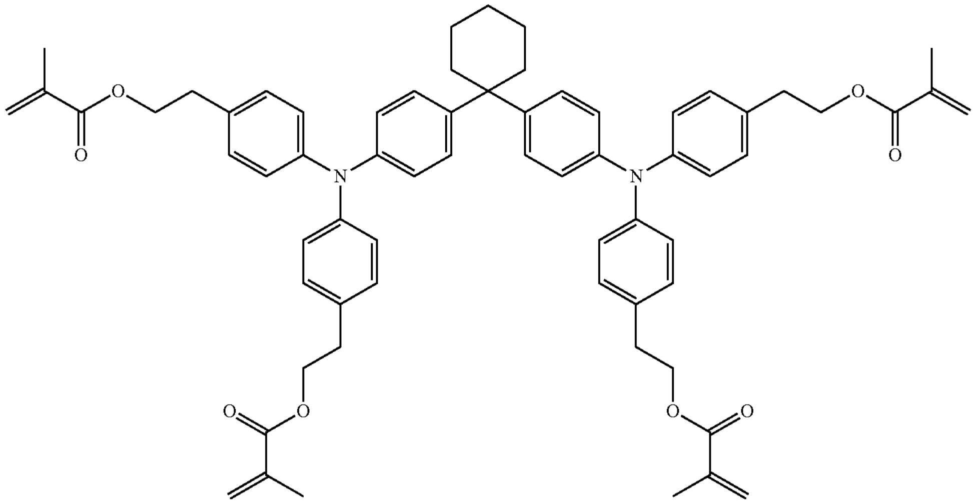 [SMILES: C=C(C)C(=O)OCCc1ccc(N(c2ccc(CCOC(=O)C(=C)C)cc2)c2ccc(C3(c4ccc(N(c5ccc(CCOC(=O)C(=C)C)cc5)c5ccc(CCOC(=O)C(=C)C)cc5)cc4)CCCCC3)cc2)cc1] |
| iv-12 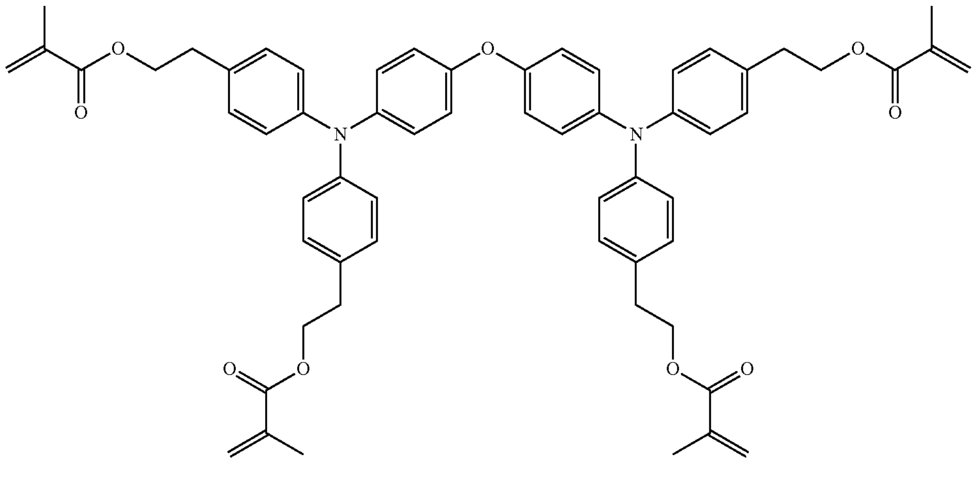 [SMILES: C=C(C)C(=O)OCCc1ccc(N(c2ccc(CCOC(=O)C(=C)C)cc2)c2ccc(Oc3ccc(N(c4ccc(CCOC(=O)C(=C)C)cc4)c4ccc(CCOC(=O)C(=C)C)cc4)cc3)cc2)cc1] |

-continued
| No. | |
|---|---|
| iv-13 | 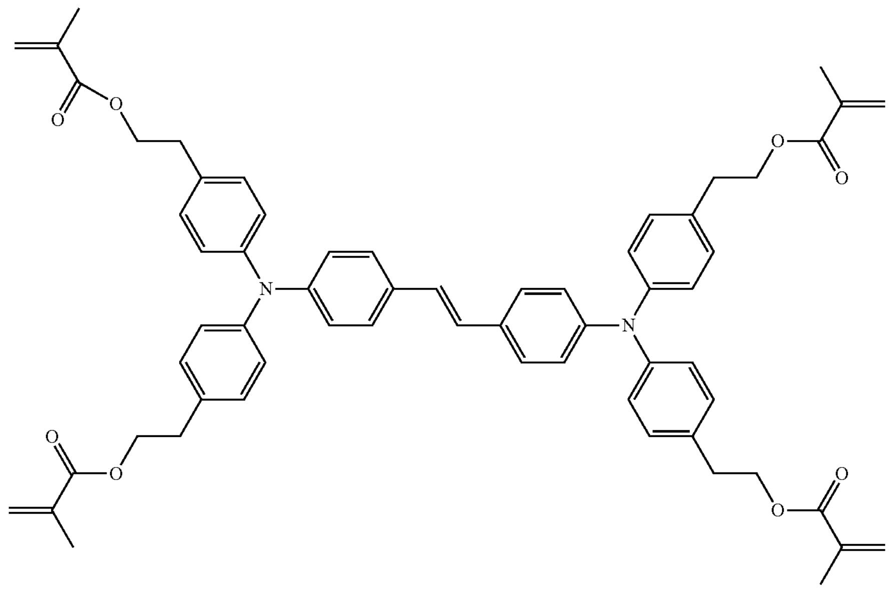 [SMILES: C=C(C)C(=O)OCCc1ccc(N(c2ccc(/C=C/c3ccc(N(c4ccc(CCOC(=O)C(=C)C)cc4)c4ccc(CCOC(=O)C(=C)C)cc4)cc3)cc2)c2ccc(CCOC(=O)C(=C)C)cc2)cc1] |
| iv-14 | 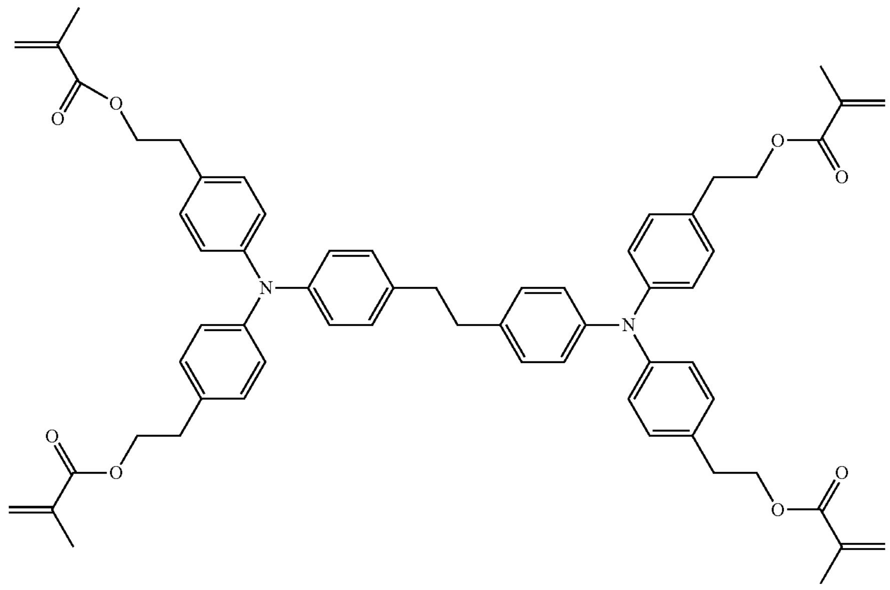 [SMILES: C=C(C)C(=O)OCCc1ccc(N(c2ccc(CCOC(=O)C(=C)C)cc2)c2ccc(CCc3ccc(N(c4ccc(CCOC(=O)C(=C)C)cc4)c4ccc(CCOC(=O)C(=C)C)cc4)cc3)cc2)cc1] |

-continued
| No. | |
|---|---|
| iv-15 | 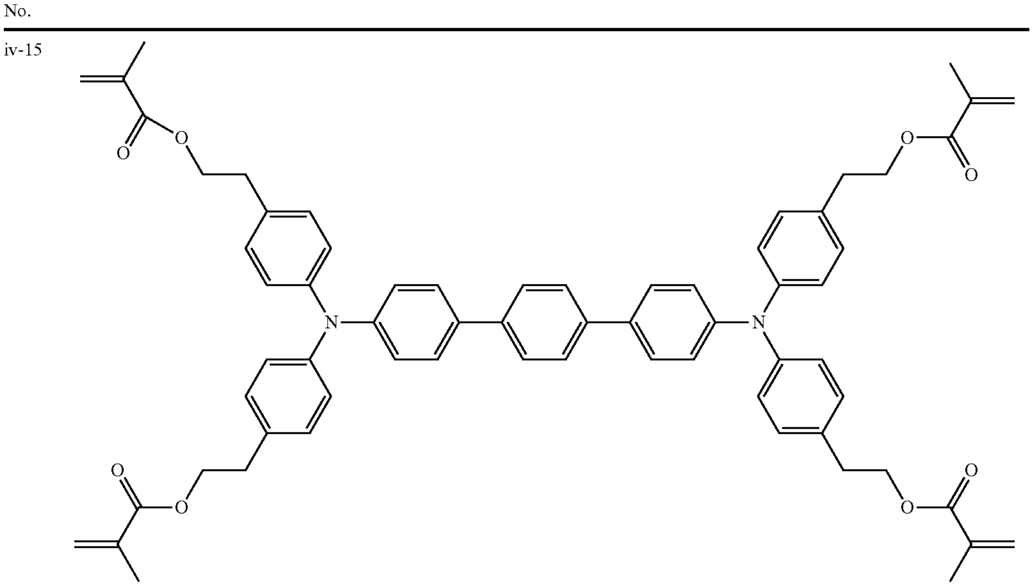 |
| iv-16 | 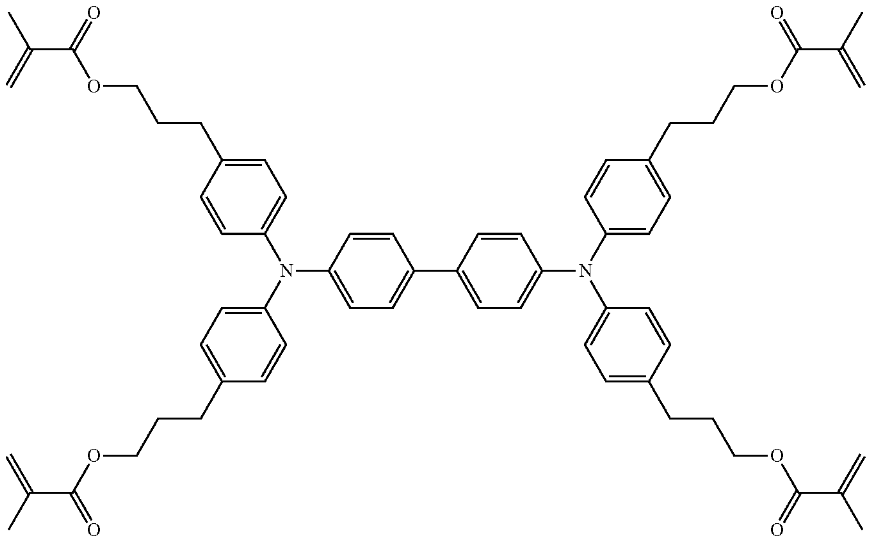 [SMILES: C=C(C)C(=O)OCCCc1ccc(N(c2ccc(CCCOC(=O)C(=C)C)cc2)c2ccc(-c3ccc(N(c4ccc(CCCOC(=O)C(=C)C)cc4)c4ccc(CCCOC(=O)C(=C)C)cc4)cc3)cc2)cc1] |
| iv-17 | 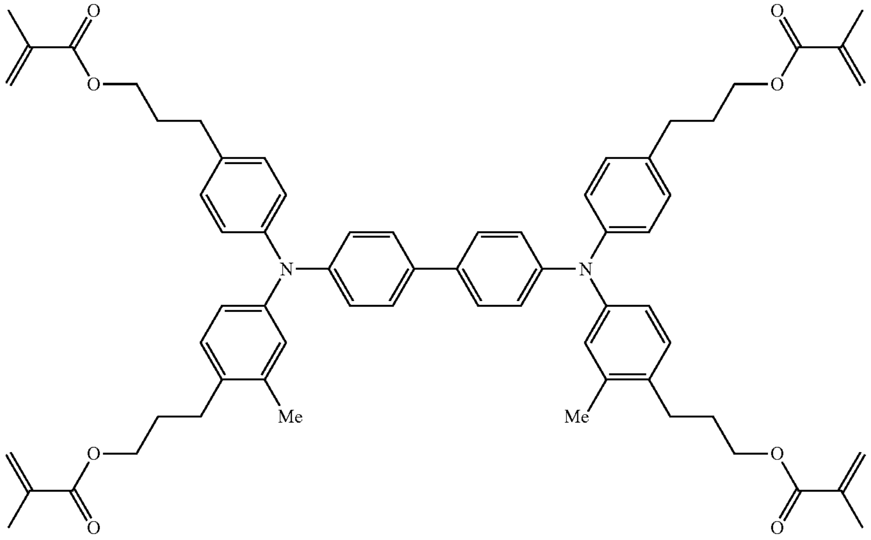 [SMILES: C=C(C)C(=O)OCCCc1ccc(N(c2ccc(-c3ccc(N(c4ccc(CCCOC(=O)C(=C)C)cc4)c4ccc(CCCOC(=O)C(=C)C)c(C)c4)cc3)cc2)c2ccc(CCCOC(=O)C(=C)C)c(C)c2)cc1] |

-continued
| No. |
| --- |
iv-18
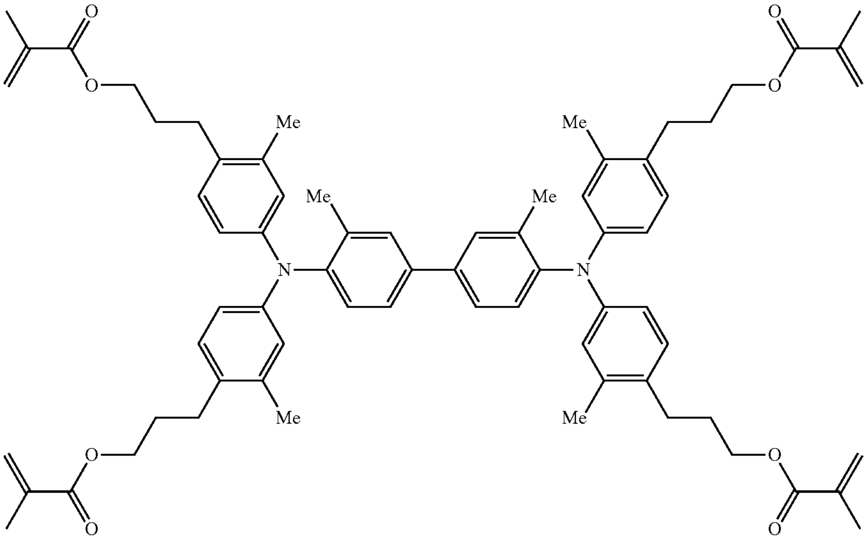 [SMILES: C=C(C)C(=O)OCCCc1ccc(N(c2ccc(CCCOC(=O)C(=C)C)c(C)c2)c2ccc(-c3ccc(N(c4ccc(CCCOC(=O)C(=C)C)c(C)c4)c4ccc(CCCOC(=O)C(=C)C)c(C)c4)c(C)c3)cc2C)cc1C]
v-1
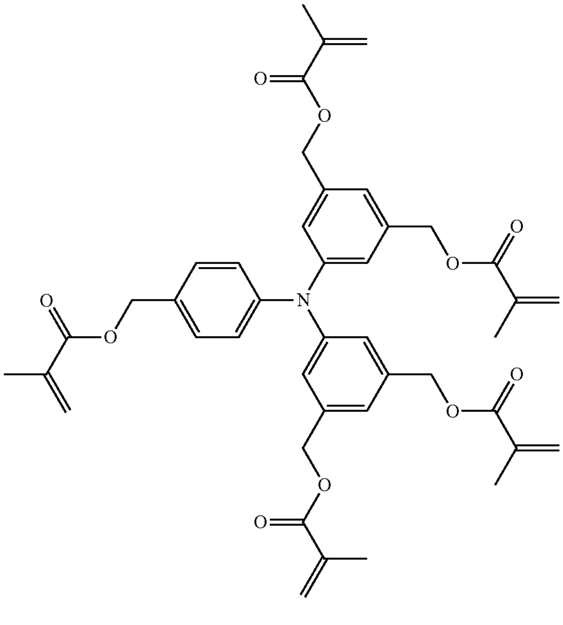 [SMILES: C=C(C)C(=O)OCc1ccc(N(c2cc(COC(=O)C(=C)C)cc(COC(=O)C(=C)C)c2)c2cc(COC(=O)C(=C)C)cc(COC(=O)C(=C)C)c2)cc1]

-continued
| No. | |
|---|---|
| vi-1 | 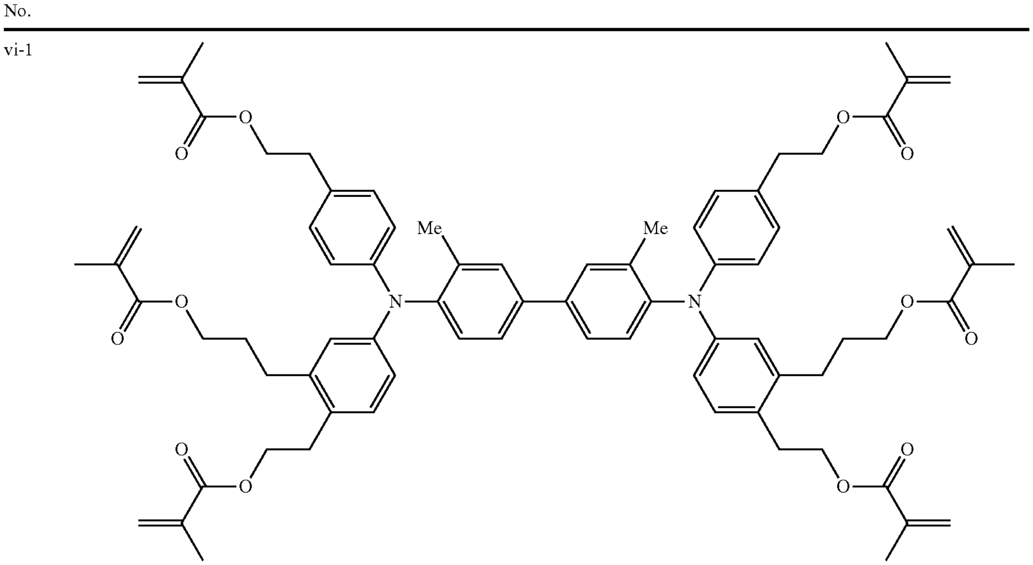 |
| vi-2 | 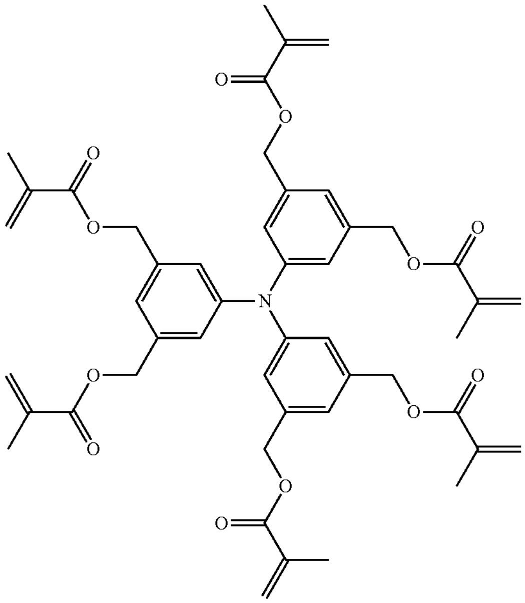 [SMILES: C=C(C)C(=O)OCc1cc(COC(=O)C(=C)C)cc(N(c2cc(COC(=O)C(=C)C)cc(COC(=O)C(=C)C)c2)c2cc(COC(=O)C(=C)C)cc(COC(=O)C(=C)C)c2)c1] |
Hereinafter, as an example, the synthesis pathway of compound iv-4 and the synthesis pathway of compound iv-17 is shown.
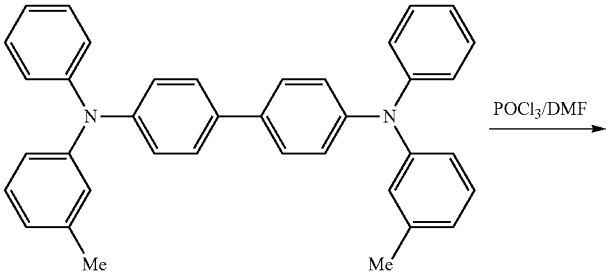

-continued
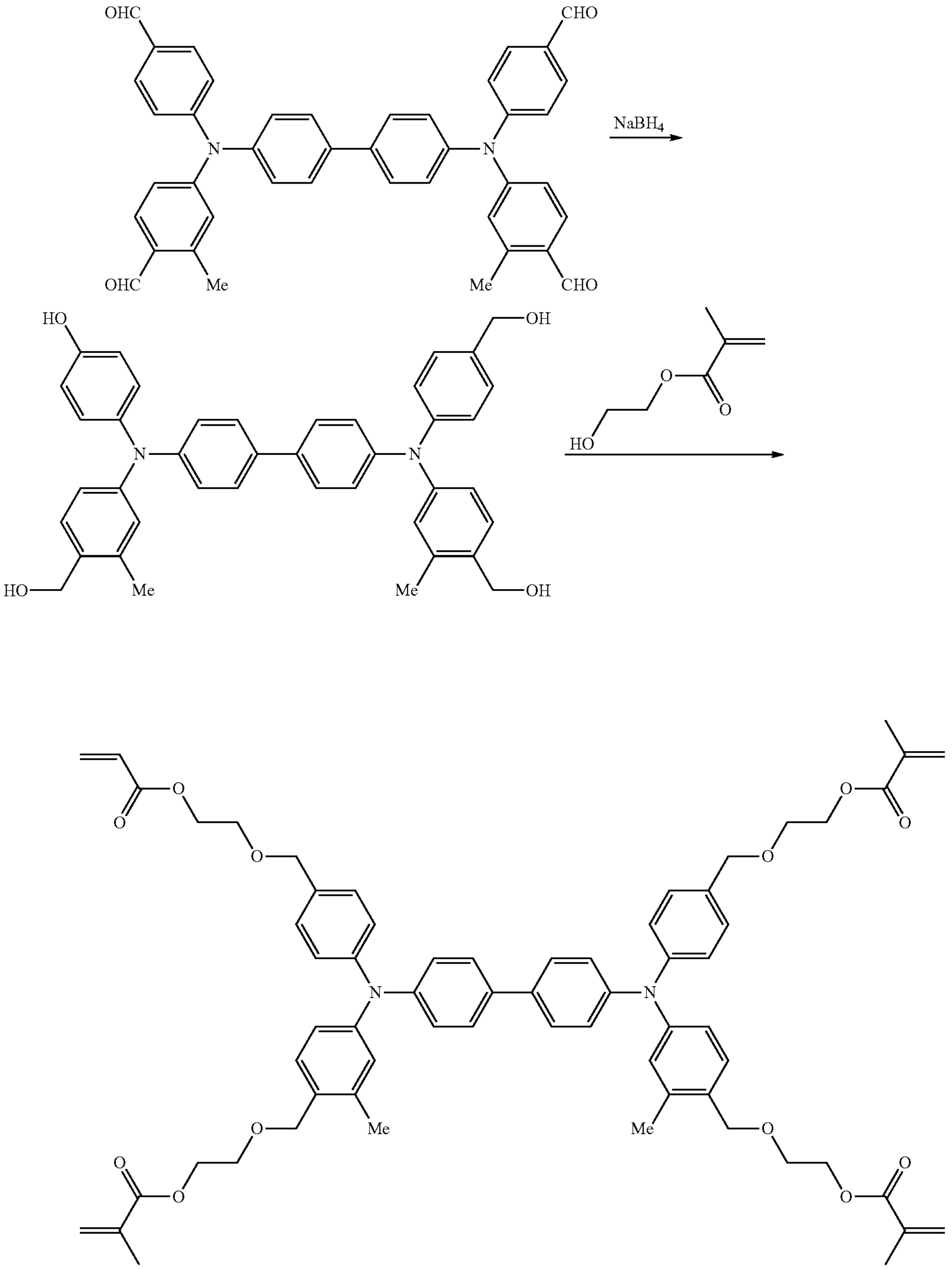
Compound iv-4
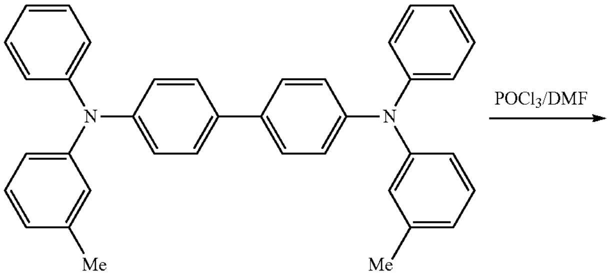

-continued
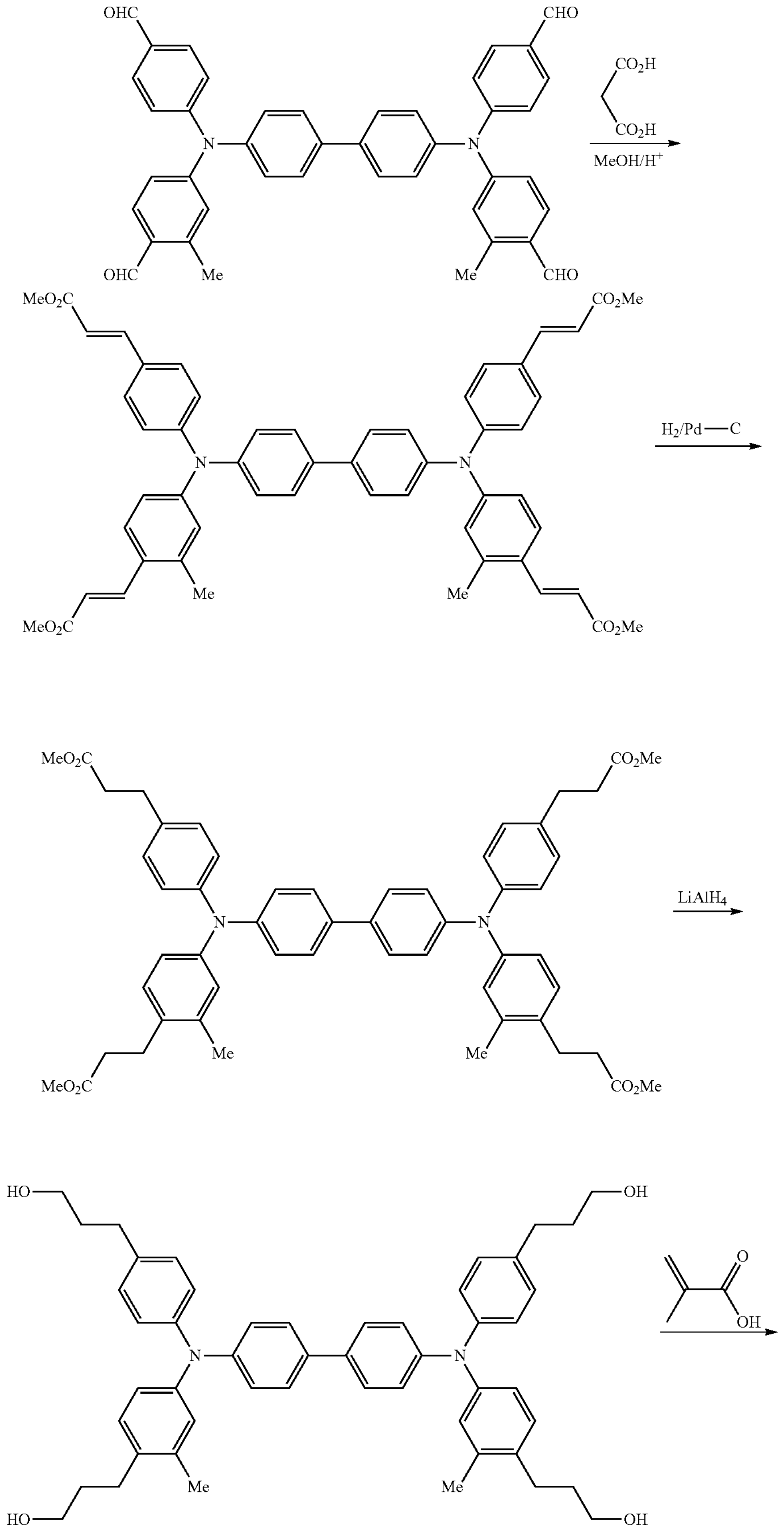

-continued

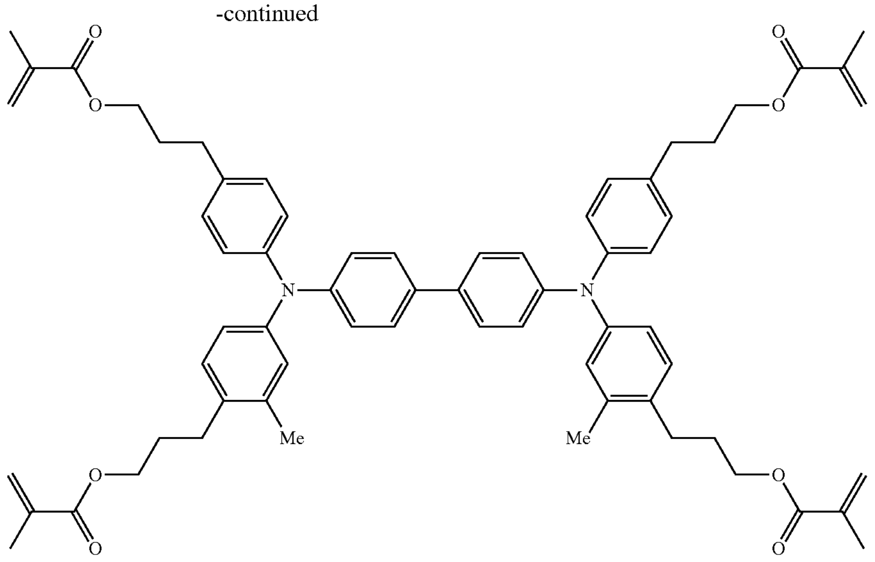

Compound iv-17

Other compounds represented by Formula (I) can be similarly synthesized through the synthesis pathways of compounds iv-4 and iv-17.

In the exemplary embodiment of the invention, the compound represented by Formula (I) is preferably a compound represented by Formula (I) in which n represents 2 or more, and more preferably a compound represented by Formula (I) in which n represents 4 or more.

The compound represented by Formula (I) in which n represents 4 or more, and a compound represented by Formula (I) in which n represents an integer of from 1 to 3 may be used in combination. When these compounds are used in combination, the mechanical strength of a cured film may be controlled without impairing charge transportability.

When a compound represented by Formula (I) in which n represents 4 or more and a compound represented by Formula (I) in which n represents an integer of from 1 to 3 are used in combination, the content of the compound represented by Formula (I) in which n represents 4 or more is preferably contained 5% by weight or and more, and more preferably 20% by weight or more, with respect to the total content of the compound represented by Formula (I).

Hereinbelow, examples of the charge transporting material having a chain polymerizable functional group other than the compound represented by Formula (I) is described. However, the invention is not limited to these examples.

| No. | |
|---|---|
| i-15 | 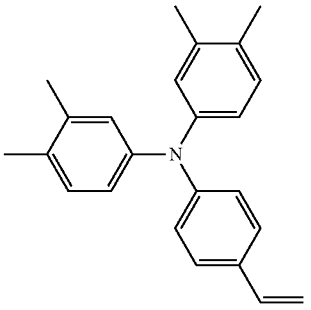 [SMILES: C=Cc1ccc(N(c2ccc(C)c(C)c2)c2ccc(C)c(C)c2)cc1] |
| i-16 | 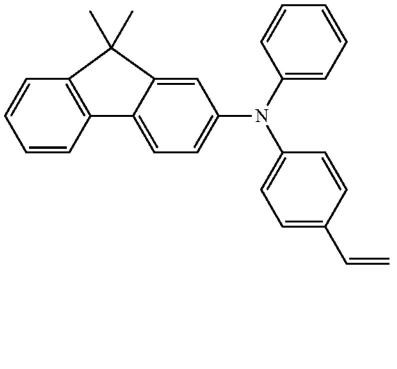 [SMILES: C=Cc1ccc(N(c2ccccc2)c2ccc3c(c2)C(C)(C)c2ccccc2-3)cc1] |

-continued
| No. | |
|---|---|
| i-17 | 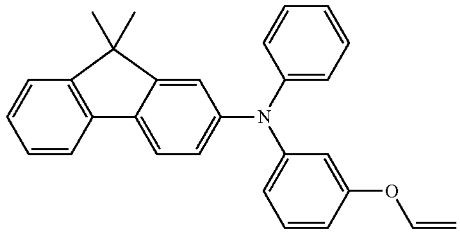 [SMILES: C=COc1cccc(N(c2ccccc2)c2ccc3c(c2)C(C)(C)c2ccccc2-3)c1] |
| i-18 | 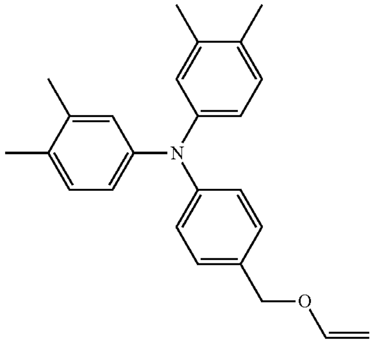 [SMILES: C=COCc1ccc(N(c2ccc(C)c(C)c2)c2ccc(C)c(C)c2)cc1] |
| i-19 | 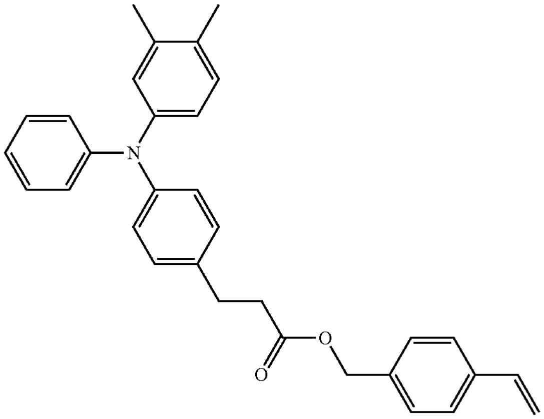 [SMILES: C=Cc1ccc(COC(=O)CCc2ccc(N(c3ccccc3)c3ccc(C)c(C)c3)cc2)cc1] |
| i-20 | 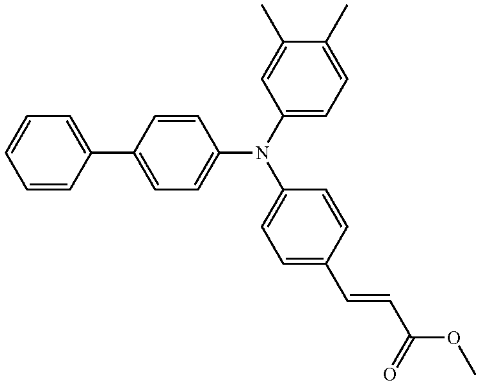 [SMILES: COC(=O)/C=C/c1ccc(N(c2ccc(-c3ccccc3)cc2)c2ccc(C)c(C)c2)cc1] |

-continued
| No. | |
|---|---|
| i-21 | 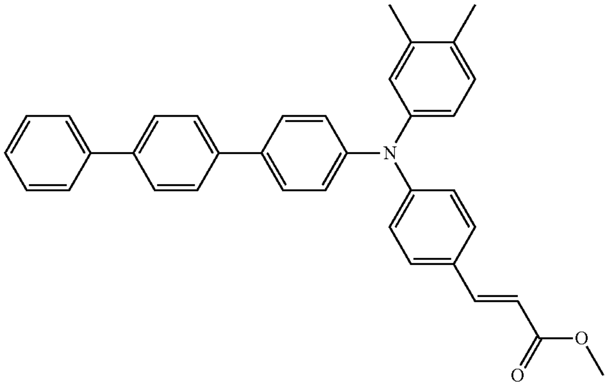 [SMILES: COC(=O)/C=C/c1ccc(N(c2ccc(-c3ccc(-c4ccccc4)cc3)cc2)c2ccc(C)c(C)c2)cc1] |
| i-22 | 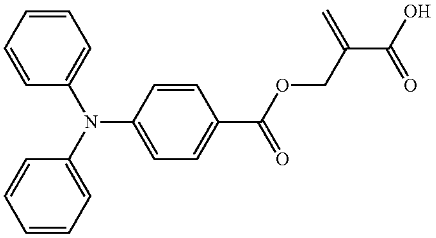 [SMILES: C=C(COC(=O)c1ccc(N(c2ccccc2)c2ccccc2)cc1)C(=O)O] |
| i-23 | 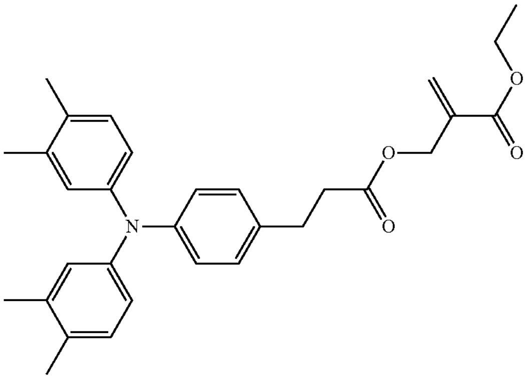 [SMILES: C=C(COC(=O)CCc1ccc(N(c2ccc(C)c(C)c2)c2ccc(C)c(C)c2)cc1)C(=O)OCC] |
| i-24 | 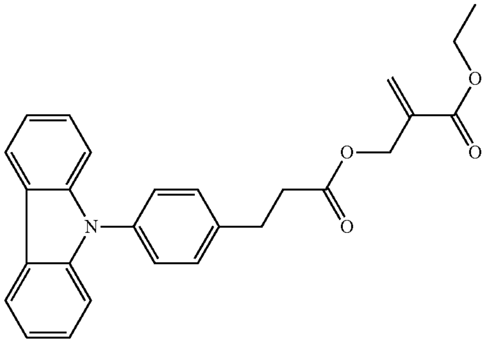 [SMILES: C=C(COC(=O)CCc1ccc(-n2c3ccccc3c3ccccc32)cc1)C(=O)OCC] |

-continued
| No. | |
|---|---|
| i-25 | 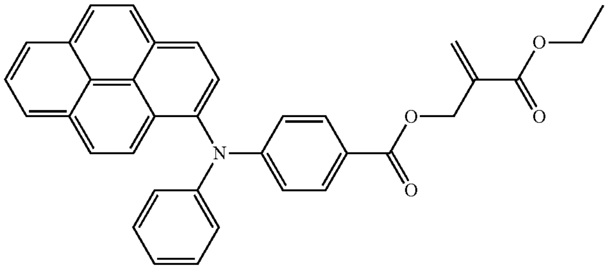 |
| ii-27 | 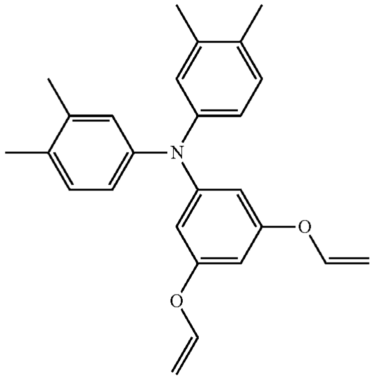 [SMILES: C=COc1cc(OC=C)cc(N(c2ccc(C)c(C)c2)c2ccc(C)c(C)c2)c1] |
| ii-28 | 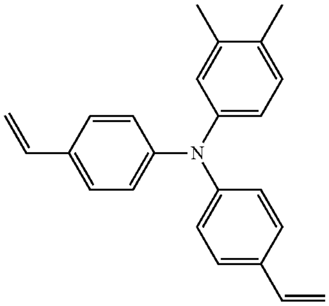 [SMILES: C=Cc1ccc(N(c2ccc(C=C)cc2)c2ccc(C)c(C)c2)cc1] |
| ii-29 | 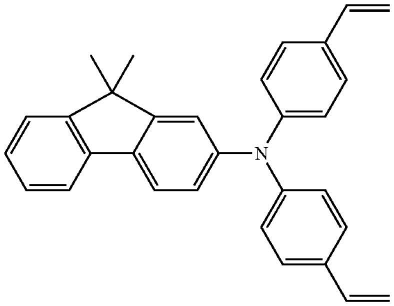 [SMILES: C=Cc1ccc(N(c2ccc(C=C)cc2)c2ccc3c(c2)C(C)(C)c2ccccc2-3)cc1] |
| ii-30 | 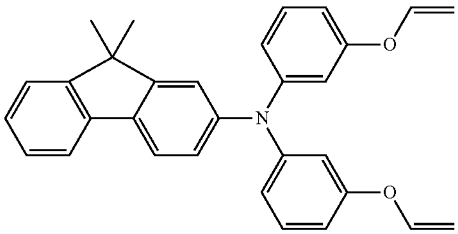 [SMILES: C=COc1cccc(N(c2cccc(OC=C)c2)c2ccc3c(c2)C(C)(C)c2ccccc2-3)c1] |

-continued
| No. | |
|---|---|
| ii-31 | 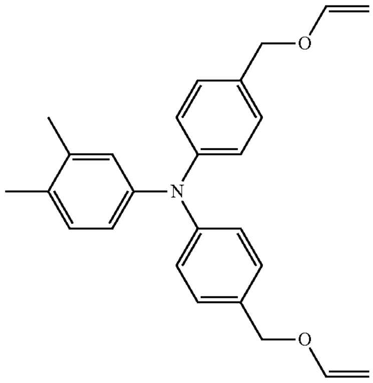 [SMILES: C=COCc1ccc(N(c2ccc(COC=C)cc2)c2ccc(C)c(C)c2)cc1] |
| ii-32 | 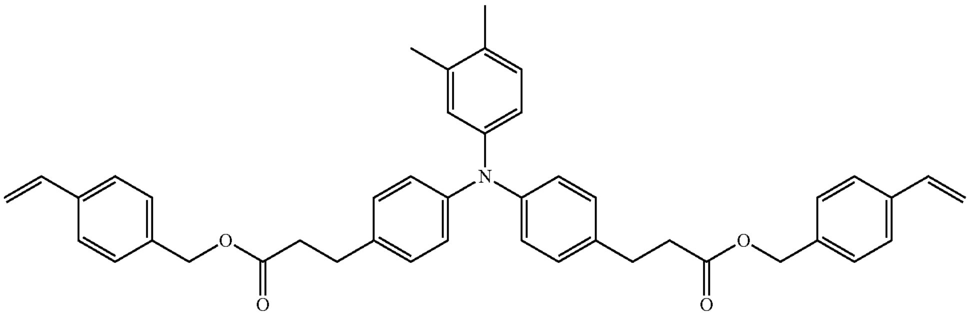 [SMILES: C=Cc1ccc(COC(=O)CCc2ccc(N(c3ccc(CCC(=O)OCc4ccc(C=C)cc4)cc3)c3ccc(C)c(C)c3)cc2)cc1] |
| ii-33 | 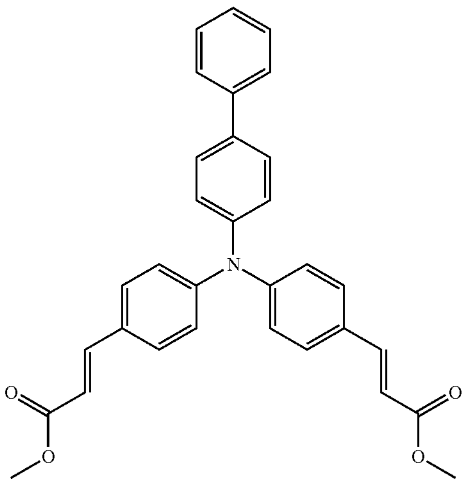 [SMILES: COC(=O)/C=C/c1ccc(N(c2ccc(/C=C/C(=O)OC)cc2)c2ccc(-c3ccccc3)cc2)cc1] |

-continued
| No. | |
|---|---|
| ii-34 | 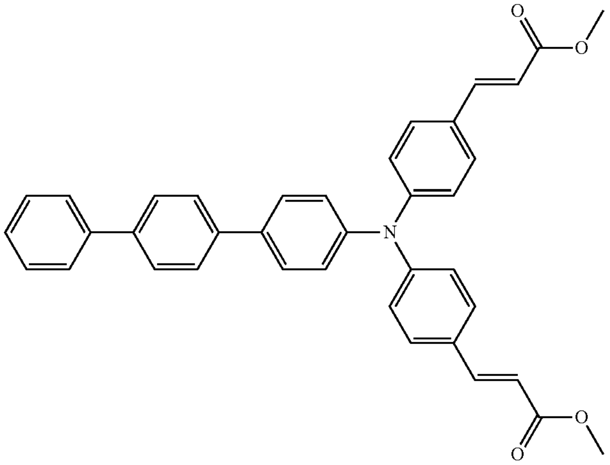 [SMILES: COC(=O)/C=C/c1ccc(N(c2ccc(/C=C/C(=O)OC)cc2)c2ccc(-c3ccc(-c4ccccc4)cc3)cc2)cc1] |
| ii-35 | 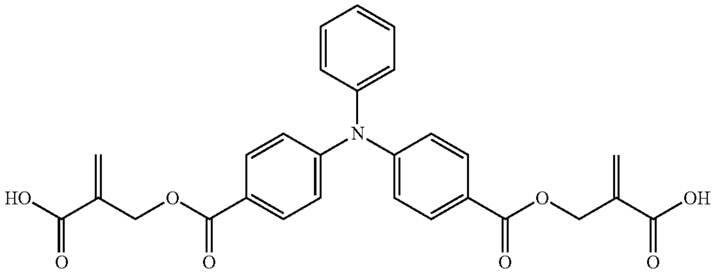 [SMILES: C=C(COC(=O)c1ccc(N(c2ccccc2)c2ccc(C(=O)OCC(=C)C(=O)O)cc2)cc1)C(=O)O] |
| ii-36 | 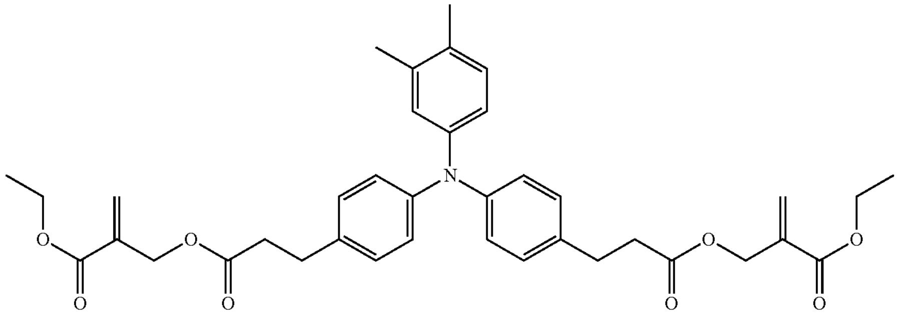 [SMILES: C=C(COC(=O)CCc1ccc(N(c2ccc(CCC(=O)OCC(=C)C(=O)OCC)cc2)c2ccc(C)c(C)c2)cc1)C(=O)OCC] |
| ii-37 | 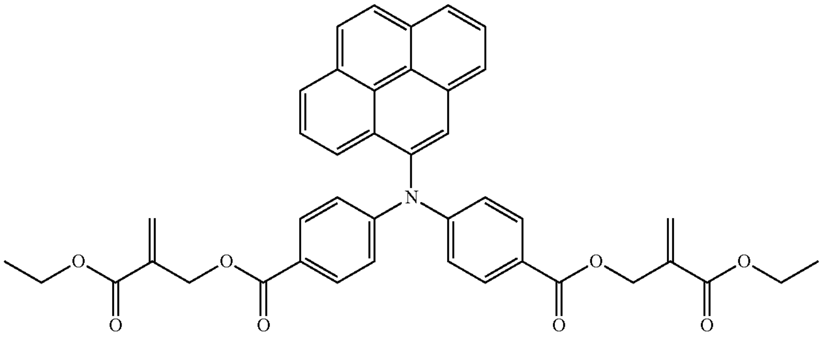 [SMILES: C=C(COC(=O)c1ccc(N(c2ccc(C(=O)OCC(=C)C(=O)OCC)cc2)c2cc3cccc4ccc5cccc2c5c43)cc1)C(=O)OCC] |

-continued
| No. | |
|---|---|
| ii-38 | 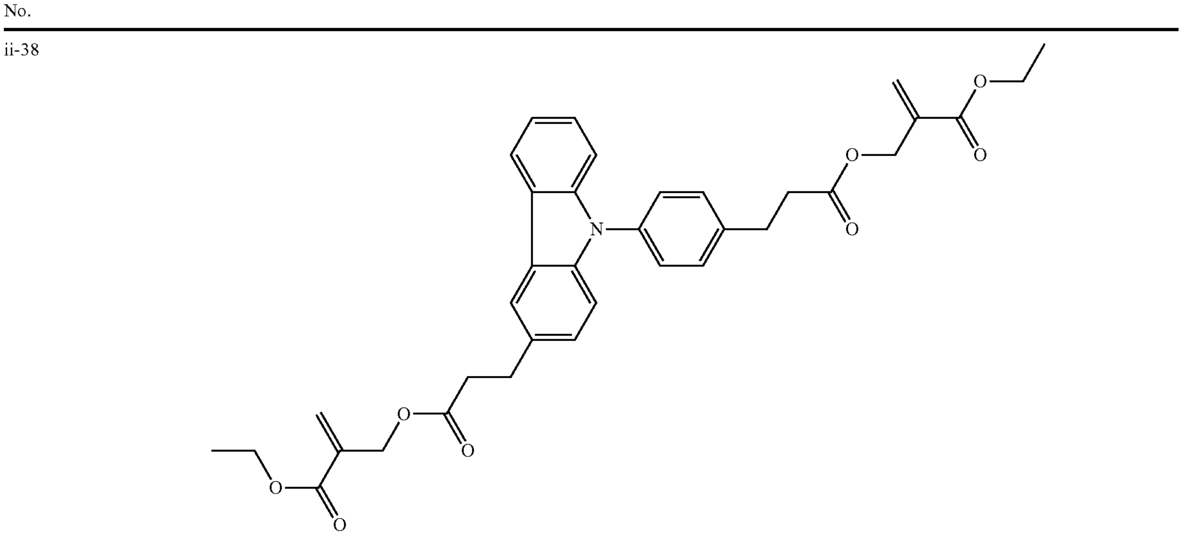 |
| ii-39 | 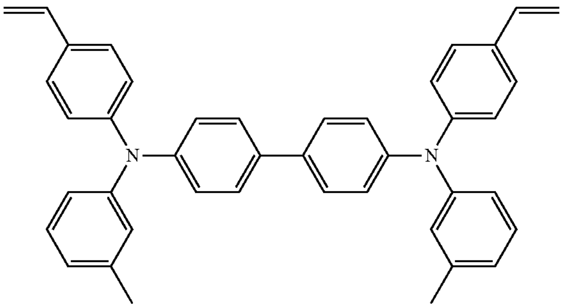 [SMILES: C=Cc1ccc(N(c2ccc(-c3ccc(N(c4ccc(C=C)cc4)c4cccc(C)c4)cc3)cc2)c2cccc(C)c2)cc1] |
| ii-40 | 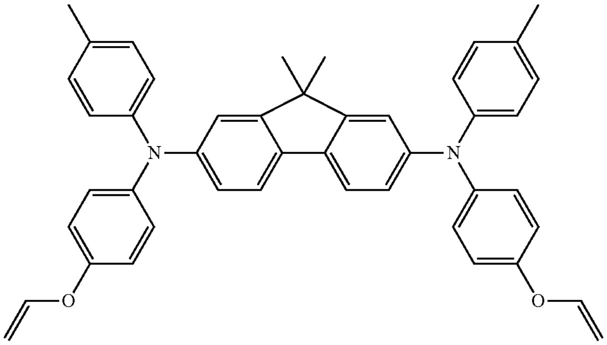 [SMILES: C=COc1ccc(N(c2ccc(C)cc2)c2ccc3c(c2)C(C)(C)c2cc(N(c4ccc(C)cc4)c4ccc(OC=C)cc4)ccc2-3)cc1] |
| ii-41 | 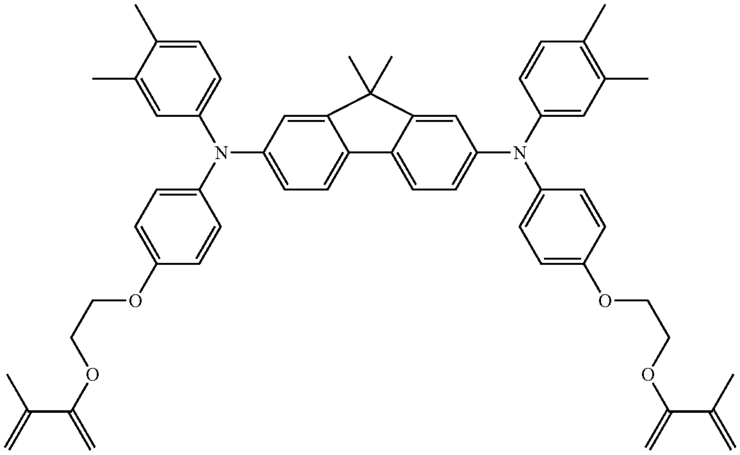 [SMILES: C=C(C)C(=C)OCCOc1ccc(N(c2ccc(C)c(C)c2)c2ccc3c(c2)C(C)(C)c2cc(N(c4ccc(OCCOC(=C)C(=C)C)cc4)c4ccc(C)c(C)c4)ccc2-3)cc1] |

-continued
| No. | |
|---|---|
| ii-42 | 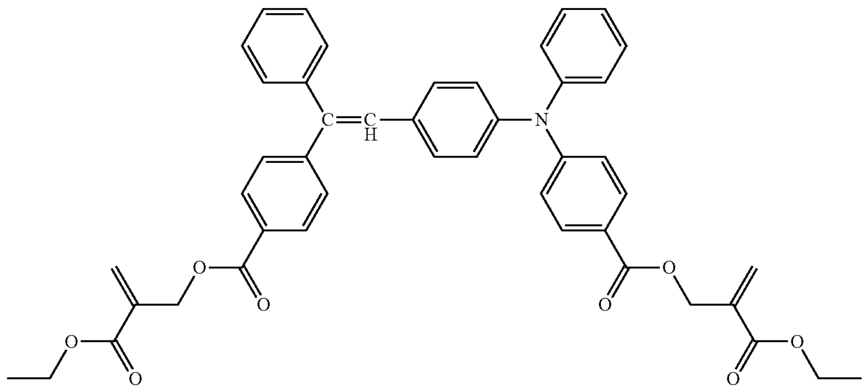 [SMILES: C=C(COC(=O)c1ccc(C(=Cc2ccc(N(c3ccccc3)c3ccc(C(=O)OCC(=C)C(=O)OCC)cc3)cc2)c2ccccc2)cc1)C(=O)OCC] |
| ii-43 | 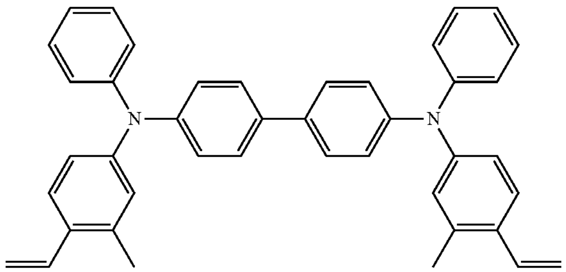 [SMILES: C=Cc1ccc(N(c2ccccc2)c2ccc(-c3ccc(N(c4ccccc4)c4ccc(C=C)c(C)c4)cc3)cc2)cc1C] |
| ii-44 | 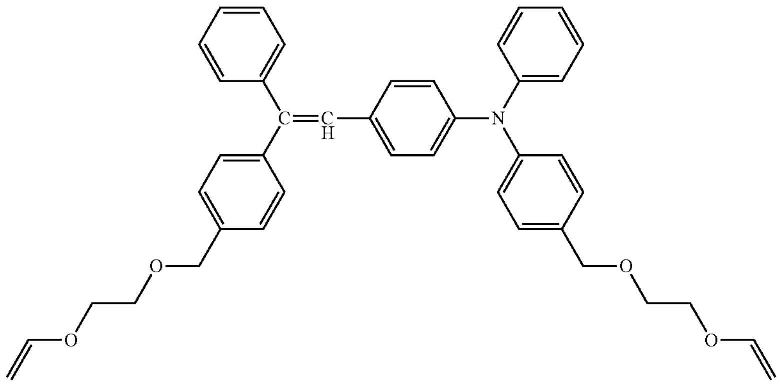 [SMILES: C=COCCOCc1ccc(C(=Cc2ccc(N(c3ccccc3)c3ccc(COCCOC=C)cc3)cc2)c2ccccc2)cc1] |
| ii-45 | 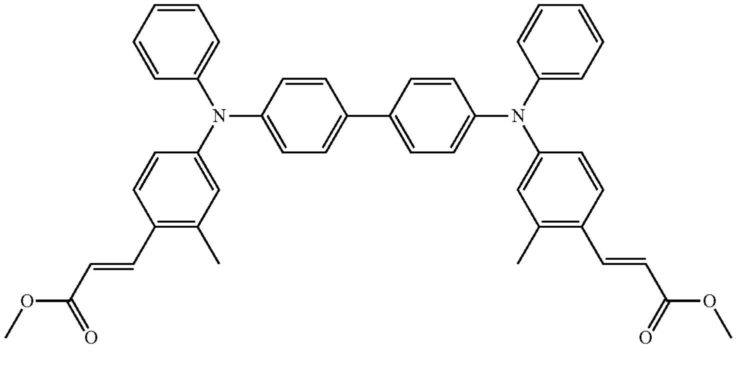 |

-continued
| No. | |
|---|---|
| ii-46 | 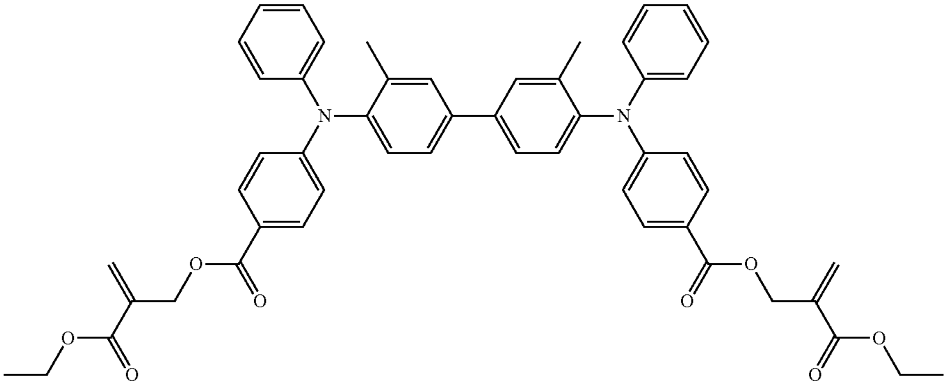 [SMILES: C=C(COC(=O)c1ccc(N(c2ccccc2)c2ccc(-c3ccc(N(c4ccccc4)c4ccc(C(=O)OCC(=C)C(=O)OCC)cc4)c(C)c3)cc2C)cc1)C(=O)OCC] |
| ii-47 | 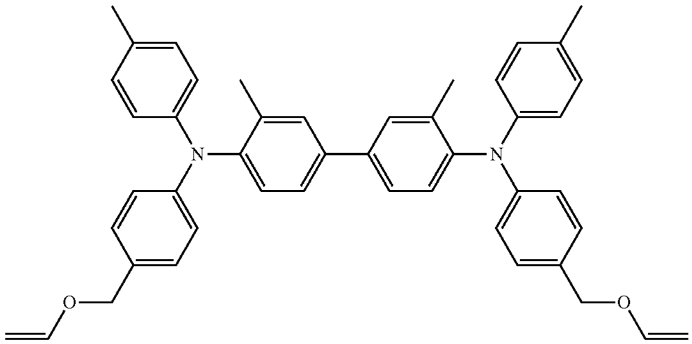 [SMILES: C=COCc1ccc(N(c2ccc(C)cc2)c2ccc(-c3ccc(N(c4ccc(C)cc4)c4ccc(COC=C)cc4)c(C)c3)cc2C)cc1] |
| ii-48 | 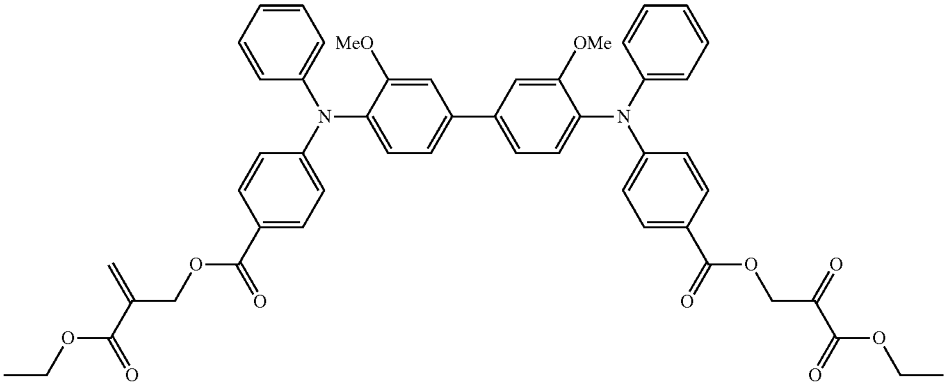 [SMILES: C=C(COC(=O)c1ccc(N(c2ccccc2)c2ccc(-c3ccc(N(c4ccccc4)c4ccc(C(=O)OCC(=O)C(=O)OCC)cc4)c(OC)c3)cc2OC)cc1)C(=O)OCC] |
| ii-49 | 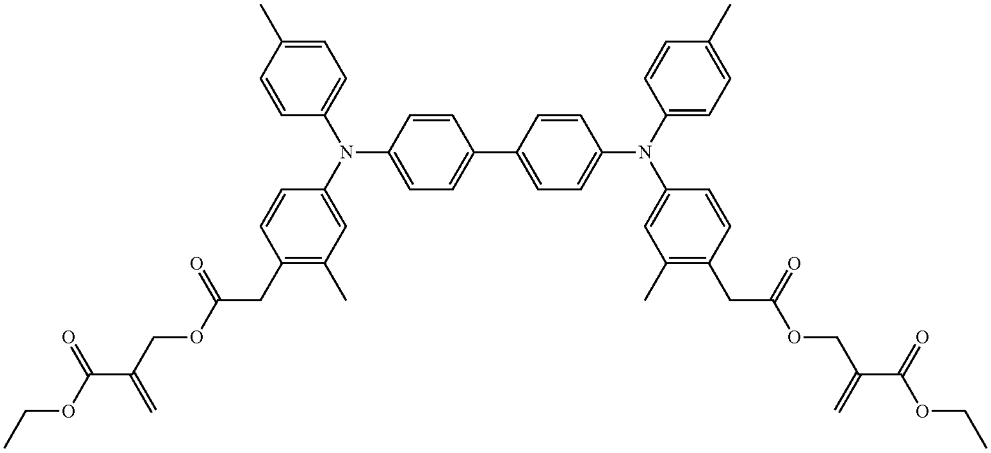 [SMILES: C=C(COC(=O)Cc1ccc(N(c2ccc(C)cc2)c2ccc(-c3ccc(N(c4ccc(C)cc4)c4ccc(CC(=O)OCC(=C)C(=O)OCC)c(C)c4)cc3)cc2)cc1C)C(=O)OCC] |

-continued
| No. | |
|---|---|
| ii-50 | 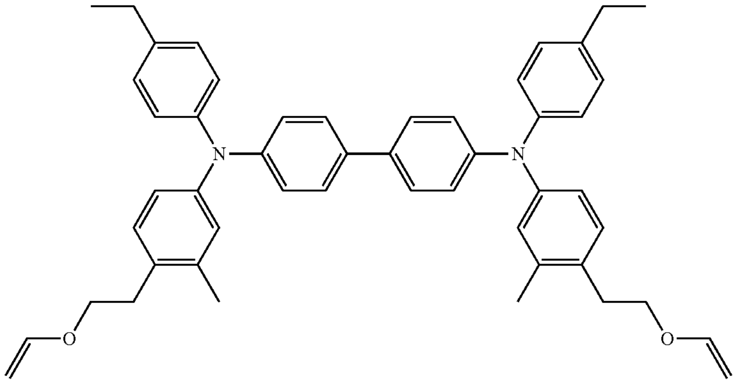 [SMILES: C=COCCc1ccc(N(c2ccc(CC)cc2)c2ccc(-c3ccc(N(c4ccc(CC)cc4)c4ccc(CCOC=C)c(C)c4)cc3)cc2)cc1C] |
| ii-51 | 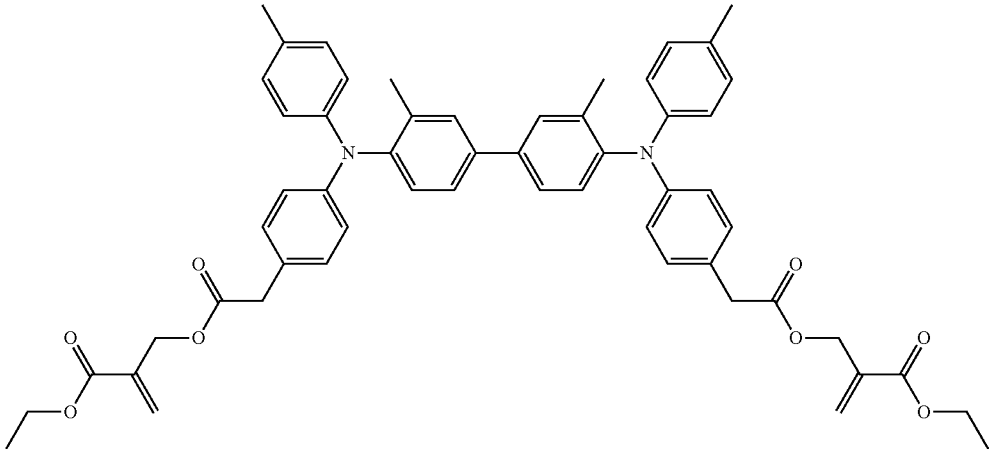 [SMILES: C=C(COC(=O)Cc1ccc(N(c2ccc(C)cc2)c2ccc(-c3ccc(N(c4ccc(C)cc4)c4ccc(CC(=O)OCC(=C)C(=O)OCC)cc4)c(C)c3)cc2C)cc1)C(=O)OCC] |
| ii-52 | 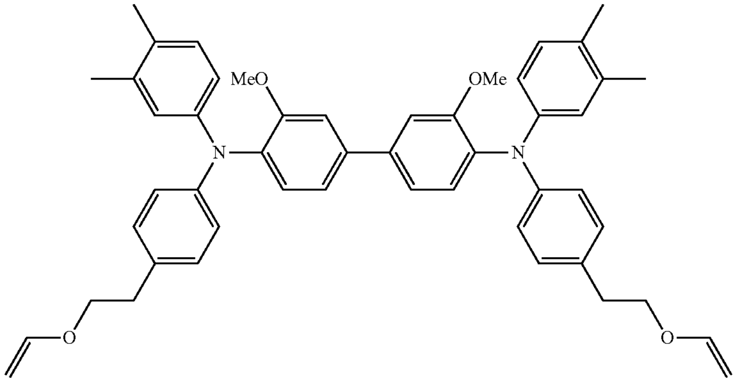 [SMILES: C=COCCc1ccc(N(c2ccc(C)c(C)c2)c2ccc(-c3ccc(N(c4ccc(CCOC=C)cc4)c4ccc(C)c(C)c4)c(OC)c3)cc2OC)cc1] |

-continued
| No. | |
|---|---|
| ii-53 | 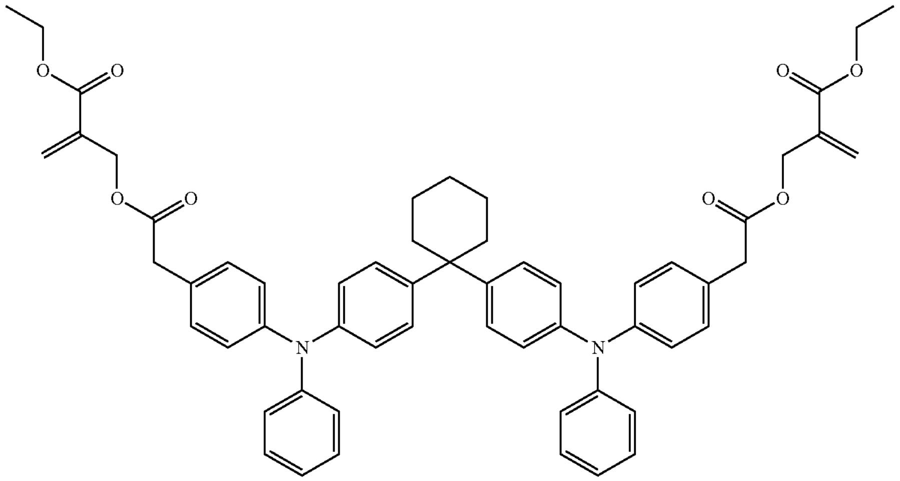 [SMILES: C=C(COC(=O)Cc1ccc(N(c2ccccc2)c2ccc(C3(c4ccc(N(c5ccccc5)c5ccc(CC(=O)OCC(=C)C(=O)OCC)cc5)cc4)CCCCC3)cc2)cc1)C(=O)OCC] |
| ii-54 | 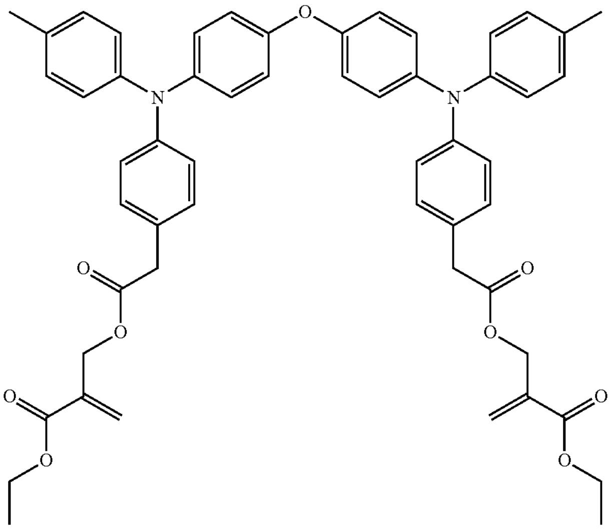 [SMILES: C=C(COC(=O)Cc1ccc(N(c2ccc(C)cc2)c2ccc(Oc3ccc(N(c4ccc(C)cc4)c4ccc(CC(=O)OCC(=C)C(=O)OCC)cc4)cc3)cc2)cc1)C(=O)OCC] |
| ii-55 | 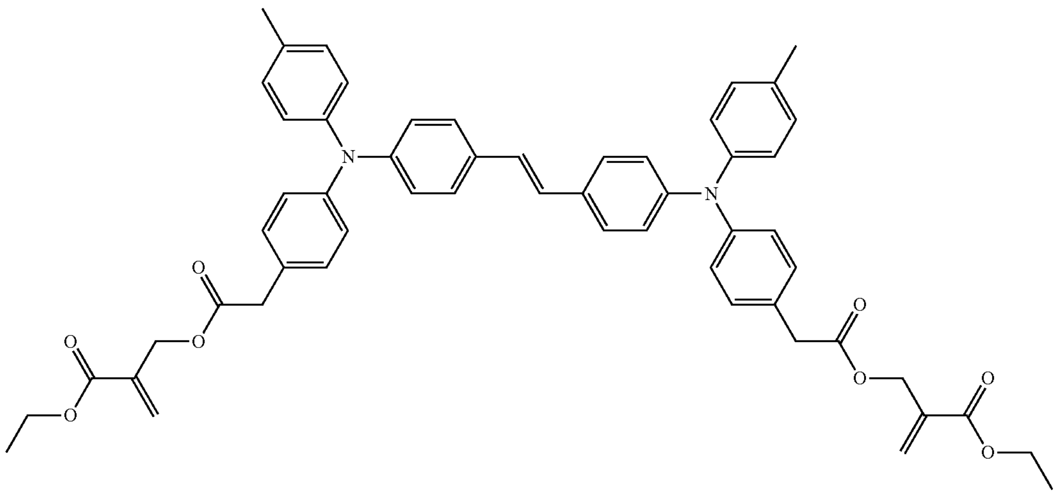 [SMILES: C=C(COC(=O)Cc1ccc(N(c2ccc(C)cc2)c2ccc(/C=C/c3ccc(N(c4ccc(C)cc4)c4ccc(CC(=O)OCC(=C)C(=O)OCC)cc4)cc3)cc2)cc1)C(=O)OCC] |

-continued
| No. | |
|---|---|
| ii-56 | 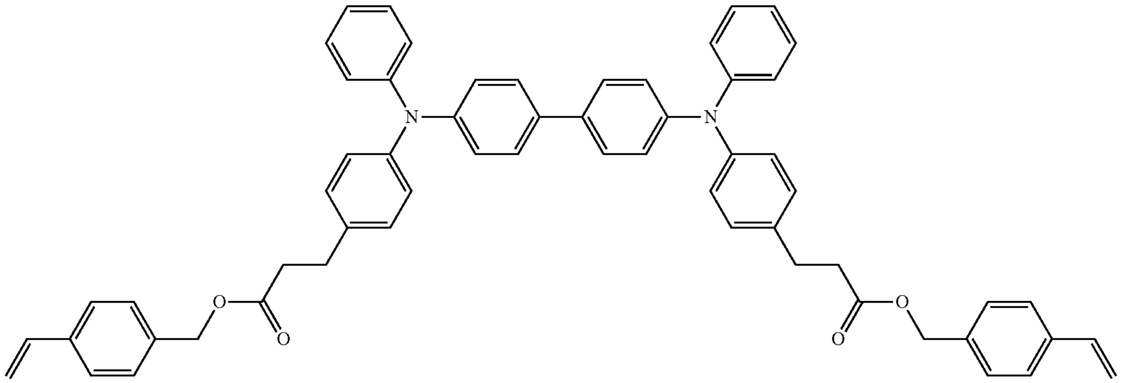 [SMILES: C=Cc1ccc(COC(=O)CCc2ccc(N(c3ccccc3)c3ccc(-c4ccc(N(c5ccccc5)c5ccc(CCC(=O)OCc6ccc(C=C)cc6)cc5)cc4)cc3)cc2)cc1] |
| iii-12 | 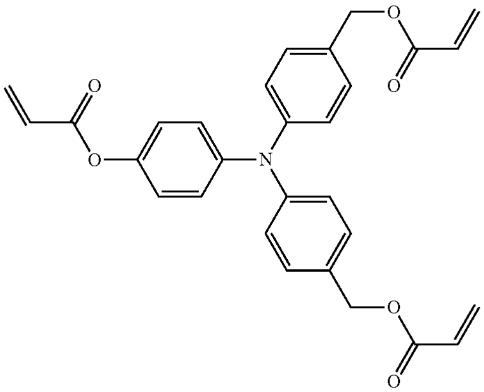 [SMILES: C=CC(=O)OCc1ccc(N(c2ccc(COC(=O)C=C)cc2)c2ccc(OC(=O)C=C)cc2)cc1] |
| iii-13 | 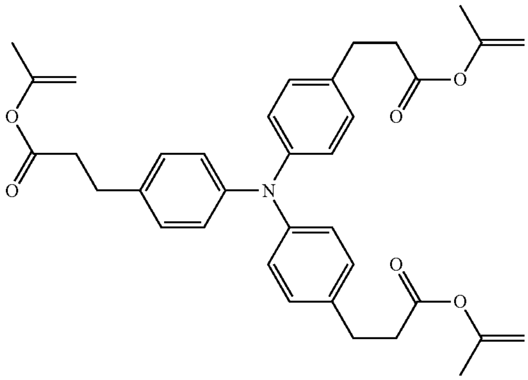 [SMILES: C=C(C)OC(=O)CCc1ccc(N(c2ccc(CCC(=O)OC(=C)C)cc2)c2ccc(CCC(=O)OC(=C)C)cc2)cc1] |
| iii-14 | 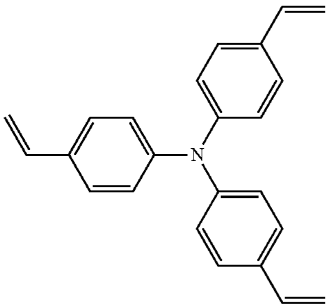 [SMILES: C=Cc1ccc(N(c2ccc(C=C)cc2)c2ccc(C=C)cc2)cc1] |

-continued
| No. | |
|---|---|
| iii-15 | 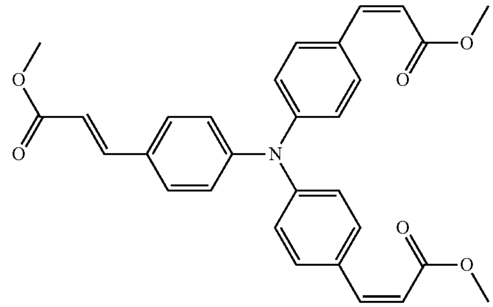 [SMILES: COC(=O)/C=C\c1ccc(N(c2ccc(/C=C\C(=O)OC)cc2)c2ccc(/C=C/C(=O)OC)cc2)cc1] |
| iii-16 | 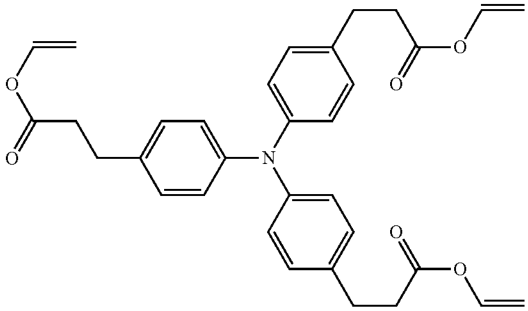 [SMILES: C=COC(=O)CCc1ccc(N(c2ccc(CCC(=O)OC=C)cc2)c2ccc(CCC(=O)OC=C)cc2)cc1] |
| iii-17 | 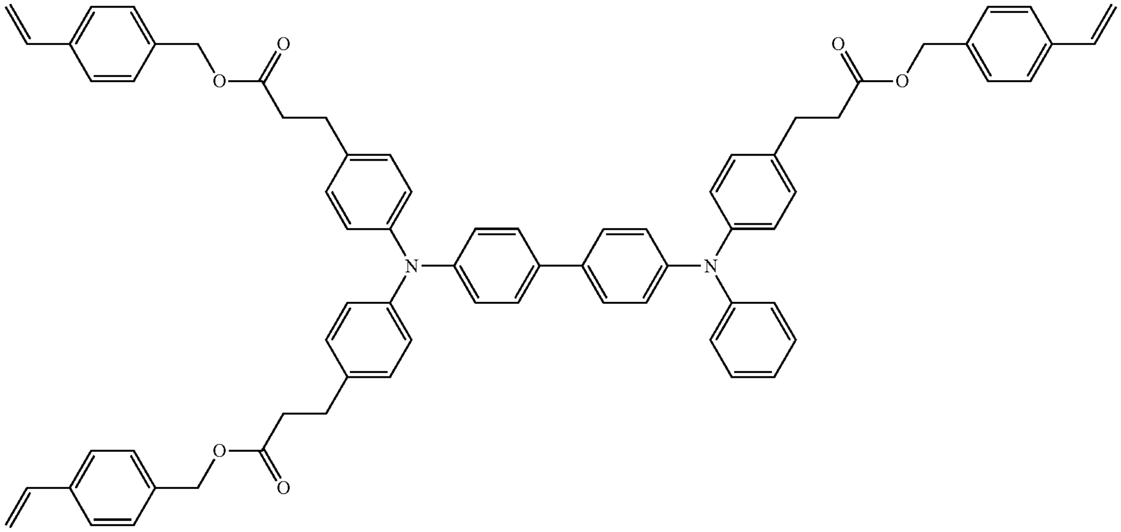 [SMILES: C=Cc1ccc(COC(=O)CCc2ccc(N(c3ccccc3)c3ccc(-c4ccc(N(c5ccc(CCC(=O)OCc6ccc(C=C)cc6)cc5)c5ccc(CCC(=O)OCc6ccc(C=C)cc6)cc5)cc4)cc3)cc2)cc1] |

-continued
| No. | |
|---|---|
| iii-18 | 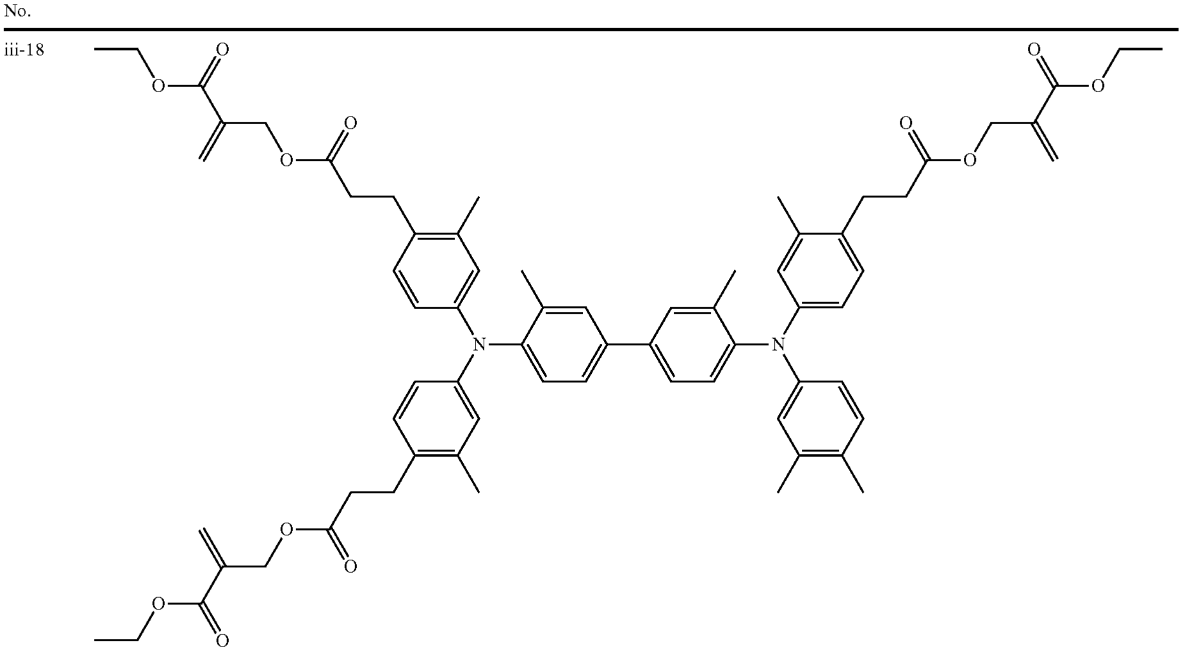 |
| iii-19 | 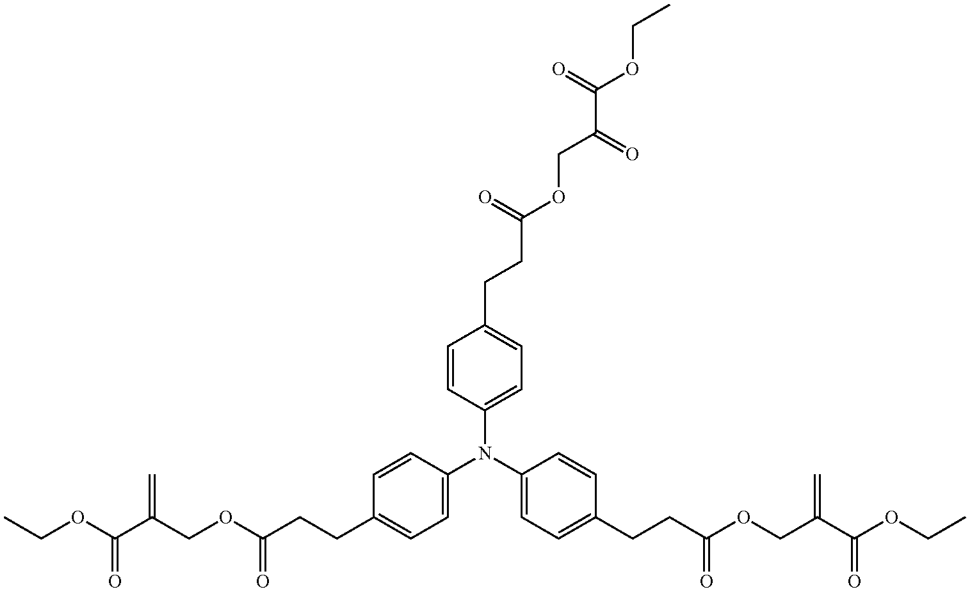 [SMILES: C=C(COC(=O)CCc1ccc(N(c2ccc(CCC(=O)OCC(=C)C(=O)OCC)cc2)c2ccc(CCC(=O)OCC(=O)C(=O)OCC)cc2)cc1)C(=O)OCC] |
| iv-19 | 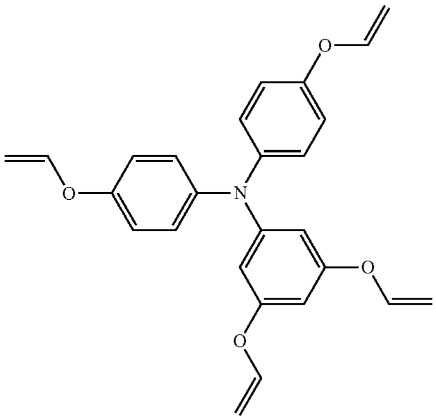 [SMILES: C=COc1ccc(N(c2ccc(OC=C)cc2)c2cc(OC=C)cc(OC=C)c2)cc1] |

-continued
| No. | |
|---|---|
| iv-20 | 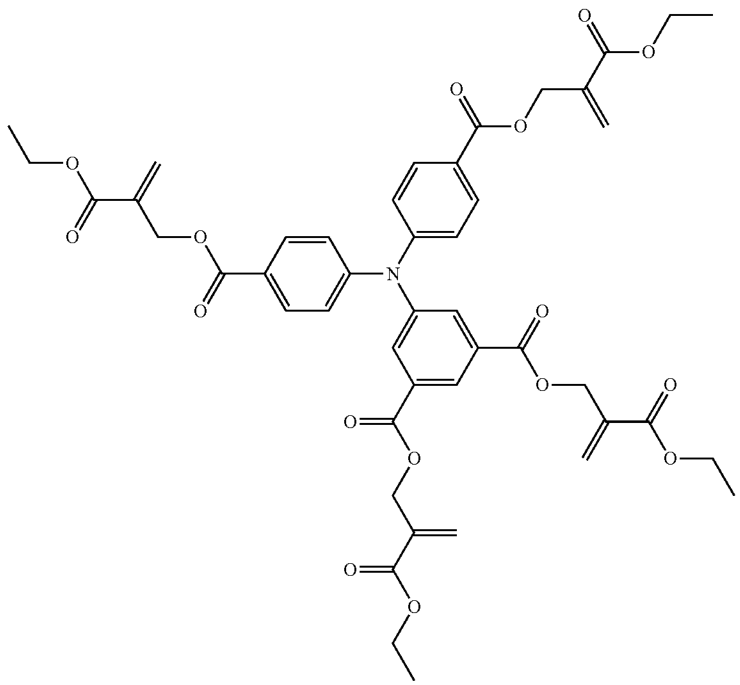 [SMILES: C=C(COC(=O)c1ccc(N(c2ccc(C(=O)OCC(=C)C(=O)OCC)cc2)c2cc(C(=O)OCC(=C)C(=O)OCC)cc(C(=O)OCC(=C)C(=O)OCC)c2)cc1)C(=O)OCC] |
| iv-21 | 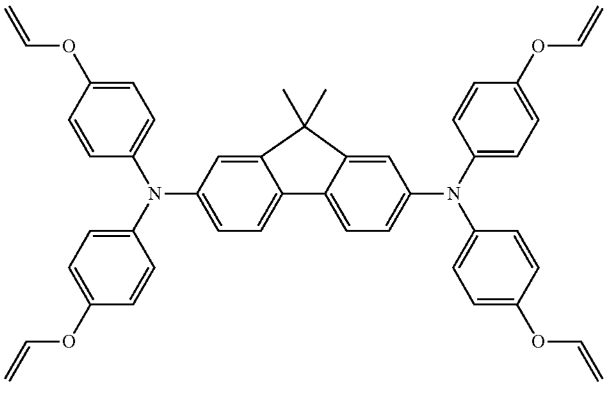 [SMILES: C=COc1ccc(N(c2ccc(OC=C)cc2)c2ccc3c(c2)C(C)(C)c2cc(N(c4ccc(OC=C)cc4)c4ccc(OC=C)cc4)ccc2-3)cc1] |

-continued
| No. | |
|---|---|
| iv-22 | 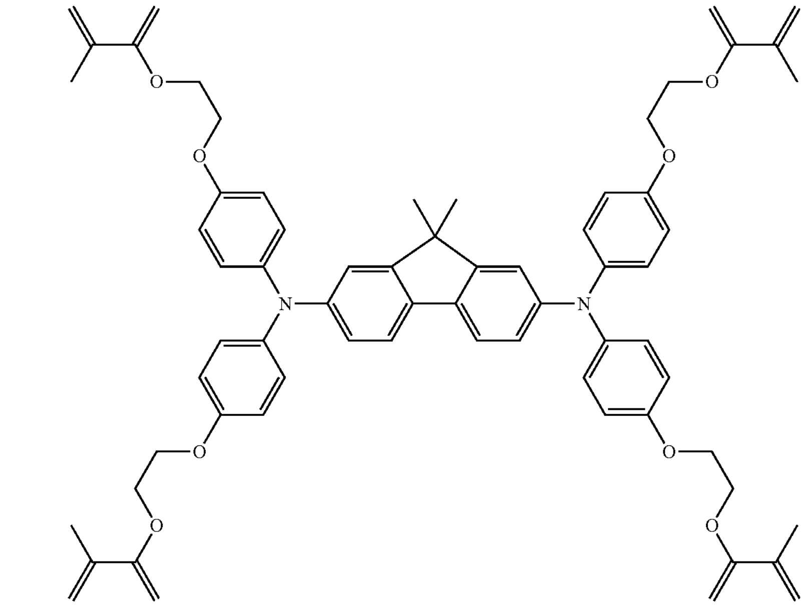 [SMILES: C=C(C)C(=C)OCCOc1ccc(N(c2ccc(OCCOC(=C)C(=C)C)cc2)c2ccc3c(c2)C(C)(C)c2cc(N(c4ccc(OCCOC(=C)C(=C)C)cc4)c4ccc(OCCOC(=C)C(=C)C)cc4)ccc2-3)cc1] |
| iv-23 | 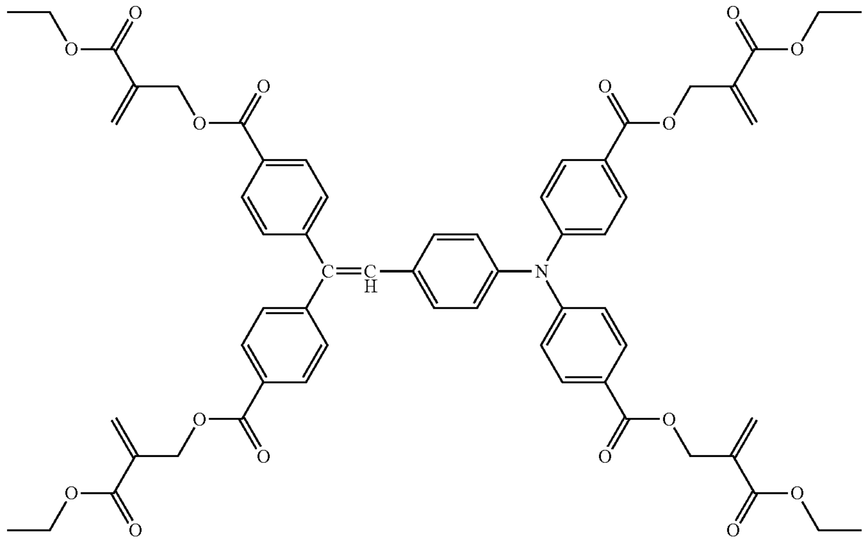 [SMILES: C=C(COC(=O)c1ccc(C(=Cc2ccc(N(c3ccc(C(=O)OCC(=C)C(=O)OCC)cc3)c3ccc(C(=O)OCC(=C)C(=O)OCC)cc3)cc2)c2ccc(C(=O)OCC(=C)C(=O)OCC)cc2)cc1)C(=O)OCC] |

-continued
| No. | |
|---|---|
| iv-24 | 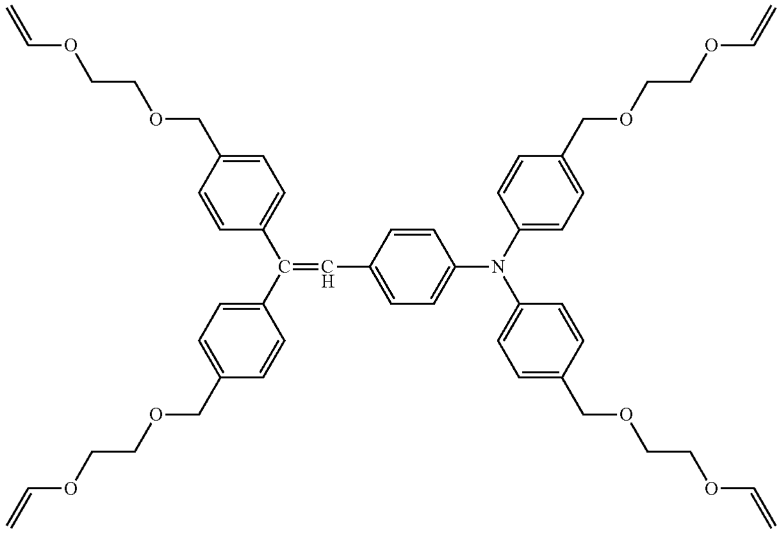 [SMILES: C=COCCOCc1ccc(C(=Cc2ccc(N(c3ccc(COCCOC=C)cc3)c3ccc(COCCOC=C)cc3)cc2)c2ccc(COCCOC=C)cc2)cc1] |
| iv-25 | 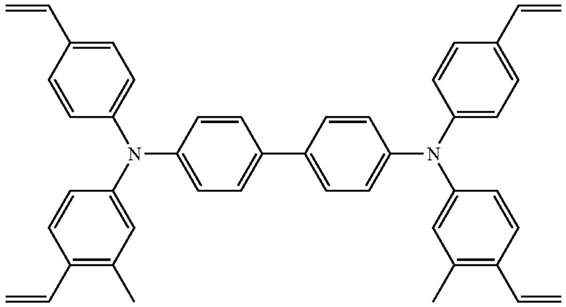 [SMILES: C=Cc1ccc(N(c2ccc(-c3ccc(N(c4ccc(C=C)cc4)c4ccc(C=C)c(C)c4)cc3)cc2)c2ccc(C=C)c(C)c2)cc1] |
| iv-26 | 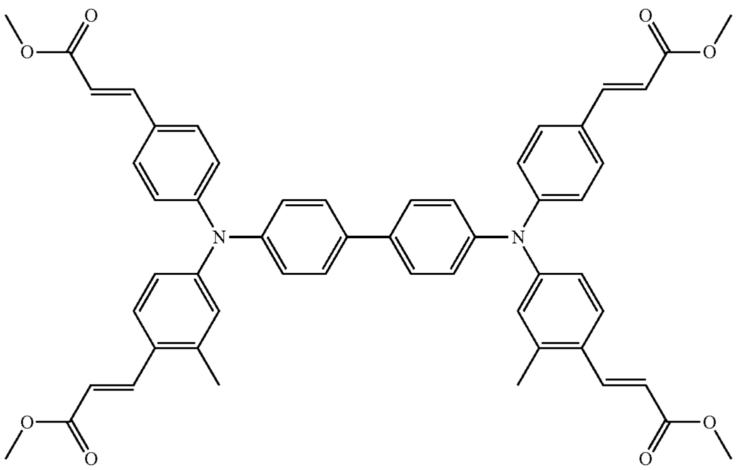 |

-continued
| No. | |
|---|---|
| iv-27 | 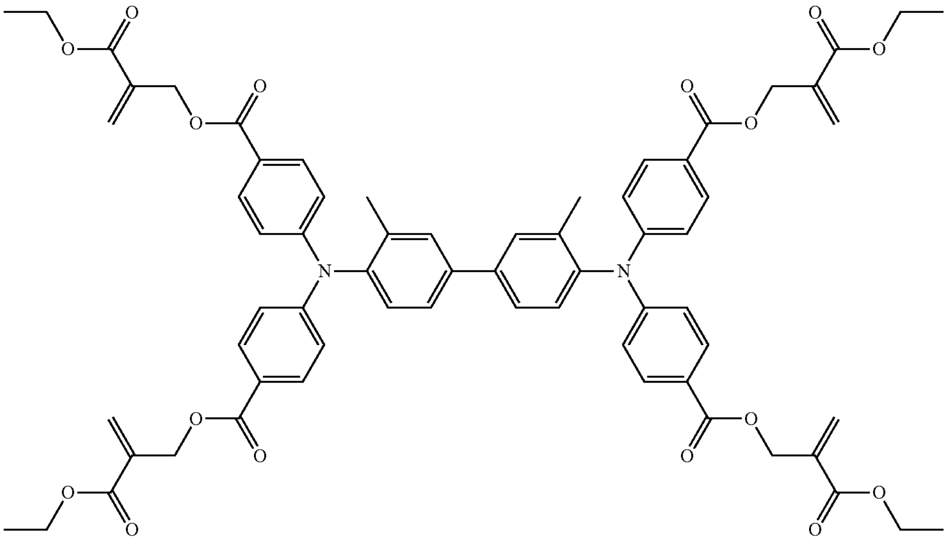 [SMILES: C=C(COC(=O)c1ccc(N(c2ccc(C(=O)OCC(=C)C(=O)OCC)cc2)c2ccc(-c3ccc(N(c4ccc(C(=O)OCC(=C)C(=O)OCC)cc4)c4ccc(C(=O)OCC(=C)C(=O)OCC)cc4)c(C)c3)cc2C)cc1)C(=O)OCC] |
| iv-28 | 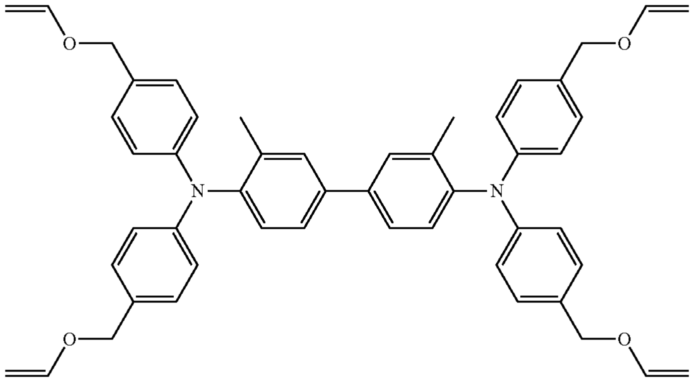 [SMILES: C=COCc1ccc(N(c2ccc(COC=C)cc2)c2ccc(-c3ccc(N(c4ccc(COC=C)cc4)c4ccc(COC=C)cc4)c(C)c3)cc2C)cc1] |
| iv-29 | 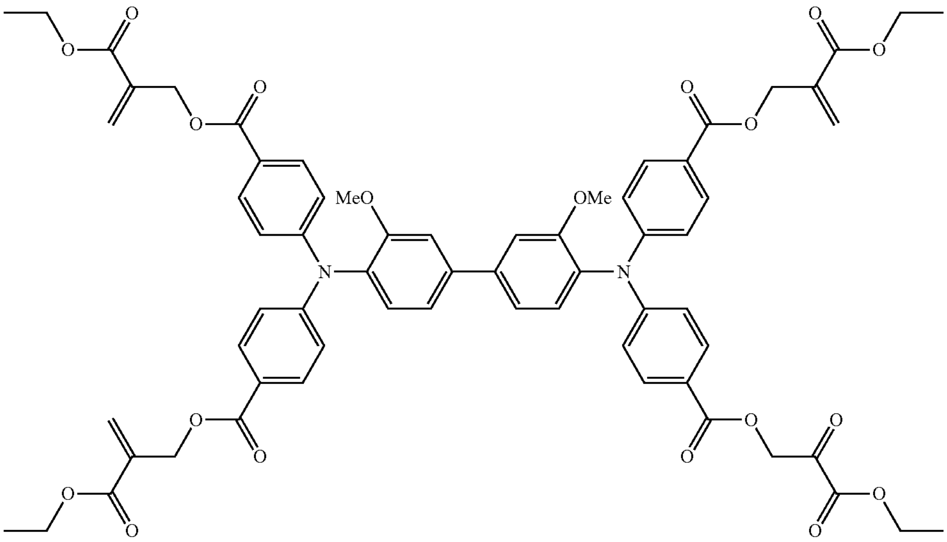 [SMILES: C=C(COC(=O)c1ccc(N(c2ccc(C(=O)OCC(=C)C(=O)OCC)cc2)c2ccc(-c3ccc(N(c4ccc(C(=O)OCC(=C)C(=O)OCC)cc4)c4ccc(C(=O)OCC(=O)C(=O)OCC)cc4)c(OC)c3)cc2OC)cc1)C(=O)OCC] |

-continued
| No. | |
|---|---|
| iv-30 | 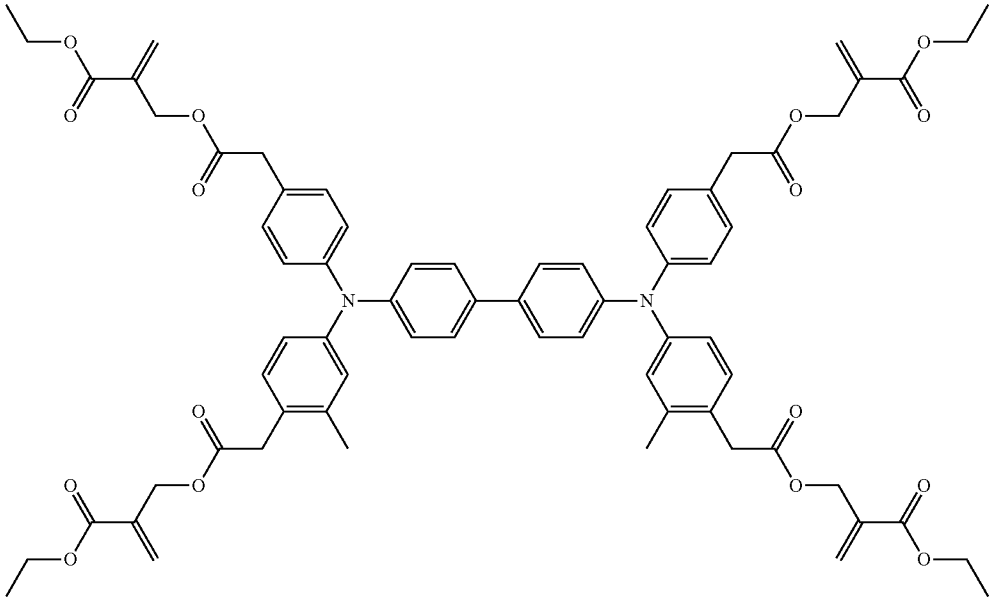 [SMILES: C=C(COC(=O)Cc1ccc(N(c2ccc(-c3ccc(N(c4ccc(CC(=O)OCC(=C)C(=O)OCC)cc4)c4ccc(CC(=O)OCC(=C)C(=O)OCC)c(C)c4)cc3)cc2)c2ccc(CC(=O)OCC(=C)C(=O)OCC)c(C)c2)cc1)C(=O)OCC] |
| iv-31 | 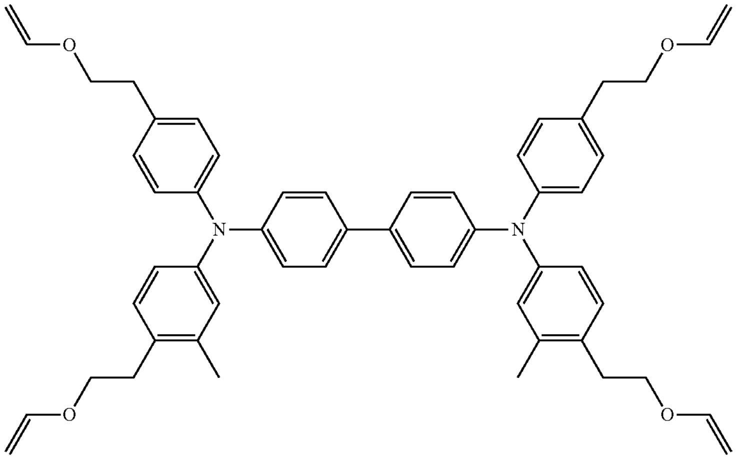 [SMILES: C=COCCc1ccc(N(c2ccc(-c3ccc(N(c4ccc(CCOC=C)cc4)c4ccc(CCOC=C)c(C)c4)cc3)cc2)c2ccc(CCOC=C)c(C)c2)cc1] |

-continued
| No. | |
|---|---|
| iv-32 | 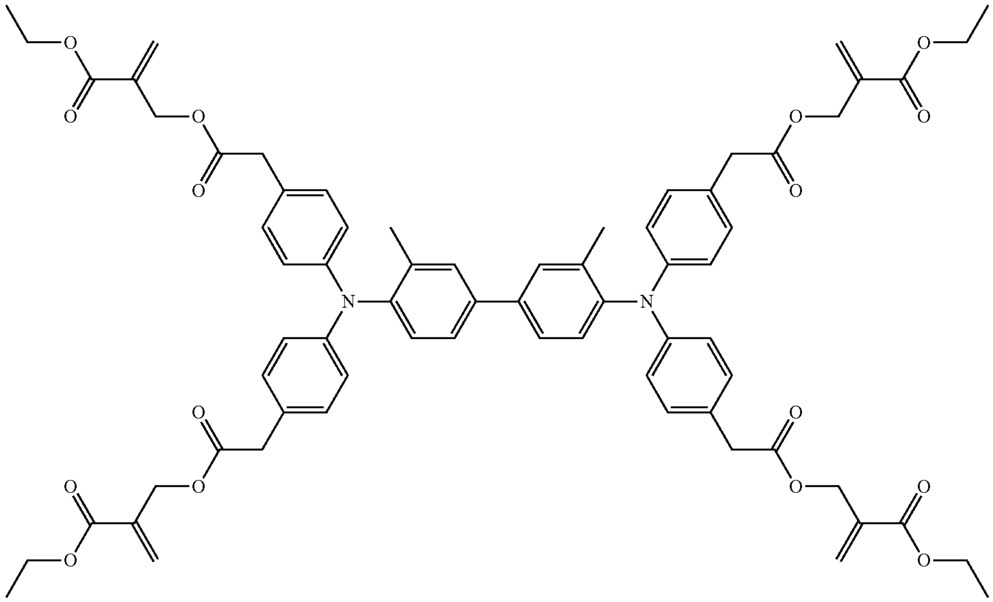 [SMILES: C=C(COC(=O)Cc1ccc(N(c2ccc(CC(=O)OCC(=C)C(=O)OCC)cc2)c2ccc(-c3ccc(N(c4ccc(CC(=O)OCC(=C)C(=O)OCC)cc4)c4ccc(CC(=O)OCC(=C)C(=O)OCC)cc4)c(C)c3)cc2C)cc1)C(=O)OCC] |
| iv-33 | 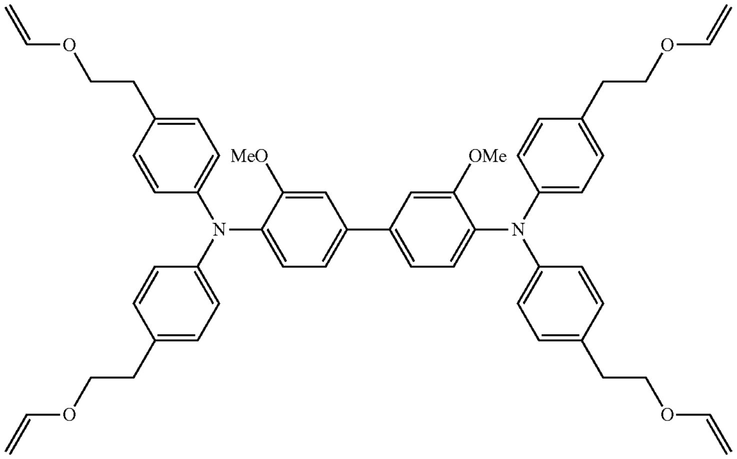 [SMILES: C=COCCc1ccc(N(c2ccc(CCOC=C)cc2)c2ccc(-c3ccc(N(c4ccc(CCOC=C)cc4)c4ccc(CCOC=C)cc4)c(OC)c3)cc2OC)cc1] |

-continued
| No. | |
|---|---|
| iv-34 | 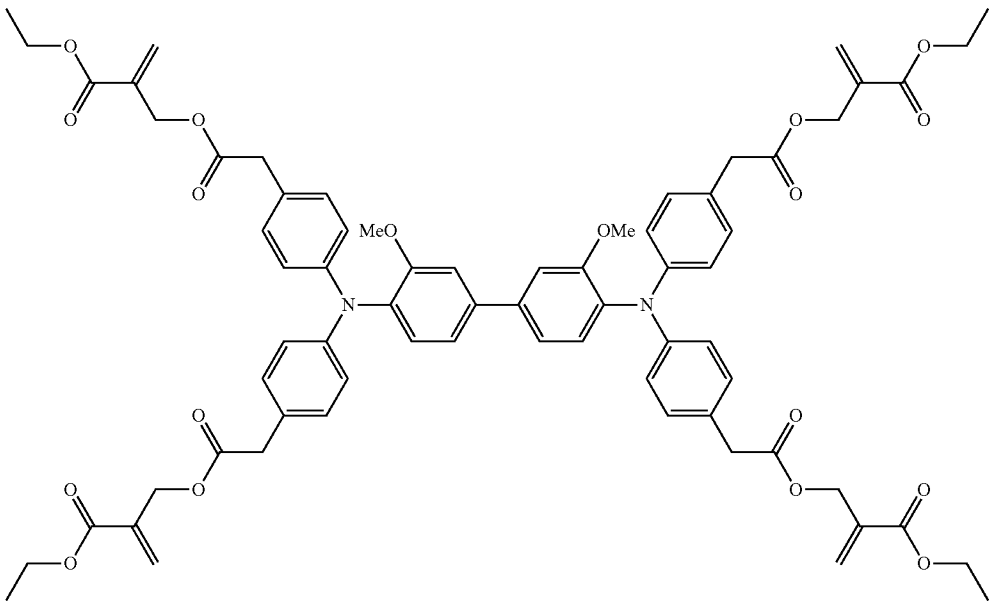 [SMILES: C=C(COC(=O)Cc1ccc(N(c2ccc(CC(=O)OCC(=C)C(=O)OCC)cc2)c2ccc(-c3ccc(N(c4ccc(CC(=O)OCC(=C)C(=O)OCC)cc4)c4ccc(CC(=O)OCC(=C)C(=O)OCC)cc4)c(OC)c3)cc2OC)cc1)C(=O)OCC] |
| iv-35 | 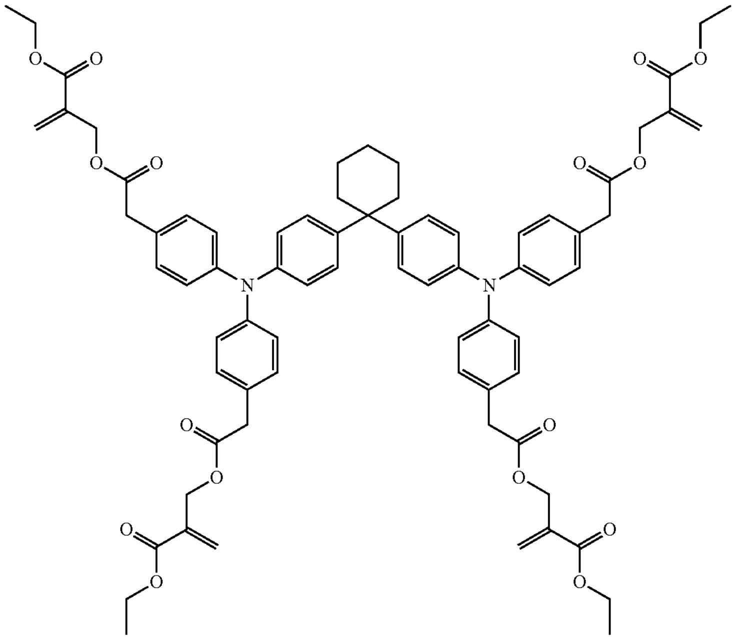 [SMILES: C=C(COC(=O)Cc1ccc(N(c2ccc(CC(=O)OCC(=C)C(=O)OCC)cc2)c2ccc(C3(c4ccc(N(c5ccc(CC(=O)OCC(=C)C(=O)OCC)cc5)c5ccc(CC(=O)OCC(=C)C(=O)OCC)cc5)cc4)CCCCC3)cc2)cc1)C(=O)OCC] |

-continued
| No. | |
|---|---|
| iv-36 | 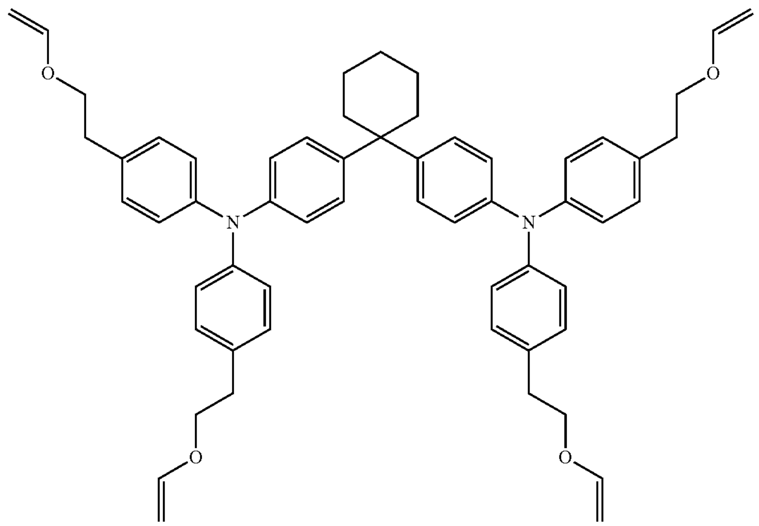 [SMILES: C=COCCc1ccc(N(c2ccc(CCOC=C)cc2)c2ccc(C3(c4ccc(N(c5ccc(CCOC=C)cc5)c5ccc(CCOC=C)cc5)cc4)CCCCC3)cc2)cc1] |
| iv-37 | 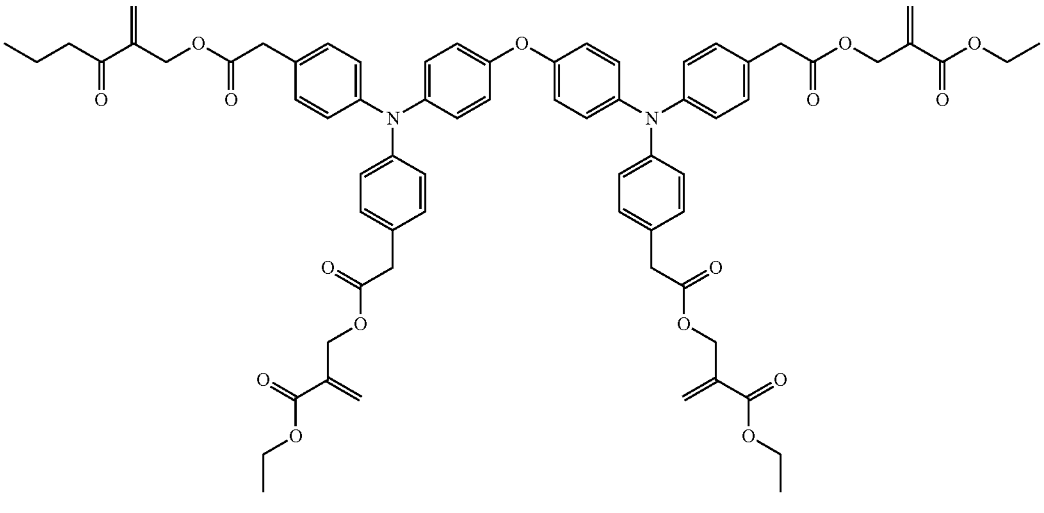 [SMILES: C=C(COC(=O)Cc1ccc(N(c2ccc(CC(=O)OCC(=C)C(=O)OCC)cc2)c2ccc(Oc3ccc(N(c4ccc(CC(=O)OCC(=C)C(=O)OCC)cc4)c4ccc(CC(=O)OCC(=C)C(=O)OCC)cc4)cc3)cc2)cc1)C(=O)CCC] |

-continued
| No. | |
|---|---|
| iv-38 | 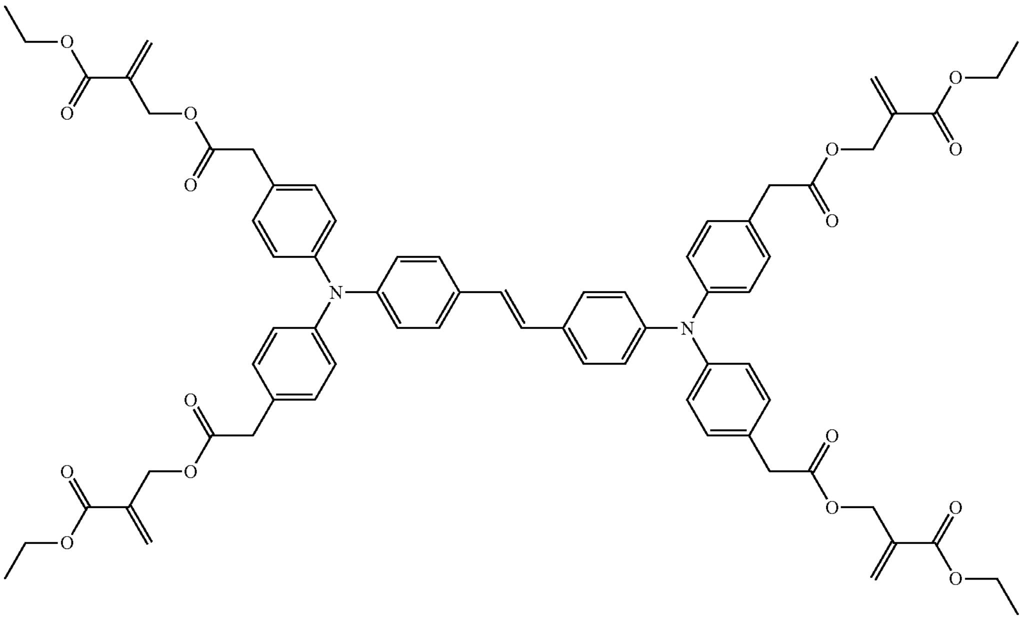 [SMILES: C=C(COC(=O)Cc1ccc(N(c2ccc(/C=C/c3ccc(N(c4ccc(CC(=O)OCC(=C)C(=O)OCC)cc4)c4ccc(CC(=O)OCC(=C)C(=O)OCC)cc4)cc3)cc2)c2ccc(CC(=O)OCC(=C)C(=O)OCC)cc2)cc1)C(=O)OCC] |
| iv-39 | 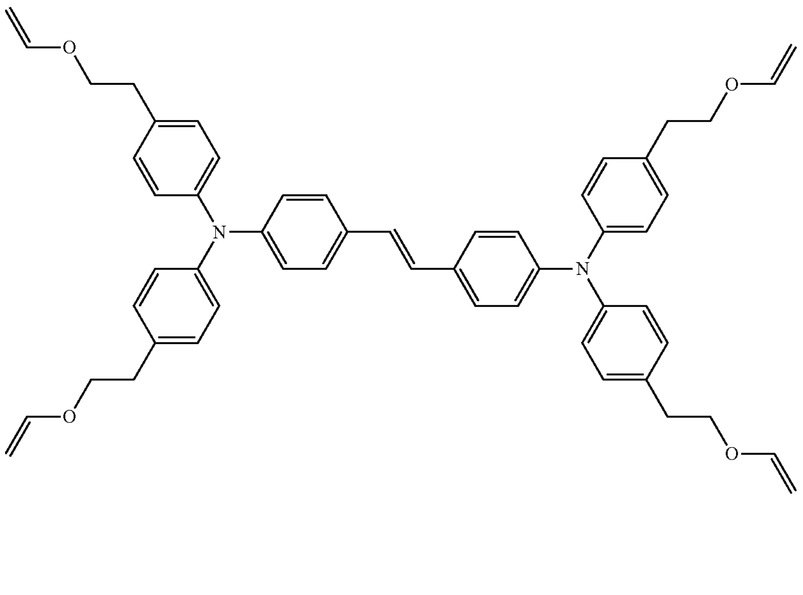 [SMILES: C=COCCc1ccc(N(c2ccc(/C=C/c3ccc(N(c4ccc(CCOC=C)cc4)c4ccc(CCOC=C)cc4)cc3)cc2)c2ccc(CCOC=C)cc2)cc1] |

-continued
| No. | |
|---|---|
| iv-40 | 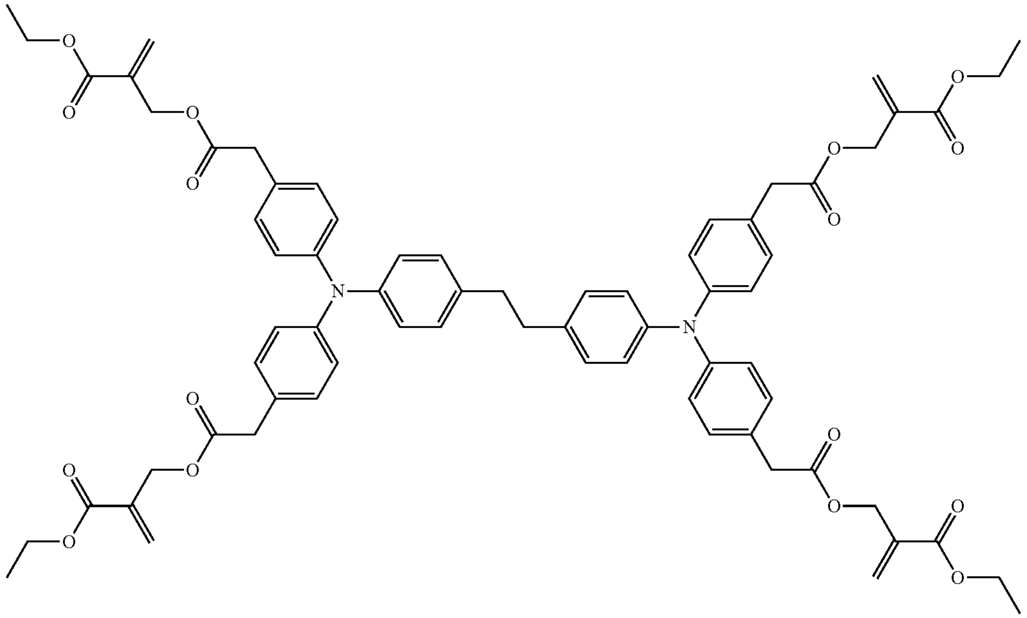 [SMILES: C=C(COC(=O)Cc1ccc(N(c2ccc(CCc3ccc(N(c4ccc(CC(=O)OCC(=C)C(=O)OCC)cc4)c4ccc(CC(=O)OCC(=C)C(=O)OCC)cc4)cc3)cc2)c2ccc(CC(=O)OCC(=C)C(=O)OCC)cc2)cc1)C(=O)OCC] |
| iv-41 | 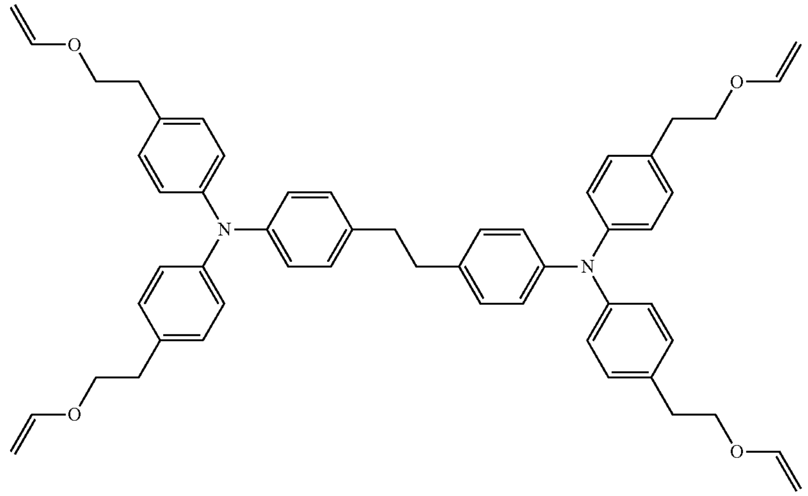 |

-continued
| No. | |
|---|---|
| iv-42 | 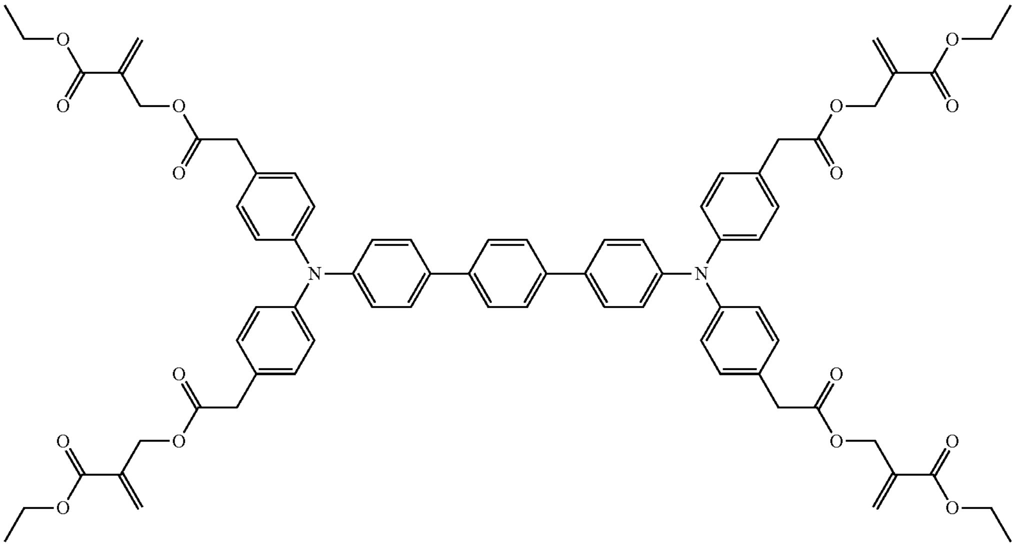 [SMILES: C=C(COC(=O)Cc1ccc(N(c2ccc(CC(=O)OCC(=C)C(=O)OCC)cc2)c2ccc(-c3ccc(-c4ccc(N(c5ccc(CC(=O)OCC(=C)C(=O)OCC)cc5)c5ccc(CC(=O)OCC(=C)C(=O)OCC)cc5)cc4)cc3)cc2)cc1)C(=O)OCC] |
| iv-43 | 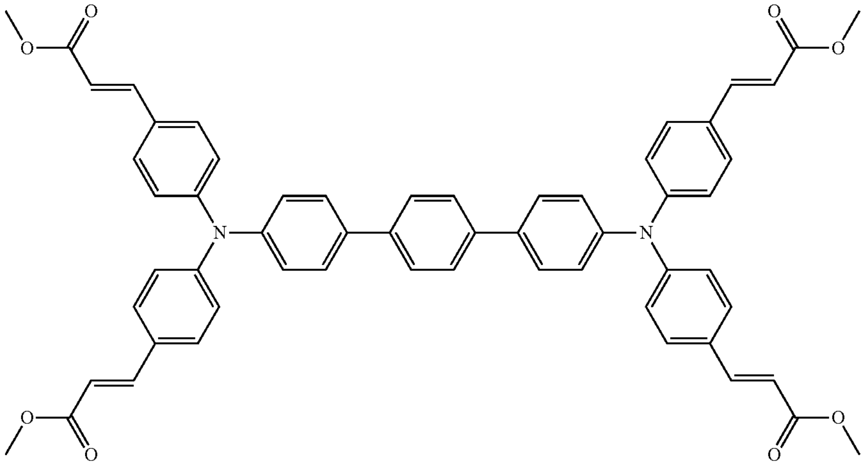 |
| iv-44 | 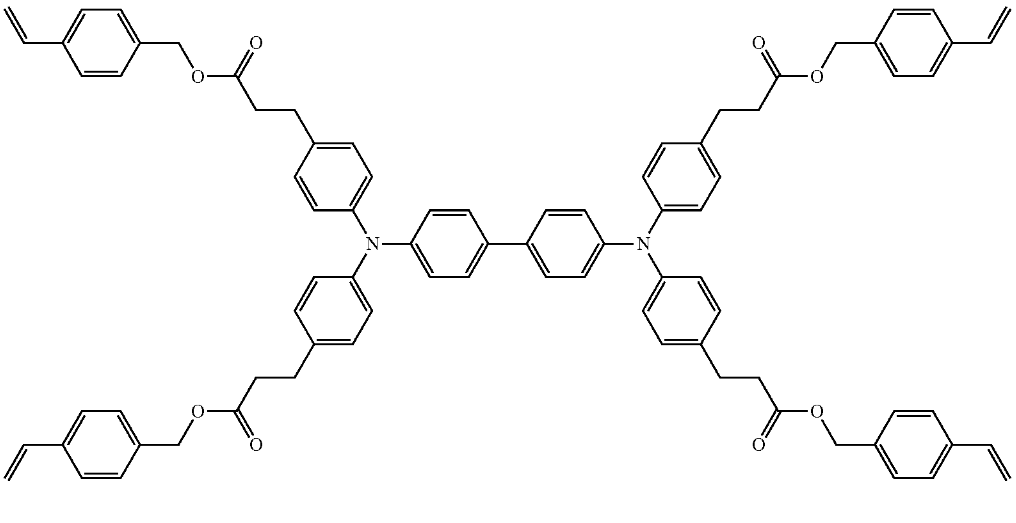 [SMILES: C=Cc1ccc(COC(=O)CCc2ccc(N(c3ccc(CCC(=O)OCc4ccc(C=C)cc4)cc3)c3ccc(-c4ccc(N(c5ccc(CCC(=O)OCc6ccc(C=C)cc6)cc5)c5ccc(CCC(=O)OCc6ccc(C=C)cc6)cc5)cc4)cc3)cc2)cc1] |

-continued
| No. | |
|---|---|
| iv-45 | 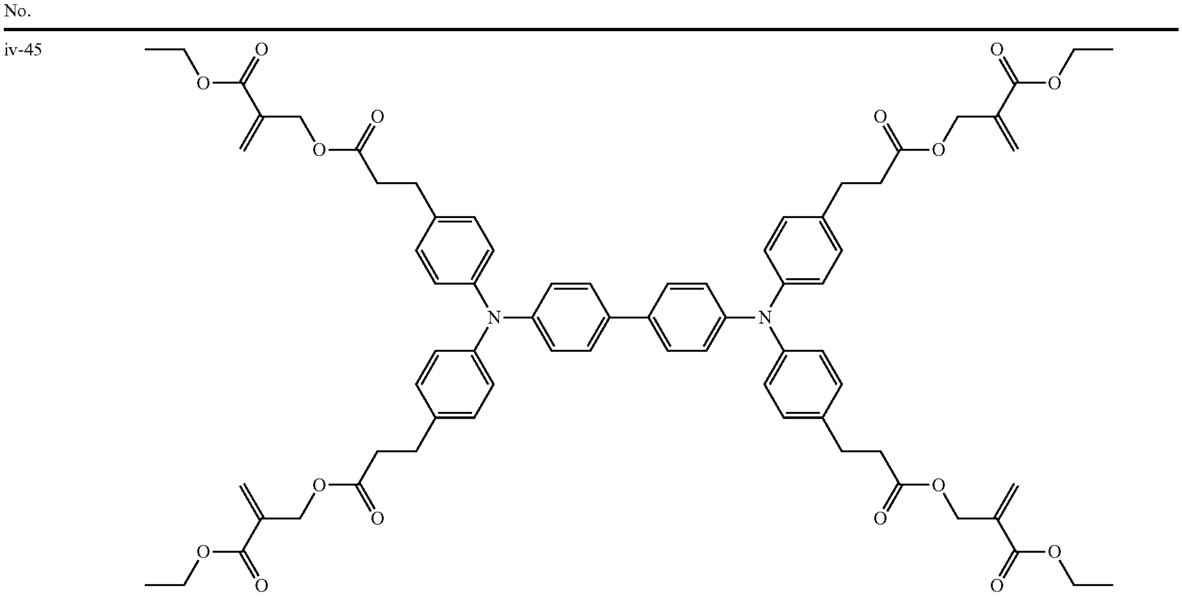 |
| iv-46 | 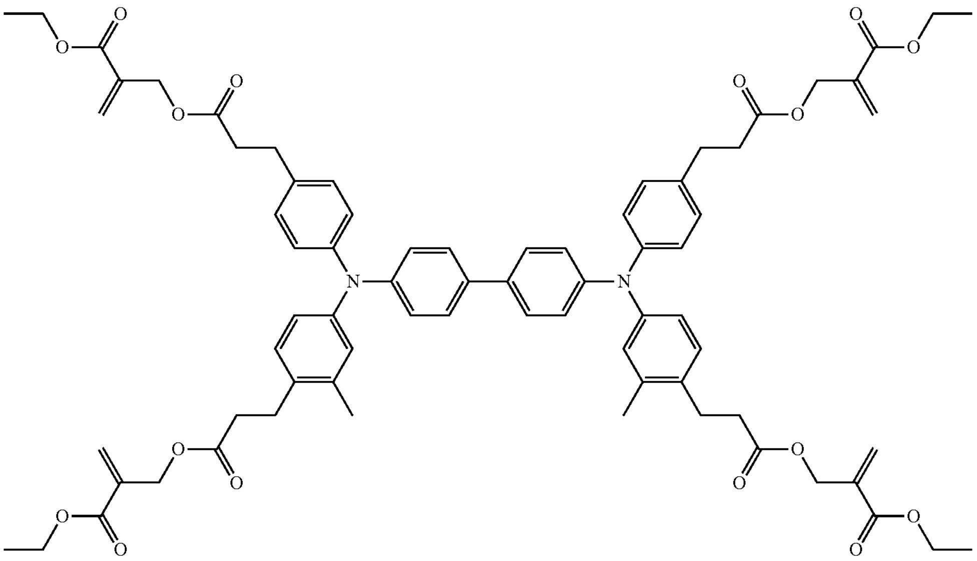 [SMILES: C=C(COC(=O)CCc1ccc(N(c2ccc(-c3ccc(N(c4ccc(CCC(=O)OCC(=C)C(=O)OCC)cc4)c4ccc(CCC(=O)OCC(=C)C(=O)OCC)c(C)c4)cc3)cc2)c2ccc(CCC(=O)OCC(=C)C(=O)OCC)c(C)c2)cc1)C(=O)OCC] |
| iv-47 | 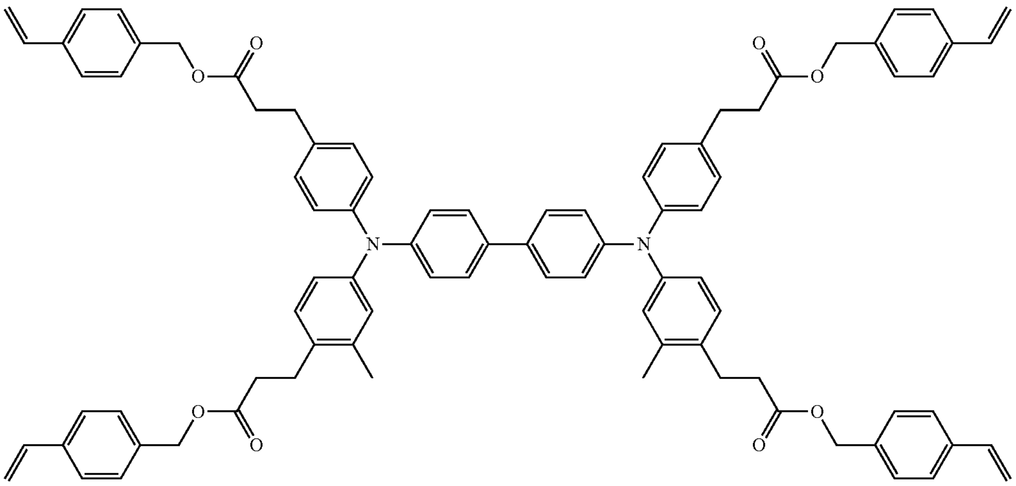 [SMILES: C=Cc1ccc(COC(=O)CCc2ccc(N(c3ccc(-c4ccc(N(c5ccc(CCC(=O)OCc6ccc(C=C)cc6)cc5)c5ccc(CCC(=O)OCc6ccc(C=C)cc6)c(C)c5)cc4)cc3)c3ccc(CCC(=O)OCc4ccc(C=C)cc4)c(C)c3)cc2)cc1] |

-continued
| No. | |
|---|---|
| iv-48 | 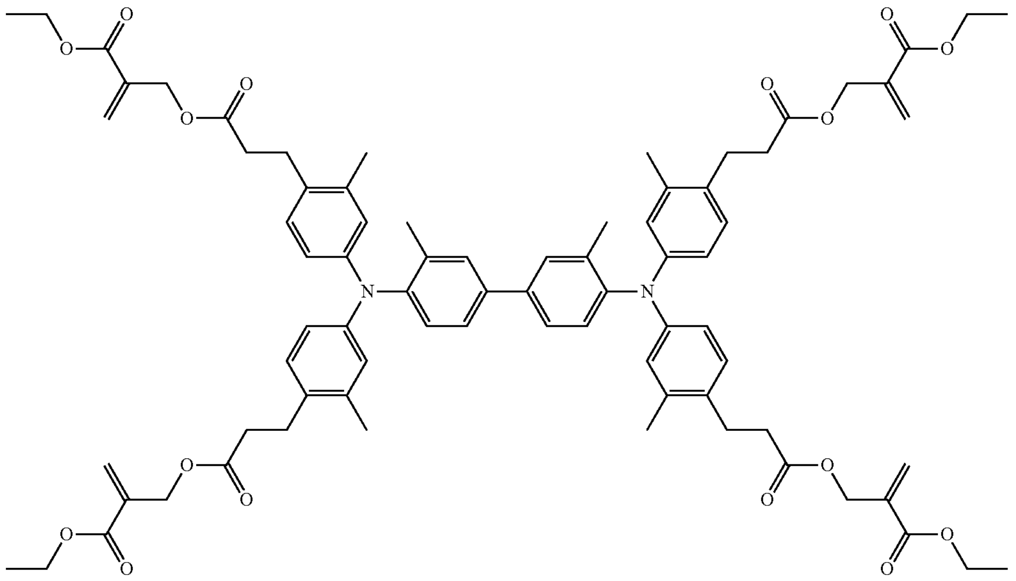 [SMILES: C=C(COC(=O)CCc1ccc(N(c2ccc(CCC(=O)OCC(=C)C(=O)OCC)c(C)c2)c2ccc(-c3ccc(N(c4ccc(CCC(=O)OCC(=C)C(=O)OCC)c(C)c4)c4ccc(CCC(=O)OCC(=C)C(=O)OCC)c(C)c4)c(C)c3)cc2C)cc1C)C(=O)OCC] |
| iv-49 | 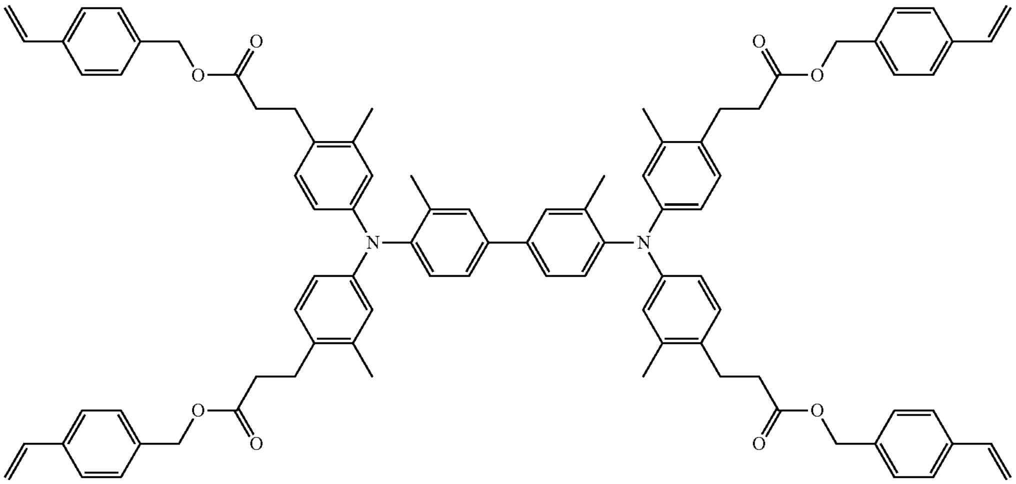 [SMILES: C=Cc1ccc(COC(=O)CCc2ccc(N(c3ccc(CCC(=O)OCc4ccc(C=C)cc4)c(C)c3)c3ccc(-c4ccc(N(c5ccc(CCC(=O)OCc6ccc(C=C)cc6)c(C)c5)c5ccc(CCC(=O)OCc6ccc(C=C)cc6)c(C)c5)c(C)c4)cc3C)cc2C)cc1] |
| v-2 | 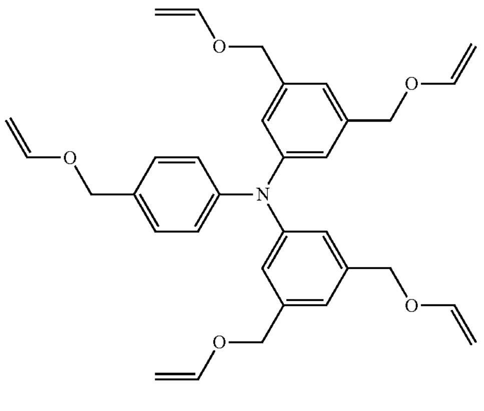 [SMILES: C=COCc1ccc(N(c2cc(COC=C)cc(COC=C)c2)c2cc(COC=C)cc(COC=C)c2)cc1] |

-continued
| No. | |
|---|---|
| v-3 | 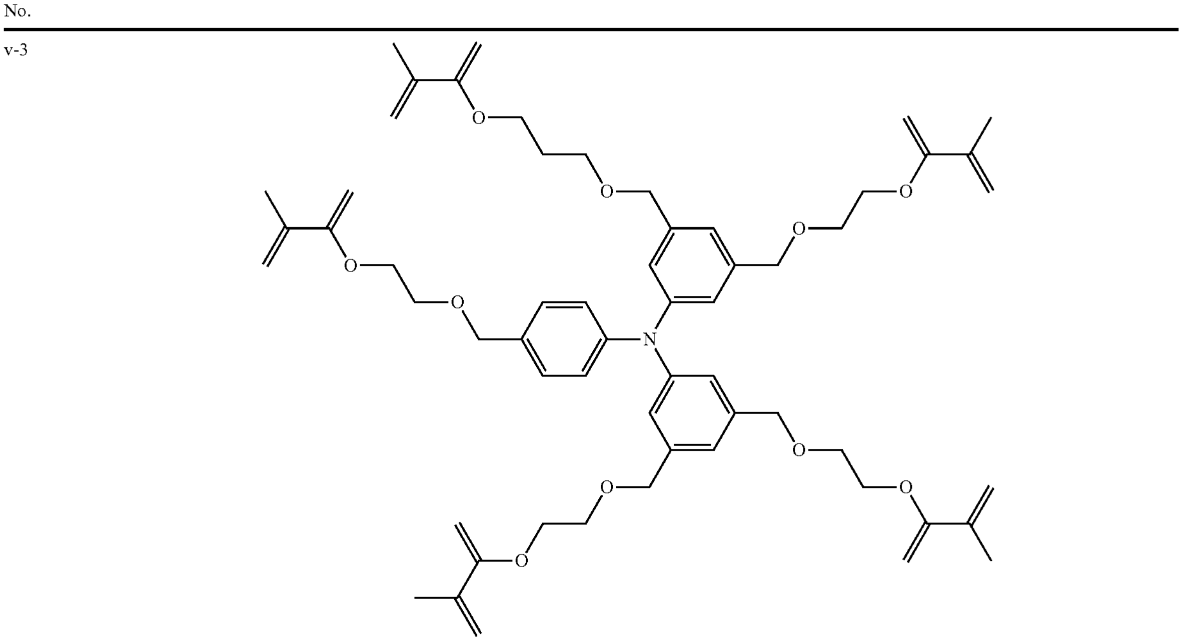 |
| vi-3 | 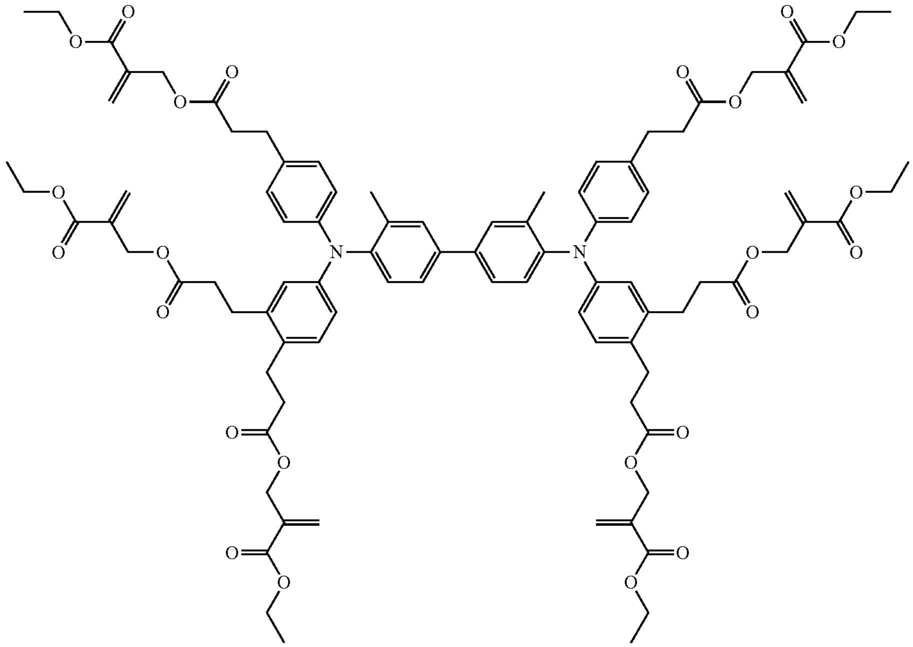 [SMILES: C=C(COC(=O)CCc1ccc(N(c2ccc(CCC(=O)OCC(=C)C(=O)OCC)c(CCC(=O)OCC(=C)C(=O)OCC)c2)c2ccc(-c3ccc(N(c4ccc(CCC(=O)OCC(=C)C(=O)OCC)cc4)c4ccc(CCC(=O)OCC(=C)C(=O)OCC)c(CCC(=O)OCC(=C)C(=O)OCC)c4)c(C)c3)cc2C)cc1)C(=O)OCC] |

-continued
| No. | |
|---|---|
| vi-4 | 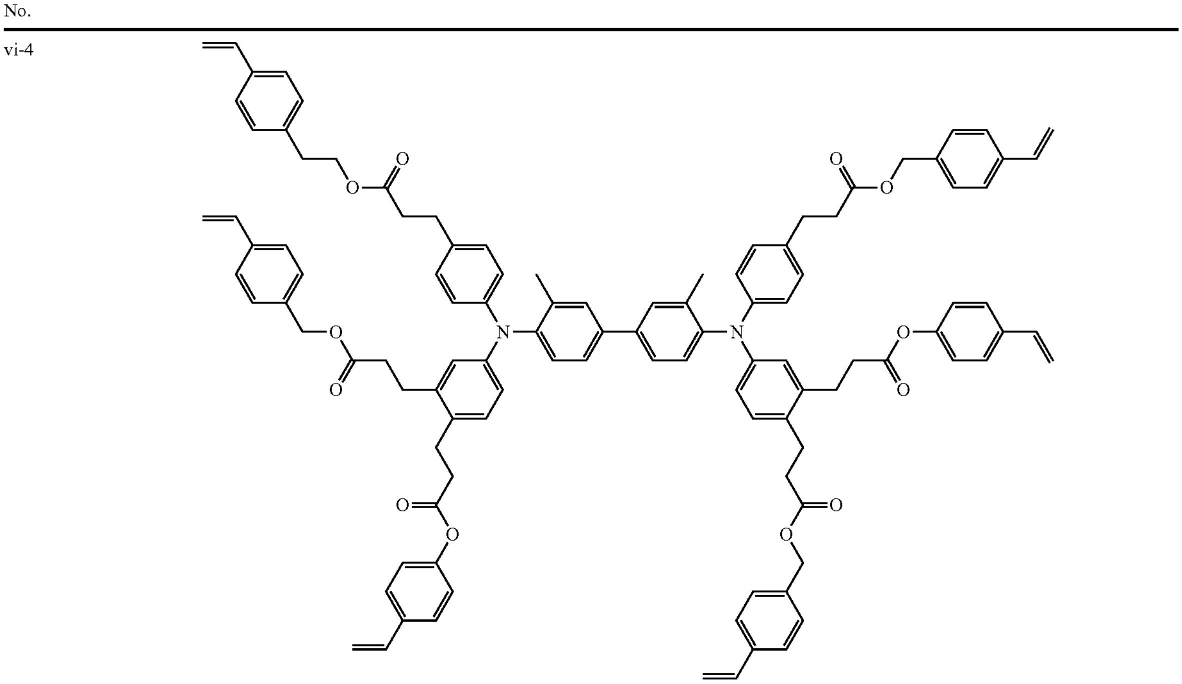 |
| vi-5 | 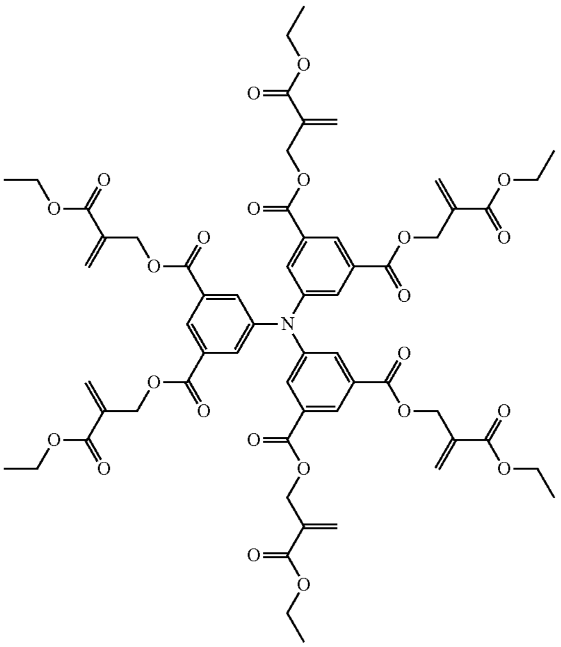 [SMILES: C=C(COC(=O)c1cc(C(=O)OCC(=C)C(=O)OCC)cc(N(c2cc(C(=O)OCC(=C)C(=O)OCC)cc(C(=O)OCC(=C)C(=O)OCC)c2)c2cc(C(=O)OCC(=C)C(=O)OCC)cc(C(=O)OCC(=C)C(=O)OCC)c2)c1)C(=O)OCC] |

-continued

| No. | |
|---|---|
| vi-6 | 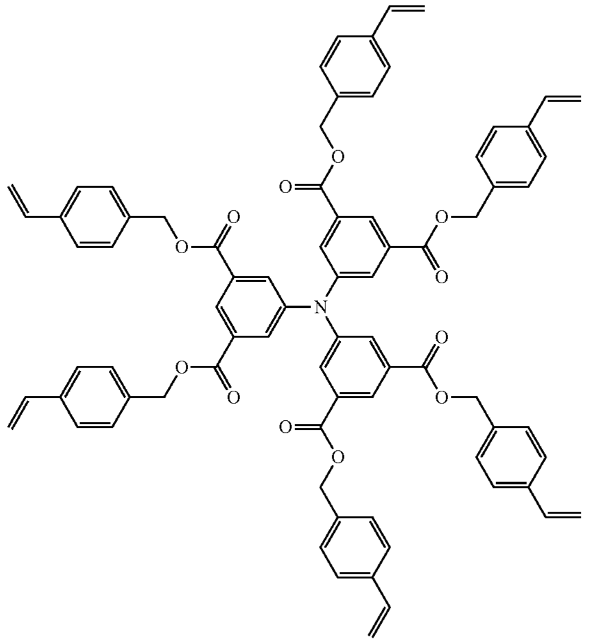 [SMILES: C=Cc1ccc(COC(=O)c2cc(C(=O)OCc3ccc(C=C)cc3)cc(N(c3cc(C(=O)OCc4ccc(C=C)cc4)cc(C(=O)OCc4ccc(C=C)cc4)c3)c3cc(C(=O)OCc4ccc(C=C)cc4)cc(C(=O)OCc4ccc(C=C)cc4)c3)c2)cc1] |

The total content of the charge transporting material having a chain polymerizable functional group is preferably 40% by weight or more, more preferably 50% by weight or more, and still more preferably 60% by weight or more, with respect to the weight of the composition used for forming the protective layer.

When the total content of the charge transporting material having a chain polymerizable functional group is within the above range, a thick cured film having excellent electrical characteristics may be obtained.

In the exemplary embodiment of the invention, the charge transporting material having a chain polymerizable functional group and a known charge transporting material having no reactive group may be used in combination. Since, a reactive group, which is not involved in charge transportation, is not contained in the charge transporting material having no reactive group, the concentration of a component of a charge transporting material is substantially increased, and thereby effectively improving the electrical characteristics.

Examples of the known charge transporting materials include charge transporting materials such as those constituting the above-described charge transport layer 3.

Hereinbelow, other components that can be used in the composition used for forming the protective layer are described.

The composition used for forming the protective layer may contain a surfactant in order to improve a film-forming property.

Examples of the surfactant include a surfactant that contains, in the molecule thereof, at least one of a structure (A) obtained by polymerizing an acryl monomer having a fluorine atom, a structure (B) having a carbon-carbon double bond and a fluorine atom, an alkylene oxide structure (C), or a structure having a carbon-carbon triple bond and a hydroxyl group.

The surfactant may contain at least one of selected from the structures (A) to (D), or may contain two or more of the structures (A) to (D) in the molecule thereof.

Hereinbelow, the structures (A) to (D) and the surfactant having these structures are described.

Structure (A) Obtained by Polymerizing an Acrylic Monomer Having a Fluorine Atom The structure (A) obtained by polymerizing an acrylic monomer having a fluorine atom is not particularly limited, and is preferably a structure obtained by polymerizing an acrylic monomer having a fluoro alkyl group, and more preferably a structure obtained by polymerizing an acrylic monomer having a perfluoroalkyl group.

Specific examples of the surfactant having structure (A) include POLYFLOW KL-600 (manufactured by Kyoeisha Chemical Co., Ltd.); and EFTOP EF-351, EF-352, EF-801, EF-802, and EF-601 (manufactured by Mitsubishi Materials Electronic Chemicals Co., Ltd).

Structure (B) Having a Carbon-Carbon Double Bond and a Fluorine Atom

The structure (B) having a carbon-carbon double bond and a fluorine atom is not particularly limited, and is preferably a group represented by at least one of the following Structural Formula (B1) or (B2).

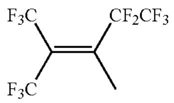

(B1)

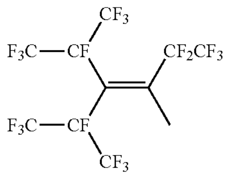

(B2)

The surfactant having the structure (B) is preferably a compound having at least one of Structural Formula (B1) or (B2) in a side chain of an acrylic polymer, or a compound having at least one selected form the following Structural Formulae (B3) to (B5).

When the surfactant having the structure (B) is the compound having at least one of Structural Formula (B1) or (B2) in a side chain of an acrylic polymer, a uniform outermost surface layer may be formed since an acrylic structure easily soluble in other components in the composition.

When the surfactant having the structure (B) is the compound having at least one selected from Structural Formulae (B3) to (B5), repelling at the time of applying may be prevented and defects in the coated film may be suppressed.

(B3)

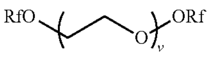

(B4)

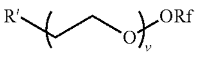

(B5)

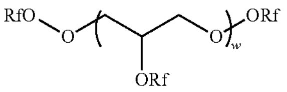

In Structural Formulae (B3) to (B5), v and w each independently represent an integer of 1 or more and R' represents a hydrogen atom or a monovalent organic group; each Rf independently represents a group represented by Structural Formula (B1) or (B2).

In Structural Formulae (B3) to (B5), examples of monovalent organic groups represented by R' include an alkyl group having 1 to 30 carbon atoms and a hydroxyalkyl group having 1 to 30 carbon atoms.

Examples of the commercial product of the surfactant having the structure (B) include the followings.

Examples of compounds represented by any of Structural Formulae (B3) to (B5) include: FTERGENT 100, 100C, 110, 140A, 150, 150CH, A-K, 501, 250, 251, 222F, FTX-218, 300, 310, 400SW, 212M, 245M, 290M, FTX-207S, FTX-211S, FTX-220S, FTX-230S, FTX-209F, FTX-213F, FTX-222F, FTX-233F, FTX-245F, FTX-208G, FTX-218G, FTX-230G, FTX-240G, FTX-204D, FTX-280D, FTX-212D, FTX-216D, FTX-218D, FTX-220D and FTX-222D (manufactured by NEOS COMPANY LIMITED).

Examples of compounds having at least one of Structural Formula (B1) or (B2) in a side chain of an acrylic polymer include: KB-L82, KB-L85, KB-L97, KB-L109, KB-L110, KB-F2L, KB-F2M, KB-F2S, KB-F3M, and KB-FaM (manufactured by NEOS COMPANY LIMITED).

Alkylene Oxide Structure (C)

Examples of the alkylene oxide structure (C) include an alkylene oxide and a polyalkylene oxide. Specific examples of the alkylene oxide include an ethyleneoxide and a propylene oxide. The alkylene oxide structure (C) may be a polyalkylene oxide in which the number of repetition of the alkylene oxides is from 2 to 10000.

Examples of the surfactant having the alkylene oxide structure (C) include polyethylene glycol, a polyether antifoaming agent, and a polyether modified silicone oil.

It is preferable that the polyethylene glycol has an average molecular weight of 2000 or less. Examples of polyethylene glycols having an average molecular weight of 2000 or less include polyethylene glycol 2000 (average molecular weight: 2000), polyethylene glycol 600 (average molecular weight: 600), polyethylene glycol 400 (average molecular weight: 400), and polyethylene glycol 200 (average molecular weight: 200).

Preferable examples thereof include polyether antifoaming agents such as PE-M and PE-L (manufactured by Wako Pure Chemical Industries, Ltd.); and SHOHOZAI No. 1 and SHOHOZAI No. 5 (manufactured by Kao Corporation).

Examples of the surfactant containing a fluorine atom in the molecule in addition to the alkylene oxide structure (C) include a surfactant having an alkylene oxide or polyalkylene oxide in a side chain of a polymer having a fluorine atom, and a surfactant in which the end of an alkylene oxide or polyalkylene oxide is substituted by a substituent group containing a fluorine atom.

Specific examples of the surfactant containing a fluorine atom in the molecule in addition to the alkylene oxide structure (C) include MEGAFAC F-443, F-444, F-445 and F-446 (manufactured by DIC Corporation); and FTERGENT 250, 251, and 222F (manufactured by NEOS COMPANY LIMITED); and POLY FOX PF636, PF6320, PF6520, and PF656 (manufactured by KITAMURA CHEMICALS CO., LTD).

Specific examples of the surfactant containing a silicone structure in the molecule in addition to the alkylene oxide structure (C) include KF351 (A), KF352 (A), KF353 (A), KF354 (A), KF355 (A), KF615 (A), KF618, KF945 (A), and KF6004 (manufactured by Shin-Etsu Chemical Co., Ltd.); TSF4440, TSF4445, TSF4450, TSF4446, TSF4452, TSF4453, and TSF4460 (manufactured by GE Toshiba Silicones); and BYK-300, 302, 306, 307, 310, 315, 320, 322, 323, 325, 330, 331, 333, 337, 341, 344, 345, 346, 347, 348, 370, 375, 377, 378, UV3500, UV3510, and UV3570 (manufactured by BYK Chemie Japan).

Structure (D) Having a Carbon-Carbon Triple Bond and a Hydroxyl Group

The structure (D) having a carbon-carbon triple bond and a hydroxyl group is not particularly limited, and Examples thereof include the following compounds.

Examples of the surfactant having the structure (D) having a carbon-carbon triple bond and a hydroxyl group include compounds having a triple bond and a hydroxyl group in the molecule. Specific examples thereof include 2-propyne-1-ol, 1-butyne-3-ol, 2-butyne-1-ol, 3-butyne-1-ol, 1-pentyne-3-ol, 2-pentyne-1-al, 3-pentyne-1-al, 4-pentyne-1-ol, 4-pentyne-2-ol, 1-hexyne-3-ol, 2-hexyne-1-ol, 3-hexyne-1-al, 5-hexyne-1-ol, 5-hexyne-3-ol, 1-heptyne-3-ol, 2-heptyne-1-ol, 3-heptyne-1-ol, 4-heptyne-2-ol, 5-heptyne-3-ol, 1-octyne-3-ol, 3-octyne-1-ol, 3-nonyne-1-al, 2-decyne-1-ol, 3-decyne-1-ol, 10-undecyne-1-ol, 3-methyl-1-butyne-3-al, 3-methyl-1-pentene-4-yne-3-ol, 3-methyl-1-pentyne-3-ol, 5-methyl-1-hexyne-3-ol, 3-ethyl-1-pentyne-3-ol, 3-ethyl-1-heptyne-3-ol, 4-ethyl-1-octyne-3-ol, 3,4-dimethyl-1-pentyne-3-ol, 3,5-dimethyl-1-hexyne-3-ol, 3,6-dimethyl-1-heptyne-3-ol, 2,2,8,8-tetramethyl-3,6-nonadiyne-5-ol, 4,6-nonadecadiyne-1-ol, 10,12-pentacosadiyne-1-ol, 2-butyne-1,4-diol, 3-hexyne-2,5-diol, 2,4-hexadiyne-1,6-diol, 2,5-dimethyl-3-hexyne-2,5-diol, 3,6-dimethyl-4-octyne-3,6-diol, 2,4,7,9-tetramethyl-5-decyne-4,7-diol, (+)-1,6-bis(2-chlorophenyl)-1,6-diphenyl-2,4-hexadiyne-1,6-diol, (−)-1,6-bis(2-chlorophenyl)-1,6-diphenyl-2,4-hexadiyne-1,6-diol, 2-butyne-1,4-diol bis(2-hydroxyethyl), 1,4-diacetoxy-2-butyne, 4-diethylamino-2-butyne-1-ol, 1,1-diphenyl-2-propyne-1-ol, 1-ethynyl-1-cyclohexanol, 9-ethynyl-9-fluorenol, 2,4-hexadiynediyl-1,6-bis(4-phenylazobenzenesulfonate), 2-hydroxy-3-butynoate, ethyl 2-hydroxy-3-butynoate, 2-methyl-4-phenyl-3-butyne-2-ol, methyl proparagyl ether, 5-phenyl-4-pentyne-1-ol, 1-phenyl-1-propyne-3-ol, 1-phenyl-2-propyne-1-ol, 4-trimethyl silyl-3-butyne-2-ol, and 3-trimethylsilyl-2-propyne-1-ol.

Examples thereof further include compounds obtained by addition of an alkylene oxide such as ethylene oxide to some or all of the hydroxyl groups in the compounds above (such as SURFYNOL 400 SERIES; trade name, manufactured by Shin-Etsu Chemical Co., Ltd.).

A surfactant having the structure (D) having a carbon-carbon triple bond and a hydroxyl group is preferably a compound represented by the following Formula (D1) or (D2).

(D1)

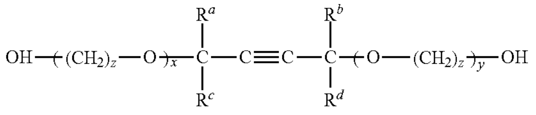

(D2)

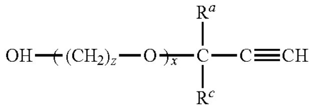

In Formulae (D1) and (D2), $R^a$, $R^b$, $R^c$, and $R^d$ each independently represent a monovalent organic group; x, y and z each independently represent an integer of 1 or more.

The compound represented by Formula (D1) or (D2) is preferably a compound in which $R^a$, $R^b$, $R^c$ and $R^d$ represent an alkyl group. It is more preferable that the compound represented by Formula (D1) or (D2) is a compound in which at least one of $R^a$ or $R^b$, or at least one of $R^c$ or $R^d$ represents a branched alkyl group. z is preferably from 1 to 10. x preferably represents an integer of from 1 to 500, and y preferably represents an integer of from 1 to 500.

Examples of commercial products of the compound represented by Formula (D1) or (D2) include SURFYNOL 400 series (manufactured by Shin-Etsu Chemical Co., Ltd.).

The surfactants having structures (A) to (D) may be used singly or in combination of two or more kinds thereof. When multiple surfactants are mixed and used, an additional surfactant having a structure different from that of surfactants having structures (A) to (D) may be used together, as far as the effect of the invention is not impaired.

Examples of the surfactant that may be additionally used in combination include surfactants having a fluorine atom and surfactants having a silicone structure as described below.

More specifically, preferable examples of the surfactant having a fluorine atom which can be used in combination with the surfactants having structures (A) to (D) include perfluoroalkyl sulfonic acids (such as perfluorobutane sulfonic acid and perfluorooctane sulfonic acid), perfluoroalkyl carboxylic acids (such as perfluorobutane carboxylic acid and perfluorooctane carboxylic acid), and perfluoroalkyl group containing phosphates. Perfluoroalkyl sulfonic acids and perfluoroalkyl carboxylic acids may be salts thereof or amide modified products thereof.

Examples of commercial products of perfluoroalkyl sulfonic acid include MEGAFAC F-114 (manufactured by DIC Corporation); EFTOP EF-101, EF102, EF-103, EF-104, EF-105, EF-112, EF-121, EF-122A, EF-122B, EF-122C, and EF-123A (manufactured by Mitsubishi Materials Electronic Chemicals Co., Ltd); and FTERGENT 100, 100C, 110, 140A, 150, 150CH, A-K, and 501 (manufactured by NEOS COMPANY LIMITED).

Examples of commercial products of perfluoroalkyl carboxylic acid include MEGAFAC F-410 (manufactured by DIC Corporation); and EFTOP EF-201 and EF-204 (manufactured by Mitsubishi Materials Electronic Chemicals Co., Ltd).

Examples of commercial products of perfluoroalkyl group containing phosphate include MEGAFAC F-493 and F-494 (manufactured by DIC Corporation); and EFTOP EF-123A, EF-123B, EF-125M, and EF-132 (manufactured by Mitsubishi Materials Electronic Chemicals Co., Ltd).

The surfactant having a fluorine atom which is additionally used in combination with the surfactants having structures (A) to (D) is not limited to those examples. For example, a compound having a betaine structure containing a fluorine atom (such as FTERGENT 400SW, trade name; manufactured by NEOS COMPANY LIMITED) and a surfactant having an amphoteric ion group (such as FTERGENT SW, trade name; manufactured by NEOS COMPANY LIMITED) are suitably used.

Examples of the surfactant having a silicone structure which is additionally used in combination with the surfactants having structures (A) to (D) include general silicone oils such as dimethyl silicone, methylphenyl silicone, diphenyl silicone, or the modified compounds thereof.

The total content of the surfactant is preferably from 0.01% by weight to 1% by weight, and more preferably from 0.02% by weight to 0.5% by weight, with respect to the total solid content of the protective layer (outermost surface layer) 5. When the content of the surfactant is 0.01% or more, effects of preventing defects in the coated film may be obtained. When the content of the surfactant is 1% by weight or less, separation of the surfactant and the curing component (such as the compound represented by Formula (I), or other monomers or oligomers) may be suppressed, and a cured film with sufficient strength may be produced.

The total content of the surfactants having structures (A) to (D) in all of the surfactants is preferably 1% by weight or more, and more preferably 10% by weight or more.

The composition used for forming a protective layer may contain a radical polymerizable monomer or oligomer, which does not have charge transportability, for the purpose of controlling viscosity of the composition, mechanical strength of a film, flexibility, smoothness and cleaning property.

Examples of a monofunctional radical polymerizable monomer include isobutyl acrylate, t-butyl acrylate, isooctyl acrylate, lauryl acrylate, stearyl acrylate, isobornyl acrylate, cyclohexyl acrylate, 2-methoxyethyl acrylate, methoxytriethylene glycol acrylate, 2-ethoxyethyl acrylate, tetrahydrofurfuryl acrylate, benzyl acrylate, ethylcarbitol acrylate, phenoxyethyl acrylate, 2-hydroxyethyl acrylate, 2-hydroxypropyl acrylate, 4-hydroxybutyl acrylate, methoxypolyethylene glycol acrylate, methoxypolyethylene glycol methacrylate, phenoxypolyethylene glycol acrylate, phenoxypolyethylene glycol methacrylate, hydroxyethyl o-phenylphenol acrylate, and o-phenylphenolglycidylether acrylate.

Examples of a bifunctional radical polymerizable monomer include 1,4-butanediol diacrylate, 1,6-hexanediol diacrylate, 1,9-nonanediol diacrylate, 2-n-butyl-2-ethyl-1,3-propanediol diacrylate, tripropylene glycol diacrylate, tetraethylene glycol diacrylate, dioxane glycol diacrylate, polytetramethylene glycol diacrylate, ethoxylated bisphenol A diacrylate, ethoxylated bisphenol A dimethacrylate, tricyclodecanemethanol diacrylate and tricyclodecanemethanol dimethacrylate.

Examples of a tri- or higher functional radical polymerizable monomer include trimethylolpropane triacrylate, trimethylolpropane trimethacrylate, pentaerythritol acrylate, trimethylolpropane EO-added triacrylate, glycerin PO-added triacrylate, tris(acryloyloxyethyl) phosphate, pentaerythritol tetraacrylate and ethoxylated isocyanuric acid triacrylate.

Examples of the radical polymerizable oligomer include epoxy acrylate oligomers, urethane acrylate oligomers and polyester acrylate oligomers.

The content of the radical polymerizable monomer or oligomer that does not have charge transportability is preferably from 0% by weight to 50% by weight, more preferably from 0% by weight to 40% by weight, and still more preferably from 0% by weight to 30% by weight, with respect to the total solid content of the composition.

It is preferable that the composition used for forming a protective layer contain a thermal radical initiator.

The cured film (cross-linked film) which constitutes the protective layer (outermost surface layer) is obtained by curing the composition containing each component described above by various methods such as heat, light, or electron rays. In order to achieve the appropriate balance between characteristics such as electrical characteristics and mechanical strength of the cured film, the heat curing method is preferable. In general, in order to cure ordinary acrylic coating materials, the electron ray curing method which may cure without a catalyst and the photopolymerization method which may cure in a short time are preferably used. However, in the electrophotographic photoreceptor, a photosensitive layer on which the outermost surface layer is formed contains a photosensitive material. Therefore, in order to reduce the damage to the photosensitive material, or improve the property of the surface of the obtained cured film, the heat curing method by which the reaction proceeds moderately is preferable.

Therefore, the heat curing may be performed without using a catalyst. It is preferable to use the above thermal radical initiator as a catalyst.

The thermal radical initiator is not particularly limited. In order to suppress the damage of the photosensitive material in the photosensitive layer at the time of forming the protective layer, a thermal radical initiator with a 10-hour half-life period temperature of from 40° C. to 110° C. is preferable.

Examples of commercially available thermal radical initiator include: azo initiators such as V-30 (10-hour half-life period temperature: 104° C.), V-40 (88° C.), V-59 (67° C.), V-601 (66° C.), V-65 (51° C.), V-70 (30° C.), VF-096 (96° C.), Vam-110 (111° C.) and Vam-111 (111° C.) (trade name, all manufactured by Wako Pure Chemical Industries Ltd.), and $OT_{AZO}$-15 (10-hour half-life period temperature: 61° C.), $OT_{AZO}$-30, AIBM (65° C.), AMBN (67° C.), ADVN (52° C.) and ACVA (68° C.) (trade name, all manufactured by Otsuka Pharmaceutical Co., Ltd.);

PERTETRA A, PERHEXA HC, PERHEXA C, PERHEXA V, PERHEXA 22, PERHEXA MC, PERBUTYL H, PERCUMYL H, PERCUMYL P, PERMENTA H, PEROCTA H, PERBUTYL C, PERBUTYL D, PERHEXYL D, PERLOYL IB, PERLOYL 355, PERLOYL L, PERLOYL SA, NIPER BW, NIPER BMT-K40/M, PERLOYL IPP, PERLOYL NPP, PERLOYL TCP, PERLOYL OPP, PERLOYL SBP, PERCUMYL ND, PEROCTA ND, PERHEXYL ND, PERBUTYL ND, PERBUTYL NHP, PERHEXYL PV, PERBUTYL PV, PERHEXA 250, PEROCTA O, PERHEXYL O, PERBUTYL O, PERBUTYL L, PERBUTYL 355, PERHEXYL I, PERBUTYL I, PERBUTYL E, PERHEXA 25Z, PERBUTYL A, PERHEXYL Z, PERBUTYL ZT and PERBUTYL Z (trade name, all manufactured by Nippon Oil & Fats Co., Ltd.); KAYAKETAL AM-055, TRIGONOX 36-C75, LAUROX, PERKADOX L-W75, PERKADOX CH-50L, TRIGONOX TMBH, KAYACUMEN H, KAYABUTYL H-70, PERKADOX BC-FF, KAYAHEXA AD, PERKADOX 14, KAYABUTYL C, KAYABUTYL D, KAYAHEXA YD-E85, PERKADOX 12-XL25, PERKADOX 12-EB20, TRIGONOX 22-N70, TRIGONOX 22-70E, TRIGONOX D-T50, TRIGONOX 423-C70, KAYAESTER CND-C70, KAYAESTER CND-W50, TRIGONOX 23-C70, TRIGONOX 23-W50N, TRIGONOX 257-C70, KAYAESTER P-70, KAYAESTER TMPO-70, TRIGONOX 121, KAYAESTER O, KAYAESTER HTP-65W, KAYAESTER AN, TRIGONOX 42, TRIGONOX F-050, KAYABUTYL B, KAYACARBON EH-C70, KAYACARBON EH-W60, KAYACARBON I-20, KAYACARBON BIC-75, TRIGINOX 117 and KAYAREN 6-70 (trade name, all manufactured by Kayaku Akzo Corporation); and LUPEROX LP (10-hour half-life period temperature: 64° C.), LUPEROX 610 (37° C.), LUPEROX 188 (38° C.), LUPEROX 844 (44° C.), LUPEROX 259 (46° C.), LUPEROX 10 (48° C.), LUPEROX 701 (53° C.), LUPEROX 11 (58° C.), LUPEROX 26 (77° C.), LUPEROX 80 (82° C.), LUPEROX 7 (102° C.), LUPEROX 270 (102° C.), LUPEROX P (104° C.), LUPEROX 546 (46° C.), LUPEROX 554 (55° C.), LUPEROX 575 (75° C.), LUPEROX TANPO (96° C.), LUPEROX 555 (100° C.), LUPEROX 570 (96° C.), LUPEROX TAP (100° C.), LUPEROX TBIC (99° C.), LUPEROX TBEC (100° C.), LUPEROX 7W (100° C.), LUPEROX TAIC (96° C.), LUPEROX TAEC (99° C.), LUPEROX DC (117° C.), LUPEROX 101 (120° C.), LUPEROX F (116° C.), LUPEROX DI (129° C.), LUPEROX 130 (131° C.), LUPEROX 220 (107° C.), LUPEROX 230 (109° C.), LUPEROX 233 (114° C.), and LUPEROX 531 (93° C.) (trade name, all manufactured by Arkema Yoshitomi Ltd.).

The content of the thermal radical initiator is preferably from 0.001% by weight to 10% by weight, more preferably from 0.01% by weight to 5% by weight, and still more preferably from 0.1% by weight to 3% by weight, with respect to reactive compounds in the composition used for forming a protective layer.

The composition used for forming the protective layer may contain a thermosetting resin such as a phenol resin, a melamine resin or a benzoguanamine resin, for the purpose of effectively inhibiting oxidation caused by the generated gas by suppressing excessive absorption of gas generated by discharge.

The composition used for forming the protective layer may contain a coupling agent, a hard-coating agent or a fluorine-containing compound in order to adjust a forming property, flexibility, lubricity, or adhesive property of a film. Specific examples thereof include various silane coupling agents and commercially available silicone hard-coating agents.

Examples of the silane coupling agent include vinyltrichlorosilane, vinyltrimethoxysilane, vinyltriethoxysilane, γ-glycidoxypropylmethyldiethoxysilane, γ-glycidoxypropyltrimethoxysilane, γ-aminopropyltriethoxysilane, γ-aminopropyltrimethoxysilane, γ-aminopropylmethyldimethoxysilane, N-β-(aminoethyl)-γ-aminopropyltriethoxysilane, tetramethoxysilane, methyltrimethoxysilane, and dimethyldimethoxysilane.

Examples of the commercially available hard-coating agent include KP-85, X-40-9740 and X-8239 (trade name, all manufactured by Shin-Etsu Silicone Co., Ltd.) and AY42-440, AY42-441 and AY49-208 (trade name, all manufactured by Dow Corning Toray Co., Ltd.).

Furthermore, in order to impart water repelling property, a fluorine-containing compound such as (tridecafluoro-1,1,2,2-tetrahydrooctyl)triethoxysilane, (3,3,3-trifluoropropyl)trimethoxysilane, 3-(heptafluoroisopropoxy)propyltriethoxysilane, 1H,1H,2H,2H-perfluoroalkyltriethoxysilane, 1H,1H,2H,2H-perfluorodecyltriethoxysilane, or 1H,1H,2H,2H-perfluorooctyltriethoxysilane may be added.

An appropriate amount of the silane coupling agent may be used, and an amount of a fluorine-containing compound is preferably set at 0.25 times or less a compound that does not contain fluorine. When the amount is within the above range, the film-forming property of a crosslinked film may be improved.

The composition used for forming the protective layer may contain a thermoplastic resin in order to improve discharge gas resistance, mechanical strength and scratch resistance of the protective layer, to reduce torque, to control a wear amount, to extend a pot-life and to control dispersibility of particles and viscosity.

Examples of the thermoplastic resin include polyvinyl acetal resins (for example, S-LEC B and K (trade name, manufactured by Sekisui Chemical Co., Ltd.)) such as polyvinyl butyral resins, polyvinyl formal resins, or partially acetalized polyvinyl acetal resins in which butyral is partially modified with formal or acetoacetal; polyamide resins; cellulose resins; and polyvinyl phenol resins. In view of electrical characteristics, polyvinyl acetal resins and polyvinyl phenol resins are preferable. A weight average molecular weight of the thermoplastic resin is preferably from 2000 to 100,000, and more preferably from 5,000 to 50,000. When the molecular weight of the thermoplastic resin is 2,000 or more, sufficient effect of the resin may be obtained. When the molecular weight of the thermoplastic resin is 100,000 or less, enough solubility may be ensured an addition amount thereof may not restricted, thereby reducing the film-forming defect during applying. An addition amount of the thermoplastic resin is preferably from 1% by weight to 40% by weight, more preferably from 1% by weight to 30% by weight, and still more preferably from 5% by weight to 20% by weight. When the addition amount of the resin is less than 1% or more, sufficient effect of the resin may be obtained When the addition amount of the thermoplastic resin is 40% by weight or less, image blurring under a high temperature and high humidity (for example, 28° C., 85% RH) environment may be suppressed.

It is preferable that the composition used for forming the protective layer contains an antioxidant in order to inhibit the deterioration of the protective layer caused by an oxidizing gas such as ozone generated by a charging unit. When the lifetime of a photoreceptor is extended by increasing the mechanical strength of a photoreceptor surface, the photoreceptor is in contact with the oxidizing gas over a longer period of time and a higher oxidation resistance is required.

The anti-oxidant is preferably a hindered phenol antioxidant or a hindered amine antioxidant, and a known antioxidant such as an organic sulfur antioxidant, a phosphite antioxidant, a dithiocarbamic acid salt antioxidant, a thiourea antioxidant or a benzimidazole antioxidant may be used. The addition amount of the antioxidant is preferably 20% by weight or less, and more preferably 10% by weight or less.

Examples of the hindered phenol antioxidant include 2,6-di-t-butyl-4-methylphenol, 2,5-di-t-butylhydroquinone, N,N'-hexamethylene bis(3,5-di-t-butyl-4-hydroxy)hydrocinnamide, 3,5-di-t-butyl-4-hydroxy-benzylphosphonate-diethylester, 2,4-bis[(octylthio)methyl]-o-cresol, 2,6-di-t-butyl-4-ethylphenol, 2,2'-methylene bis(4-methyl-6-t-butylphenol), 2,2'-methylene bis(4-ethyl-6-t-butylphenol), 4,4'-butylidene bis(3-methyl-6-t-butylphenol), 2,5-di-t-amylhydroquinone, 2-t-butyl-6-(3-butyl-2-hydroxy-5-methylbenzyl)-4-methylphenyl acrylate, and 4,4'-butylidenebis (3-methyl-6-t-butyl phenol).

The composition used for forming the protective layer may contain various particles in order to reduce residual potential or to improve mechanical strength of the protective layer.

Examples of the particles include a silicon-containing particle. The silicon-containing particle is a particle that contains silicon as a constituent element. Specific examples of the silicon-containing particle include a colloidal silica and a silicone particle. Colloidal silica used as a silicon-containing particle may be a colloidal silica in which silica having an average particle diameter of from 1 nm to 100 nm, preferably from 10 nm to 30 nm, is dispersed in an acidic or alkaline aqueous dispersion, or an organic solvent (such as alcohol, ketone or ester). Commercially available colloidal silica may be used. The solid content of colloidal silica in the protective layer is not particularly limited. From the viewpoints of film-forming property, electrical characteristics and mechanical strength, the solid content of colloidal silica is preferably from 0.1% by weight to 50% by weight, and more preferably from 0.1% by weight to 30% by weight, with respect to the total solid content of the protective layer.

A silicone particle that is used as a silicon-containing particle is selected from a silicone resin particle, a silicone rubber particle and a surface treated silica particle treated with silicone. Commercially available silicone particles may be used. The silicone particle has spherical form and an average particle diameter thereof is preferably from 1 nm to 500 nm, and more preferably from 10 nm to 100 nm. Since the silicone particle is a chemically inactive fine particle having excellent dispersibility in a resin, the content required for obtaining sufficient characteristics is low. Therefore, when the silicone particle is used, a surface property of an electrophotographic photoreceptor may be improved without disturbing a crosslinking reaction. That is, the silicone particle is evenly distributed in a strong crosslinking structure, and may improve lubricity and water repelling property of the electrophotographic photoreceptor surface and maintain wear resistance and resistance for attachment of contaminant over a long period of time.

The content of silicone particles in the protective layer is preferably from 0.1% by weight to 30% by weight, and more preferably from 0.5% by weight to 10% by weight, with respect to the total solid content of the protective layer.

Examples of the other particles include fluorine-containing particles such as a particle of tetrafluoroethylene, trifluoroethylene, hexafluoropropylene, vinyl fluoride, or vinylidene fluoride; particles of resins obtained by copolymerizing a fluororesin and a monomer having a hydroxy group such as those described in "Preprints of the 8th Polymer Material Forum, p. 89"; and semiconductive metal oxides such as $ZnO—Al_2O_3$, $SnO_2—Sb_2O_3$, $In_2O_3—SnO_2$, $ZnO_2—TiO_2$, $ZnO—TiO_2$, $MgO—Al_2O_3$, $FeO—TiO_2$, $TiO_2$, $SnO_2$, $In_2O_3$, ZnO and MgO. Furthermore, oil such as silicone oil may be added for the same purpose. Examples of silicone oil include silicone oils such as dimethylpolysiloxane, diphenylpolysiloxane and phenylmethylsiloxane; reactive silicone oils such as amino-modified polysiloxane, epoxy-modified polysiloxane, carboxyl-modified polysiloxane, carbinol-modified polysiloxane, methacryl-modified polysiloxane, mercapto-modified polysiloxane and phenol-modified polysiloxane; cyclic dimethylcyclosiloxanes such as hexamethylcyclotrisiloxane, octamethylcyclotetrasiloxane, decamethylcyclopentasiloxane and dodecamethylcyclohexasiloxane; cyclic methylphenylcyclosiloxanes such as 1,3,5-trimethyl-1,3,5-triphenylcyclotrisiloxane, 1,3,5,7-tetramethyl-1,3,5,7-tetraphenylcyclotetrasiloxane and 1,3,5,7,9-pentamethyl-1,3,5,7,9-pentaphenylcyclopentasiloxane; cyclic phenylcyclosiloxanes such as hexaphenylcyclotrisiloxane;

fluorine-containing cyclosiloxanes such as (3,3,3-trifluoropropyl)methylcyclotrisiloxane; hydrosilyl group-containing cyclosiloxanes such as a methylhydrosiloxane mixture, pentamethylcyclopentasiloxane and phenylhydrocyclosiloxane; and vinyl group-containing cyclosiloxanes such as pentavinylpentamethylcyclopentasiloxane.

The composition used for forming the protective layer may contain metal, metal oxide or carbon black. Examples of the metal contain aluminum, zinc, copper, chromium, nickel, silver and stainless steel, and plastic particles on which surface the metal is deposited. Examples of the metal oxide include zinc oxide, titanium oxide, tin oxide, antimony oxide, indium oxide, bismuth oxide, tin-doped indium oxide, antimony-doped tin oxide, tantalum-doped tin oxide, and antimony-doped zirconium oxide. These metals or metal oxides may be used singly or in combination of two or more kinds thereof. When two or more kinds thereof are used in combination, they may be simply mixed, formed as a solid solution thereof, or fused. The average particle diameter of the conductive particles is preferably 0.3 μm or less, and more preferably 0.1 μm or less, from the viewpoint of transparency of the protective layer.

The composition used for forming the protective layer is preferably prepared as a coating liquid for forming a protective layer. The coating liquid for fanning a protective layer may be free from a solvent, or may contain a solvent such as alcohols (such as methanol, ethanol, propanol, butanol, cyclopentanol and cyclohexanol); ketones such as acetone and methyl ethyl ketone; or ethers such as tetrahydrofuran, diethyl ether and dioxane, if necessary.

These solvents may be used singly or in combination of two or more kinds thereof. The solvent is preferably a solvent have a boiling temperature of 100° C. or less. The solvent is preferably a solvent having at least one hydroxyl group (for example, alcohols).

The coating liquid for forming a protective layer, which includes the composition used for forming the protective layer, is applied to the charge transport layer 3 using an ordinary coating method such as a blade coating method, a wire bar coating method, a spray coating method, a dip coating method, a bead coating method, an air-knife coating method or a curtain coating method. If needed, heating is conducted at a temperature of from 100° C. to 170° C. to form a cured film. As a result, the protective layer (outermost surface layer) 5 of the cured film is obtained.

An oxygen concentration during curing of the coating liquid for forming a protective layer is preferably 1% or less, more preferably 1000 ppm or less, and still more preferably 500 ppm or less.

The coating liquid for forming a protective layer is used for example in a fluorescent color forming coating material, or an antistatic film on a glass surface or a plastic surface, other than in a photoreceptor. When this coating solution is used, a film having excellent adhesion property to a lower layer may be formed, and the deterioration of the performance caused by repeating usage over a long period of time may be suppressed.

In the foregoing exemplary embodiment, a function separation type photoreceptor is described as an example of the electrophotographic photoreceptor. When the electrophotographic photoreceptor has a monolayer photosensitive layer as shown in FIG. 2, the content of the charge generating material in the monolayer photosensitive layer 6 (charge generating/charge transport layer) is preferably from approximately 10% by weight to approximately 85% by weight, and more preferably from approximately 20% by weight to approximately 50% by weight. The content of a charge transporting material in the photosensitive layer 6 is preferably from 5% by weight to 50% by weight. The monolayer photosensitive layer 6 (charge generating/charge transport layer) can be formed in a manner substantially similar to formation of the charge generating layer 2 or charge transport layer 3. The film thickness of the monolayer photosensitive layer 6 (charge generating/charge transport layer) is preferably from approximately 5 μm to approximately 50 μm, and more preferably from approximately 10 μm to approximately 40 μm.

In the foregoing exemplary embodiment, an embodiment in which the outermost surface layer includes a cured film of the above-described specific composition is described. However, in an embodiment in which a protective layer is not formed, a charge transport layer, which is located on the outermost surface in this layer structure, is the outermost surface layer.

Image Forming Apparatus and Process Cartridge

Figure 4:
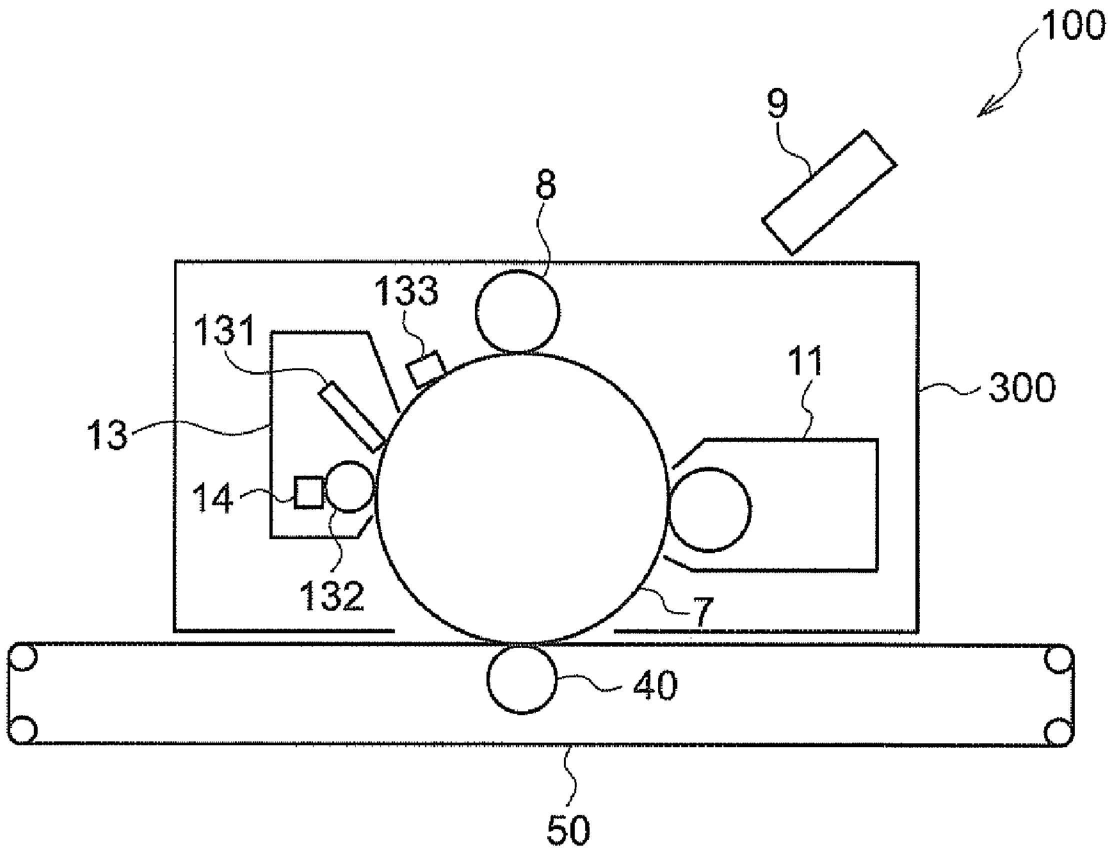
FIG. 4 is a schematic view showing an image forming apparatus according to an exemplary embodiment of the invention.

FIG. 4 is a schematic configuration diagram showing an image forming apparatus 100 according to the exemplary embodiment of the invention.

The image forming apparatus 100 shown in FIG. 4 includes: a process cartridge 300 provided with an electrophotographic photoreceptor 7; an exposing apparatus (electrostatic latent image forming unit) 9; a transfer apparatus (transfer unit) 40; and an intermediate transfer medium 50. In the image forming apparatus 100, the exposing apparatus 9 is disposed at a position capable of exposing the electrophotographic photoreceptor 7 through an opening of the process cartridge 300; the transfer apparatus 40 is disposed at a position facing the electrophotographic photoreceptor 7 via the intermediate transfer medium 50; and the intermediate transfer medium 50 is disposed partially in contact with the electrophotographic photoreceptor 7.

In the process cartridge 300 in FIG. 4, the electrophotographic photoreceptor 7, a charging apparatus (charging unit) 8, a developing apparatus (developing unit) 11 and a cleaning apparatus 13 are integrally accommodated in a housing. The cleaning apparatus 13 includes a cleaning blade (cleaning member), and the cleaning blade 131 is disposed so as to come into contact with a surface of the electrophotographic photoreceptor 7.

In an example shown in FIG. 4, the cleaning apparatus 13 includes a fibrous (roll) member 132 for supplying a lubricant 14 on the surface of the photoreceptor 7 and a fibrous (planar brush) member 133 for assisting cleaning. However, these members may be used if necessary.

Examples of the charging apparatus 8 include a contact charging device that uses, for example, a conductive or semiconductive charging roller, charging brush, charging film, charging rubber blade or charging tube. A well-known charging device such as a non-contact roller charging device, Scorotron corona charger or Corotron corona charger that makes use of corona discharge may be used.

Although not shown in the drawing, a photoreceptor heating member for elevating a temperature of the electrophotographic photoreceptor 7 to reduce a relative temperature may be disposed around the electrophotographic photoreceptor 7 in order to improve the stability of an image.

Examples of the exposing apparatus 9 include an optical device for exposing light such as semiconductor laser beam, LED light or liquid crystal shutter light in a predetermined image-wise manner on a surface of the photoreceptor 7. A light having a wavelength within a spectral sensitivity region of a photoreceptor is used as the light from a light source. A semiconductor laser in the near-infrared region with an oscillation wavelength of approximately 780 nm is mainly used. However, without restricting to this wavelength, a laser having an oscillation wavelength of between 600 nm to 700 nm, or a laser having an oscillation wavelength of from approximately 400 nm to approximately 450 nm may be used as a blue laser. Furthermore, when a color image is formed, a surface-emitting laser light source capable of outputting multi-beams is effective.

As the developing apparatus 11, a general developing apparatus in which, for example, a magnetic or nonmagnetic single component developing agent or two-component developing agent is used in contact or without contact to develop may be used. The developing apparatus is not specifically limited as long as the above-described functions can be obtained, and is selected in accordance with the object. Examples of the developing apparatus include a known developing device in which the single component or two-component developing agent is applied to a photoreceptor 7 by using a brush or a roller. Among these, a developing roller that retains a developing agent on a surface thereof is preferably used.

Hereinbelow, a toner that is used in the developing apparatus 11 is described.

The developing agent may be a single component developing agent containing a toner, or two-component developing agent containing a toner and a carrier.

For example, the toner may be formed from a toner particle containing a binder resin, a colorant and other additives such as a releasing agent is necessary, and optionally an external additive.

The toner is preferably a toner having an average shape factor (shape factor=number average of $ML^2/A\times\pi/4\times100$, wherein ML represents a maximum length of a toner particle and A represents a projected area of the toner particle) of from 100 to 150, more preferably from 105 to 145, and still more preferably form 110 to 140. It is preferable that a volume average particle diameter of the toner is from 3 μm to 12 μm, more preferably from 3.5 μm to 10 μm, and still more preferably from 4 μm to 9 μm.

The toner is not particularly limited by a producing method thereof. Examples of the toner that can be used in the exemplary embodiment of the invention include a toner produced by a kneading and crashing method in which a binder resin, a colorant, a releasing agent, and, if necessary, a charge controlling agent are added and kneaded, and crashed and classified; a method in which particles obtained according to the kneading and crashing method are changed in shape by mechanical impact or thermal energy; an emulsion-polymerization aggregation method in which a polymerizable monomer for a binder resin is emulsion-polymerized, and the resulting dispersion liquid, a colorant and a releasing agent, and, if necessary, a dispersion liquid of a charge controlling agent are mixed, followed by aggregation, heating and fusing to obtain a toner; a suspension polymerization method in which a polymerizable monomer for a binder resin, a colorant and a releasing agent, and if necessary, a solution of a charge controlling agent are dispersed in an aqueous solvent to polymerize; and a dissolution suspension method in which a binder resin, a colorant and a releasing agent, and, as if necessary, a solution of a charge controlling agent are suspended in an aqueous solvent to granulate.

Furthermore, a known producing method such as a method in which the toner obtained by the above-described method is used as a core, and aggregating particles are attached thereto, followed by heating and fusing to form a core-shell structure may be used. As a method for producing a toner, a suspension polymerization method, an emulsion-polymerization aggregation method and a dissolution suspension method, in which an aqueous solvent is used, are preferable in order to control shape and particle size distribution of the toner, and an emulsion-polymerization aggregation method is more preferable.

The toner is produced by mixing the above-described toner particles and the external additives by a Henshel mixer or a V-type blender. When the toner particles are produced by a wet process, the additives may be externally added by a wet process.

When the toner is used as a two-component developing agent, the toner may be mixed with a carrier at a known mixing ratio. The carrier is not specifically limited, and a carrier obtained by applying a resin to the surface of a magnetic particle is preferably used.

Examples of the transfer apparatus 40 include a well-known charging device such as a contact transfer charging device that uses a belt, a roller, a film or a rubber blade, and a Scorotron corona charger or Corotron corona charger that utilizes corona discharge.

Examples of the intermediate transfer medium 50 include a belt (intermediate transfer belt) made of semiconductive polyimide, polyamideimide, polycarbonate, polyallylate, polyester or rubber. The intermediate transfer medium 50 may be a drum shape.

In addition to the above-described apparatuses, the image forming apparatus 100 may include, for example, an optical discharger that discharges the photoreceptor 7 with light.

Figure 5:
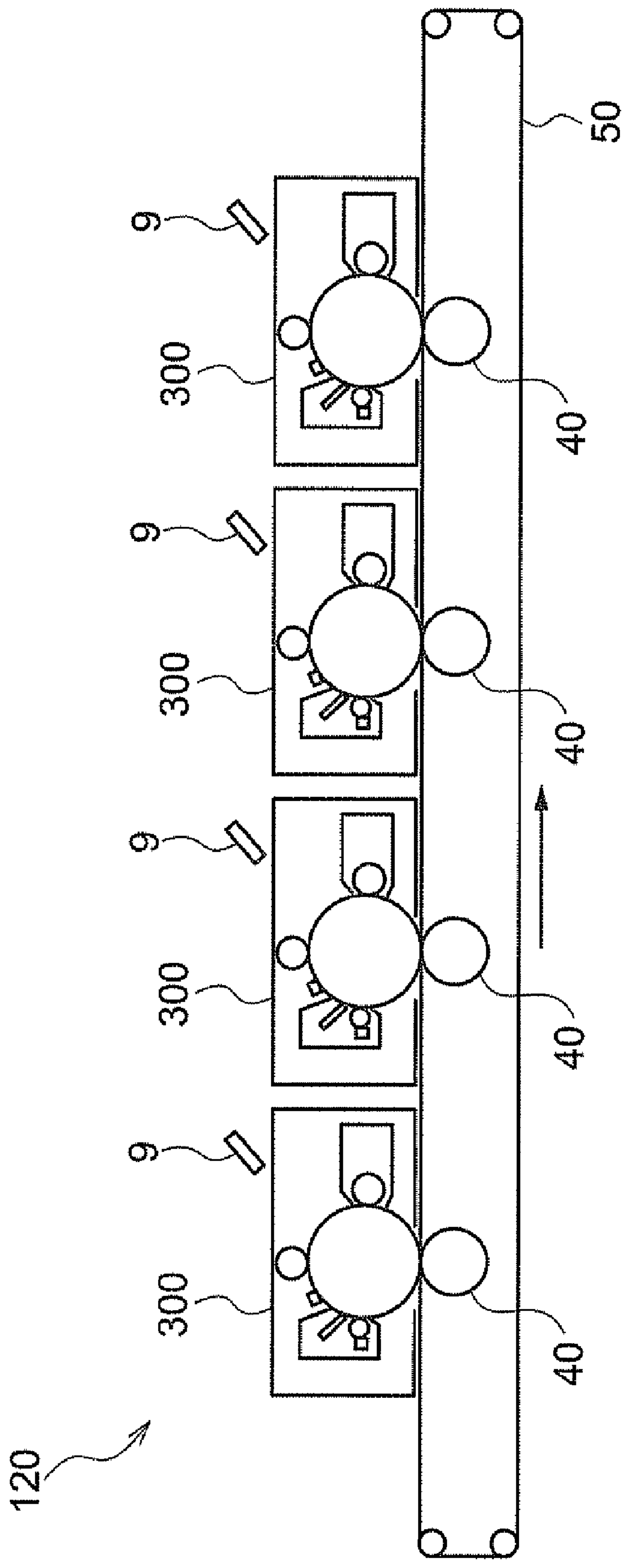
FIG. 5 is a schematic view showing an image forming apparatus according to another exemplary embodiment of the invention.

FIG. 5 is a schematic sectional view showing an image forming apparatus 120 according to another exemplary embodiment of the invention.

The image forming apparatus 120 shown in FIG. 5 is a tandem full-color image forming apparatus having four process cartridges 300.

The image forming apparatus 120 has four process cartridges 300 each disposed side by side on an intermediate transfer medium 50 and has a configuration in which each one electrophotographic photoreceptor is used for each color. The image forming apparatus 120 has a configuration similar to the image forming apparatus 100 except that the image forming apparatus 120 is formed is a tandem apparatus.

The image forming apparatus according to the exemplary embodiment of the invention is not limited to the above-described structure and other known types of image forming apparatuses may be used.

In the exemplary embodiment of the invention, the embodiment that uses the cured film of a composition containing at least one selected from a nitroso compound, a nitrone compound or a nitro compound, and a charge transporting material having a chain polymerizable functional group as the outermost surface layer of the electrophotographic photoreceptor has been described, but the invention is not limited thereto. For example, the cured film may be used for an organic electroluminescent (electroluminescence, EL) device, a memory device, a wavelength changing device, and the like.

As described above, when at least one selected from a nitroso compound, a nitrone compound or a nitro compound is contained in the cured film, the chain polymerizable functional group is selectively attacked by cations, anions or radicals generated from an initiator or stimulated (such as by heat, electron rays or light) during the chain polymerization to initiate chain polymerization. As a result, the attack on the charge transporting site (charge transporting skeleton) of the charge transporting material may be suppressed, whereby a cured film having excellent strength may be formed without impairing charge transportability. Therefore, a film having excellent film-forming properties at the time of forming a layer can be obtained, and morphology change due to Joule heat, which is seen in ordinary films, may be reduced. As a result, the film according to the exemplary embodiment of the invention is useful in the above application.

EXAMPLES

Hereinafter, the present invention is described in detail with reference to the following examples. However, the invention is not limited to these examples.

Example 1

Preparation of Undercoat Layer 100 parts by weight of zinc oxide (average particle diameter: 70 nm, specific surface area: 15 $m^2/g$, manufactured by TAYCA Corporation) and 500 parts by weight of toluene are mixed and stirred, and then 1.3 parts by weight of a silane coupling agent (trade name: KBM503, manufactured by Shin-Etsu Chemical Co., Ltd.) are added thereto, followed by stirring for 2 hr. Thereafter, toluene is distilled away under reduced pressure, followed by baking at 120° C. for 3 hr, thereby obtaining a surface-treated zinc oxide treated with a silane coupling agent.

Subsequently, 110 parts by weight of surface-treated zinc oxide and 500 parts by weight of tetrahydrofuran are mixed and stirred, and then a solution obtained by dissolving 0.6 parts by weight of alizarin in 50 parts by weight of tetrahydrofuran is added, followed by stirring at 50° C. for 5 hr. Thereafter, alizarin-added zinc oxide is filtered under reduced pressure, followed by drying at 60° C. under reduced pressure, thereby obtaining an alizarin-added zinc oxide.

Subsequently, 38 parts by weight of a solution obtained by mixing 60 parts by weight of the alizarin-added zinc oxide, 13.5 parts by weight of a curing agent (block isocyanate, trade name: SUMIDULE 3175, manufactured by Sumitomo-Bayer Urethane Co., Ltd.) and 15 parts by weight of a butyral resin (trade name: S-LEC BM-1, manufactured by Sekisui Chemical Co., Ltd.) in 85 parts by weight of methyl ethyl ketone, and 25 parts by weight of methyl ethyl ketone are mixed, followed by dispersing for 2 hr with a sand mill using glass beads having a diameter of 1 mm, thereby obtaining a dispersion liquid.

To the resulting dispersion liquid, 0.005 parts by weight of dioctyltin dilaurate and 40 parts by weight of silicone resin particles (trade name: TOSPEARL 145, manufactured by GE-Toshiba Silicone Co., Ltd.) are added, and thereby obtaining a coating liquid for forming an undercoat layer. The coating liquid is applied on an aluminum substrate by a dip coating method, followed by drying and curing at 170° C. for 40 min, whereby an undercoat layer having a thickness of 20 μm is formed.

Preparation of Charge Generating Layer

A mixture containing 15 parts by weight of hydroxygallium phthalocyanine as a charge generating material having diffraction peaks at Bragg angle (2θ±0.2°) in CuKα characteristic X-ray diffraction of at least at 7.3°, 16.0°, 24.9° and 28.0°, 10 parts by weight of a vinyl chloride/vinyl acetate copolymer resin (trade name: VMCH, manufactured by Nippon Unicar Co., Ltd.) and 200 parts by weight of n-butyl acetate is dispersed for 4 hours with a sand mill using glass beads having a diameter of 1 mm. To the resulting dispersion liquid, 175 parts by weight of n-butyl acetate and 180 parts by weight of methyl ethyl ketone are added, followed by stirring, thereby obtaining a coating liquid for forming a charge generating layer. The coating liquid for forming a charge generating layer is applied to the undercoat layer by dip coating, followed by drying at room temperature (25° C.), whereby a charge generating layer having a film thickness of 0.2 μm is formed.

Preparation of Charge Transporting Layer 45 parts by weight of N,N'-diphenyl-N,N-bis-(3-methylphenyl)-[1,1']-biphenyl-4,4'-diamine (hereinafter referred to as "TPD") and 55 parts by weight of a bisphenol Z polycarbonate resin (hereinafter referred to as "PCZ500", the viscosity average molecular weight: 50,000) are added to 800 parts by weight of chlorobenzene, and then the mixture is dissolved to yield a coating liquid for forming a charge transporting layer. This coating liquid is applied to the charge generating layer, followed by drying at 130° C. for 45 minutes, whereby a charge transporting layer having a thickness of 20 μm is formed.

Preparation of Protective Layer 110 parts by weight of a compound (compound i-13) represented by Formula (O) and 35 parts by weight of a monomer not having charge transporting ability (trade name: DCP, manufactured by SHIN-NAKAMURA CHEMICAL CO. LTD.) are dissolved in 100 parts by weight of tetrahydrofuran (THF). Thereafter, 2 parts by weight of an initiator (trade name: V-65, manufactured by Wako Pure Chemical Industries, Ltd.) and 4 parts by weight of nitrobenzene (manufactured by Tokyo Chemical Industry Co., Ltd.) are dissolved to the mixture, thereby obtaining a coating liquid for forming a protective layer. This coating liquid is applied to the charge transporting layer, followed by heating at 150° C. for 40 minutes in an atmosphere with an oxygen concentration of about 100 ppm, whereby a protective layer having a thickness of 7 μm is formed.

An electrophotographic photoreceptor is obtained in the manner above. This photoreceptor is designated as a photoreceptor 1.

Evaluation

Evaluation of Image Quality

An electrophotographic photoreceptor prepared as mentioned above is installed in a 700 DIGITAL COLOR PRESS (trade name, manufactured by Fuji Xerox Co., Ltd.), after which a 5% halftone image is continuously printed on 50,000 sheets in an environment of 10° C. and 15% RH. Thereafter, image evaluation test (1) is conducted.

The image forming apparatus is then left for 24 hr in an environment of 28° C. and 80% RH. Subsequently, a 15% halftone image is printed on one sheet, and image evaluation test (2) is conducted on the sheet in the same environment as the image evaluation test (1).

In the image evaluation tests (1) and (2), uneven image density, streaks, image degradation and residual image phenomenon caused by residual traces of a previous image (hereinafter referred to as "ghosting") are evaluated.

In the image forming test, P SHEET (trade name, manufactured by Fuji Xerox Co., Ltd., A4 size sheet, fed in the width (shorter side) direction) is used.

Evaluation results are shown in Tables 3 and 4.

Evaluation of Uneven Image Density

Uneven image density is visually evaluated using a 20% halftone sample.

A: No uneven image density is observed.

B: Uneven image density is partially observed

C: Uneven image density, which may result in problematic image quality, is observed.

Evaluation of Streak Defects

Streaks are visually evaluated using a 20% halftone sample.

A: No streak defects are observed.

B: Streak defects are partially observed.

C: Streak defects, which may result in problematic image quality, are observed.

Evaluation of Image Degradation

Together with the above tests, image degradation is also evaluated.

Image degradation is visually evaluated using a 20% halftone sample.

A: No problematic image degradation is observed during a first continuous printing test or during a second printing test after leaving the image forming apparatus for 24 hr.

B: No problematic image degradation is observed during a first continuous printing test but problematic image degradation is observed during a second printing test after leaving the image forming apparatus for 24 hr.

C: Problematic image degradation is observed during a first continuous printing test and during a second printing test after leaving the image forming apparatus for 24 hr.

Evaluation of Ghosting

Figure 6:
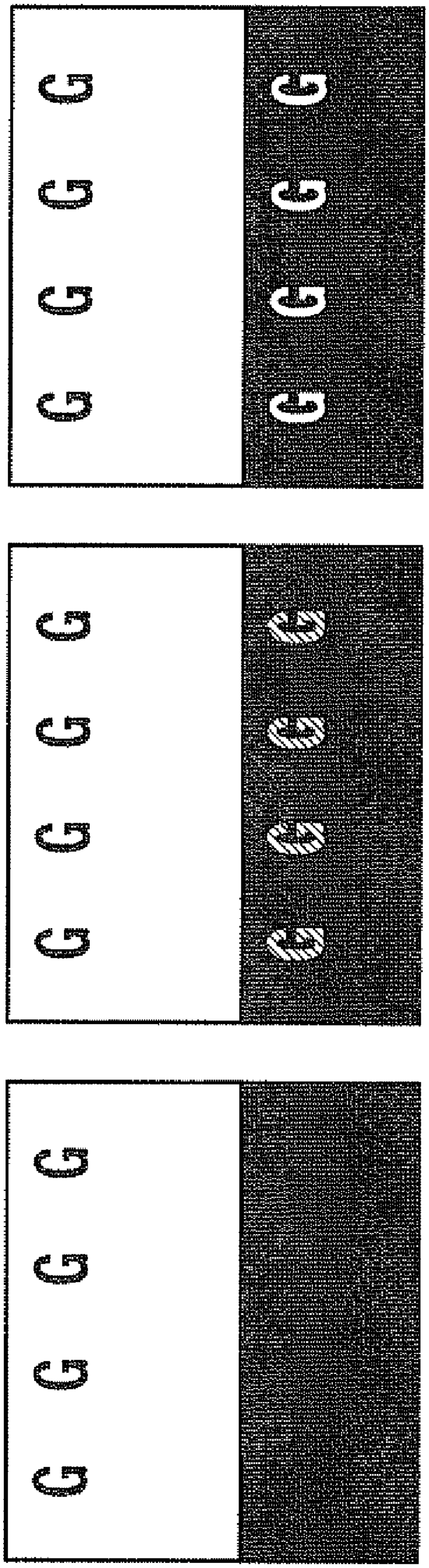
FIGS. 6A to 6C are drawings illustrating the criteria for evaluating ghosting.

A chart of a pattern having a "G" and a black region as shown in FIG. 6A is printed, and the ghosting is evaluated by visually observing the degree of appearance of "G" in the black region.

A: None or very slight ghosting is observed as shown in FIG. 6A.

B: Somewhat noticeable ghosting is observed as shown in FIG. 6B.

C: Clear ghosting is observed as shown in FIG. 6C.

Surface Observation

A surface of the electrophotographic photoreceptor after each of the image evaluation tests (1) and (2) is observed and evaluated as shown below.

A: No scratch or attachment is observed under 20 times magnification.

B: Slight scratch or attachment is observed under 20 times magnification.

C: Scratch or attachment is observed by the naked eyes.

Examples 2 to 11 and Comparative example 1

Production of Electrophotographic Photoreceptor

Charge transporting layers of Examples 2 to 11 and Comparative example 1 are produced similarly to Example 1, and a coating liquid for forming a protective layer of each of Examples 2 to 11 and Comparative example 1 is obtained similarly to in Example 1 except that the composition of the protective layer is changed as shown in Tables 1 and 2. The respective coating liquids are applied to the charge transporting layer, followed by heating at 150° C. for 40 minutes in an atmosphere with an oxygen concentration of about 100 ppm, whereby a protective layer having a thickness of 8 μm is formed.

In this manner, electrophotographic photoreceptors of Examples 2 to 11 and Comparative example 1 are obtained. The respective photoreceptors are designated as photoreceptors 2 to 11 and comparative photoreceptor 1.

Evaluation

The obtained photoreceptors are evaluated similarly to Example 1. The results are shown in Tables 3 and 4.

Examples 12 and 13 and Comparative Example 2

Production of Electrophotographic Photoreceptor

Charge transporting layers of Examples 12 and 13 and Comparative example 2 are produced similarly to Example 1, and a coating liquid for forming a protective layer of each of Examples 2 and 13 and Comparative example 2 is obtained similarly to in Example 1 except that the composition of the protective layer is changed as shown in Table 2. The respective the coating liquids are applied to the charge transporting layer, followed by irradiating with UV light at an illumination intensity of 700 mW/cm$^2$ (365 nm standard) for an irradiation time of 60 seconds in an atmosphere with an oxygen concentration of about 100 ppm using a metal halide lamp (manufactured by USHIO INC.). The resulting product is heated at 150° C. for 40 minutes, whereby a protective layer having a thickness of 7 μm is formed.

In this manner, electrophotographic photoreceptors of Examples 12 and 13 and Comparative example 2 are obtained. The photoreceptors are designated as photoreceptors 12 and 13 and comparative photoreceptor 2.

Evaluation

The obtained photoreceptors are evaluated similarly to Example 1. The results are shown in Tables 3 and 4.

Examples 14 and 15

Production of an Electrophotographic Photoreceptor

Charge generating layers of Examples 14 and 15 are produced similarly to Example 1, and a coating liquid for forming a protective layer of each of Examples 14 and 15 is obtained similarly to in Example 1 except that the composition of the protective layer is changed as shown in Table 2, and the amount of the solvent is changed to 200 parts by weight. This coating liquid is applied to the charge generating layer, followed by heating at 150° C. for 40 minutes in an atmosphere with an oxygen concentration of about 100 ppm, whereby a charge transporting layer having a thickness of 20 μm is obtained.

In this manner, electrophotographic photoreceptors of Examples 14 and 15 are obtained. The photoreceptors are designated as photoreceptors 14 and 15.

Evaluation

The obtained photoreceptors are evaluated similarly to Example 1. The results are shown in Table 4.

TABLE 1

| Composition | | Ex. 1 P. R. 1 | Ex. 2 P. R. 2 | Ex. 3 P. R. 3 | Ex. 4 P. R. 4 | Ex. 5 P. R. 5 | Ex. 6 P. R. 6 | Ex. 7 P. R. 7 | Ex. 8 P. R. 8 | Ex. 9 P. R. 9 |
|---|---|---|---|---|---|---|---|---|---|---|
| Monomer with charge transportability | | i-13 | ii-18 | iv-17 | ii-18 | ii-18 | iv-17 | iv-17 | iv-17 | i-13 |
| | Amount (parts by weight) | 110 | 110 | 110 | 110 | 110 | 110 | 110 | 110 | 110 |
| | | — | — | — | — | — | — | — | — | — |
| | Amount (parts by weight) | — | — | — | — | — | — | — | — | — |
| Monomer without charge transportability | | DCP | DCP | DCP | BEP-200 | DPHA | DCP | DCP | DCP | DCP |
| | Amount (parts by weight) | 35 | 35 | 30 | 35 | 35 | 30 | 30 | 30 | 35 |
| | | — | — | — | — | — | — | — | — | — |

TABLE 1-continued

| Composition | | Ex. 1 P. R. 1 | Ex. 2 P. R. 2 | Ex. 3 P. R. 3 | Ex. 4 P. R. 4 | Ex. 5 P. R. 5 | Ex. 6 P. R. 6 | Ex. 7 P. R. 7 | Ex. 8 P. R. 8 | Ex. 9 P. R. 9 |
|---|---|---|---|---|---|---|---|---|---|---|
| | Amount (parts by weight) | — | — | — | — | — | — | — | — | — |
| Thermoplastic resin | | — | — | — | — | — | — | — | — | — |
| | Amount (parts by weight) | — | — | — | — | — | — | — | — | — |
| Initiator | | V-65 | V-65 | V-65 | V-65 | V-65 | V-65 | V-65 | V-65 | V-65 |
| | Amount (parts by weight) | 2 | 2 | 2 | 2 | 2 | 2 | 2 | 2 | 2 |
| Additive | | Nitro-benzene | Nitro-benzene | Nitro-benzene | Nitro-benzene | Nitro-benzene | Nitroso-benzene | 0-0266 | T-1554 | Nitro-benzene |
| | Amount (parts by weight) | 4 | 4 | 4 | 4 | 4 | 4 | 4 | 4 | 4 |

TABLE 2

| Composition | | Ex. 10 P. R. 10 | Ex. 11 P. R. 11 | Ex. 12 P. R. 12 | Ex. 13 P. R. 13 | Ex. 14 P. R. 14 | Ex. 15 P. R. 15 | Comp. Ex. 1 Comp. P. R. 1 | Comp. Ex. 2 Comp. P. R. 2 |
|---|---|---|---|---|---|---|---|---|---|
| Monomer with charge transportability | | i-13 | i-13 | i-13 | i-13 | iv-17 | iv-17 | i-13 | i-13 |
| | Amount (parts by weight) | 110 | 110 | 110 | 110 | 110 | 100 | 110 | 110 |
| | | — | — | — | — | — | TPD | — | — |
| | Amount (parts by weight) | — | — | — | — | — | 20 | — | — |
| Monomer without charge transportability | | DCP | DCP | DCP | DCP | — | — | DCP | DCP |
| | Amount (parts by weight) | 35 | 35 | 35 | 35 | — | — | 35 | 35 |
| | | — | — | — | — | — | — | — | — |
| | Amount (parts by weight) | — | — | — | — | — | — | — | — |
| Thermoplastic resin | | — | — | — | — | PCZ400 | PCZ400 | — | — |
| | Amount (parts by weight) | — | — | — | — | 20 | 20 | — | — |
| Initiator | | OTazo15 | V-70 | Irgacure 819 | Darcure TPO | V-65 | V-65 | V-65 | Irgacure 819 |
| | Amount (parts by weight) | 2 | 2 | 2 | 2 | 2 | 2 | 2 | 2 |
| Additive | | Nitro-benzene | Nitro-benzene | Nitro-benzene | Nitro-benzene | Nitro-benzene | Nitro-benzene | — | — |
| | Amount (parts by weight) | 4 | 4 | 4 | 4 | 4 | 4 | — | — |

TABLE 3

| | | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| Test (1) | Uneven image density | A | A | A | A | A | A | A | A | A |
| | Streak defects | A | A | A | A | A | A | A | A | A |
| | Image degradation | A | A | A | A | A | A | A | A | A |
| | Ghosting | A | A | A | A | B | B | B | B | A |
| | Surface observation | A | A | A | A | A | A | A | A | A |
| Test (2) | Uneven image density | A | A | A | A | A | A | A | A | A |
| | Streak defects | B | A | A | B | A | A | B | B | B |
| | Image degradation | A | A | A | A | A | A | A | A | A |
| | Ghosting | A | A | A | B | B | B | B | B | A |
| | Surface observation | B | A | A | A | A | A | B | B | B |

TABLE 4

| | | Ex. 10 | Ex. 11 | Ex. 12 | Ex. 13 | Ex. 14 | Ex. 15 | Comp. Ex. 1 | Comp. Ex. 2 |
|---|---|---|---|---|---|---|---|---|---|
| Test (1) | Uneven image density | A | A | A | A | A | A | A | A |
| | Streak defects | A | A | A | A | A | A | B | B |
| | Image degradation | A | A | A | A | A | A | A | A |
| | Ghosting | A | A | B | B | B | B | C | C |
| | Surface observation | A | A | A | A | A | A | C | C |
| Test (2) | Uneven image density | A | A | A | A | A | A | A | A |
| | Streak defects | A | B | B | B | A | A | B | B |
| | Image degradation | A | A | A | A | A | A | A | A |
| | Ghosting | A | A | B | B | B | B | C | C |
| | Surface observation | A | B | B | B | A | A | C | C |

From the above results, it is found that overall good results concerning uneven image density, streak defects, image degradation, and surface observation are obtained in Examples as compared with those of Comparative Examples.

Abbreviations shown in the above Tables 1 to 4 is explained below.

Ex.: Example

Comp. Ex.: Comparative Example

P. R.: Photoreceptor

Comp. P. R.: Comparative Photoreceptor

Nitrobenzene: a nitro compound (manufactured by Tokyo Chemical Industry Co., Ltd.)

Nitrosobenzene: a nitroso compound (manufactured by Tokyo Chemical Industry Co., Ltd.)

O-0266: a nitrone compound (4-oxo-2,2,6,6-tetramethylpiperidine-1-oxyl free radical, manufactured by Tokyo Chemical Industry Co., Ltd.)

T-1554: a nitrone compound (3,3,5,5-tetramethyl-1-pyrroline-N-oxide, manufactured by Tokyo Chemical Industry Co., Ltd.)

TPD: N,N'-diphenyl-N,N'-bis(3-methylphenyl)-[1,1']biphenyl-4,4'-diamine

DCP: a monomer without charge transportability, trade name: DCP, manufactured by DAICEL-CYTEC Company LTD.

DPHA: a monomer without charge transportability, trade name: DPHA, manufactured by DAICEL-CYTEC Company LTD.

BEP-200: a monomer without charge transportability, trade name: BEP-200, manufactured by DAICEL-CYTEC Company LTD.

PCZ400: bisphenol Z polycarbonate resin, manufactured by MITSUBISHI GAS CHEMICAL COMPANY, INC. (viscosity average molecular weight: 40,000)

V-65: an initiator, trade name: V-65, manufactured by Wako Pure Chemical Industries, Ltd. (heat radical generator)

V-70: an initiator, trade name: V-70, manufactured by Wako Pure Chemical Industries, Ltd. (heat radical generator)

V-601: an initiator, trade name: V-601, manufactured by Wako Pure Chemical Industries, Ltd. (heat radical generator)

OTazo15: trade name: $OT_{AZO}$-15 an initiator, manufactured by Otsuka Chemical Co., Ltd. (heat radical generator)

Iracure819: an initiator, trade name: Irganox 819, manufactured by Ciba Specialty Chemicals (photo radical generator)

Darocure TPO: an initiator, trade name: Darocure TPO, manufactured by Ciba Specialty Chemicals (photo radical generator)

Example 16

Preparation of Organic Electroluminescent Device

An ITO glass substrate having an ITO film on the glass substrate is prepared. The ITO film is etched into 2 mm rectangles, thereby obtaining an ITO electrode (anode). The ITO glass substrate is ultrasonically cleaned with isopropanol (for electronic industrial use, manufactured by Kanto Chemical Co., Inc.) and dried by a spin coater.

Subsequently, on the surface in which the ITO electrode of the ITO glass substrate is formed, a thin film having a thickness of 0.015 μm is formed by vacuum deposition of a copper phthalocyanine purified by sublimation.

Subsequently, 1.0 part by weight of a compound (compound ii-18) represented by Formula (I) and 0.2 parts by weight of a monomer without charge transportability (trade name: A-DCP, manufactured by SHIN-NAKAMURA CHEMICAL CO. LTD.) are dissolved in 100 parts by weight of tetrahydrofuran (THF). Further, 0.03 parts by weight of an initiator VE-73 (trade name, manufactured by Wako Pure Chemical Industries, Ltd.) and 0.02 parts by weight of a compound represented by Formula (M3) (nitrobenzene, manufactured by Tokyo Chemical Industry Co., Ltd.) are dissolved therein, thereby obtaining a coating liquid. This coating liquid is applied to the obtained copper phthalocyanine film, followed by heating at 145° C. for 40 minutes in an atmosphere with an oxygen concentration of about 100 ppm, whereby a thin film having a thickness of 0.05 μm is formed. As a result, a hole transporting layer having a two-layer structure is formed on the ITO electrode.

Subsequently, an emitting layer having a thickness of 0.060 μm is formed on the obtained hole transporting layer by vapor deposition of a compound (Alq3) represented by the following Formula as an luminescent material.

Further, an Mg—Ag alloy is vapor-deposited onto the obtained emitting layer by co-deposition to form an Mg—Ag electrode (cathode) having a rectangle shape with a width of 2 mm and a thickness of 0.13 μm, thereby obtaining an organic electroluminescent device. Here, the ITO electrode and the Mg—Ag electrode are formed such that respective directions of extension thereof are perpendicular to each other. The effective area of the obtained organic electroluminescent device is 0.04 $cm^2$.

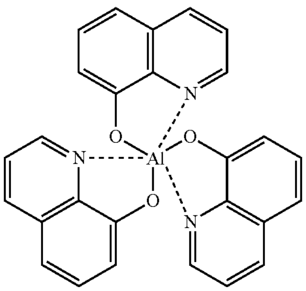

Compound (Alq3)

Comparative Example 3

A thin film having a thickness of 0.015 μm is formed by vacuum deposition of copper phthalocyanine similarly to Example 16, and then a thin film having a thickness of 0.045 μm is formed thereon by vacuum deposition of a benzidine compound R represented by the following Formula, whereby a hole transporting layer having a two-layer structure is formed on the ITO electrode. Furthermore, an emitting layer and an electrode are formed on the obtained hole transporting layer similarly to Example 16.

The effective area of the obtained organic electroluminescent device is 0.04 $cm^2$.

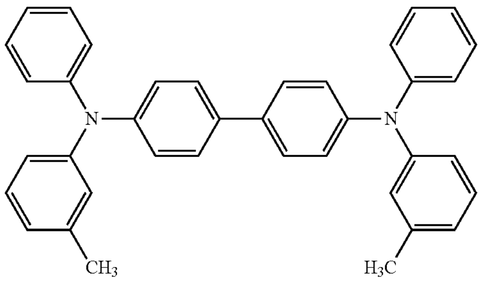

Benzidine compound R

Evaluation of Characteristics of Device

The characteristics of the organic electroluminescent devices obtained by Example 16 and Comparative example 3 are evaluated as follows.

In a vacuum (0.125 Pa), a direct-current voltage is applied between the ITO electrode that is positive (anode) and the Mg—Ag electrode that is negative (cathode) to emit light. The maximum luminance and the luminescent color at that time are evaluated. The results are shown in Table 5.

In addition, the luminescence lifetime of the organic electroluminescent device in dry nitrogen is measured in the following manner. That is, the electric current value is set such that an initial luminance is 50 $cd/m^2$, and the time until the luminance is halved from the initial value by constant current driving is defined as an device lifetime. The driving current density at this time is shown together with the device lifetime in Table 5.

TABLE 5

| | Maximum luminance ($cd/m^2$) | Driving current density ($mA/cm^2$) | Device lifetime (time) |
|---|---|---|---|
| Example 16 | 780 | 8.3 | 42 |
| Comparative Example 3 | 660 | 9.2 | 18 |

From the above results, it is found that sufficient results concerning the maximum luminance, driving current density, and device lifetime are obtained in the Examples as compared with those of Comparative Examples.

The foregoing description of the exemplary embodiments of the present invention has been provided for the purposes of illustration and description. It is not limited to be exhaustive or to limit the invention to the precise forms disclosed. Obviously, many modifications and variations will be apparent to practitioners skilled in the art. The exemplary embodiments are chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An electrophotographic photoreceptor comprising:

a conductive substrate; and a photosensitive layer provided on the conductive substrate, an outermost surface layer of the electrophotographic photoreceptor comprising a cured film of a composition containing a charge transporting material having a chain polymerizable functional group and at least one selected from a nitroso compound, a nitrone compound or a nitro compound, wherein the nitroso compound is a compound represented by the following Formula (M1):

$$R^{201}—N=O \quad (M1),$$

where $R^{201}$ represents a monovalent substituent group, the nitrone compound is a compound represented by the following Formula (M2A) or Formula (M2B):

(M2A)

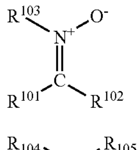

(M2B)

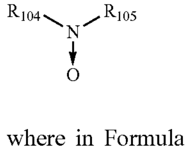

where in Formula (M2A), $R^{101}$, $R^{102}$ and $R^{103}$ each independently represent a monovalent substituent group; and, in Formula (M2B), $R^{104}$ and $R^{105}$ each independently represent a monovalent substituent group, and the nitro compound is a compound represented by the following Formula (M3):

$$R^{301}—NO_2 \quad (M3)$$

where $R^{301}$ represents a substituted or unsubstituted alkyl group having 1 to 20 carbon atoms, a substituted or unsubstituted aryl group having 3 to 30 carbon atoms, an ester group, an amino group, an alkylamino group, an amido group, a cyano group, an ether group, a halogen atom, or a carboxyl group.

2. The electrophotographic photoreceptor according to claim 1, wherein the compound selected from a nitroso compound, a nitrone compound, or a nitro compound is the nitroso compound, and in Formula (M1) $R^{201}$ represents a substituted or unsubstituted alkyl group having 1 to 20 carbon atoms, or a substituted or unsubstituted aryl group having 3 to 30 carbon atoms.

3. The electrophotographic photoreceptor according to claim 1, wherein the compound selected from a nitroso compound, a nitrone compound, or a nitro compound is the nitrone compound, and in Formula (M2A) at least one of $R^{101}$, $R^{102}$ or $R^{103}$ represents a substituted or unsubstituted cyclic structure having 1 to 20 carbon atoms.

4. The electrophotographic photoreceptor according to claim 1, wherein the compound selected from a nitroso compound, a nitrone compound, or a nitro compound is the nitrone compound, and in Formula (M2B) at least one of $R^{104}$ or $R^{105}$ represents a substituted or unsubstituted cyclic structure having 1 to 20 carbon atoms.

5. The electrophotographic photoreceptor according to claim 1, wherein the compound selected from a nitroso compound, a nitrone compound, or a nitro compound is the nitrone compound.

6. The electrophotographic photoreceptor according to claim 1, wherein the charge transporting material includes at least one compound represented by the following Formula (I):

(I)

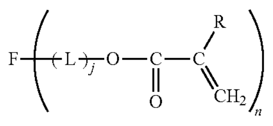

wherein, in Formula (I), F represents an n-valent organic group having hole transportability; R represents a hydrogen atom or an alkyl group; L represents a divalent organic group; n represents an integer of 1 or more; and j represents 0 or 1.

7. A process cartridge comprising
the electrophotographic photoreceptor according to claim 1; and
at least one selected from the group consisting of a charging unit that charges the electrophotographic photoreceptor, a developing unit that develops an electrostatic latent image formed on the electrophotographic photoreceptor by attaching a toner thereto and a cleaning unit that removes residual toner from the surface of the electrophotographic photoreceptor.

8. An image forming apparatus comprising
the electrophotographic photoreceptor according to claim 1,
a charging unit that charges the electrophotographic photoreceptor;
an electrostatic latent image forming unit that forms an electrostatic latent image on the surface of the charged electrophotographic photoreceptor;
a developing unit that develops the electrostatic latent image formed on the electrophotographic photoreceptor by attaching a toner thereto to form a toner image; and
a transfer unit that transfers the toner image to a transfer medium.

9. The electrophotographic photoreceptor according to claim 1, wherein, in Formula (M2A), $R^{101}$ and $R^{103}$ each independently represent a substituted or unsubstituted cyclic structure having 1 to 20 carbon atoms, or $R^{101}$ and $R^{102}$ each independently represent a substituted or unsubstituted cyclic structure having 1 to 20 carbon atoms.

10. The electrophotographic photoreceptor according to claim 1, wherein the compound selected from a nitroso compound, a nitrone compound, or a nitro compound is at least one selected from the group consisting of nitrobenzene, nitrosobenzene, 4-oxo-2,2,6,6-tetramethylpiperidine-1-oxyl free radical, and 3,3,5,5-tetramethyl-1-pyrroline-N-oxide.

11. A cured film of a composition comprising a charge transporting material having a chain polymerizable functional group and at least one selected from a nitroso compound, a nitrone compound or a nitro compound, wherein
the nitroso compound is a compound represented by the following Formula (M1):

$$R^{201}—N═O \quad (M1),$$

where $R^{201}$ represents a monovalent substituent group,
the nitrone compound is a compound represented by the following Formula (M2A) or Formula (M2B):

(M2A)

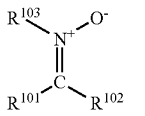

(M2B)

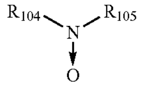

where in Formula (M2A), $R^{101}$, $R^{102}$ and $R^{103}$ each independently represent a monovalent substituent group; and, in Formula (M2B), $R^{104}$ and $R^{105}$ each independently represent a monovalent substituent group, and
the nitro compound is a compound represented by the following Formula (M3):

$$R^{301}—NO_2 \quad (M3)$$

where $R^{301}$ represents a substituted or unsubstituted alkyl group having 1 to 20 carbon atoms, a substituted or unsubstituted aryl group having 3 to 30 carbon atoms, an ester group, an amino group, an alkylamino group, an amido group, a cyano group, an ether group, a halogen atom, or a carboxyl group.

12. The cured film according to claim 11, wherein the compound selected from a nitroso compound, a nitrone compound, or a nitro compound is the nitro compound represented by the following Formula (M3):

$$R^{301}—NO_2 \quad (M3)$$

wherein, in Formula (M3), $R^{301}$ represents a substituted or unsubstituted alkyl group having 1 to 20 carbon atoms, or a substituted or unsubstituted aryl group having 3 to 30 carbon atoms.

13. The cured film according to claim 11, wherein the charge transporting material includes at least one compound represented by the following Formula (I):

(I)

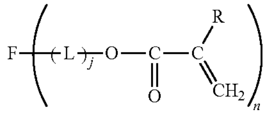

wherein, in Formula (I), F represents an n-valent organic group having hole transportability; R represents a hydrogen atom or an alkyl group; L represents a divalent organic group; n represents an integer of 1 or more; and j represents 0 or 1.

14. An organic electroluminescent device comprising:

an anode;

a hole transporting layer;

an emitting layer; and a cathode, wherein the hole transporting layer includes the cured film according to claim 11.

15. A cured film of a composition comprising a charge transporting material having a chain polymerizable functional group and a nitrone compound, wherein the nitrone compound is a compound represented by the following Formula (M2A) or Formula (M2B):

(M2A)

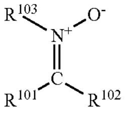

(M2B)

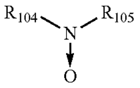

where in Formula (M2A), $R^{101}$, $R^{102}$ and $R^{103}$ each independently represent a monovalent substituent group; and, in Formula (M2B), $R^{104}$ and $R^{105}$ each independently represent a monovalent substituent group.

* * * * *